(12) United States Patent
Ohnuma et al.

(10) Patent No.: US 8,409,966 B2
(45) Date of Patent: Apr. 2, 2013

(54) METHOD FOR MANUFACTURING SOI SUBSTRATE

(75) Inventors: Hideto Ohnuma, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/177,584

(22) Filed: Jul. 7, 2011

(65) Prior Publication Data

US 2011/0263096 A1 Oct. 27, 2011

Related U.S. Application Data

(62) Division of application No. 12/244,073, filed on Oct. 2, 2008, now Pat. No. 7,989,305.

(30) Foreign Application Priority Data

Oct. 10, 2007 (JP) .................................. 2007-264998

(51) Int. Cl.
*H01L 21/22* (2006.01)
*H01L 21/38* (2006.01)

(52) U.S. Cl. ................. 438/458; 257/E21.335
(58) Field of Classification Search .................. 438/458; 257/E21.335
See application file for complete search history.

(56) References Cited

U.S. PATENT DOCUMENTS

| | | | | |
|---|---|---|---|---|
| 4,780,334 A | * | 10/1988 | Ackerman | 427/248.1 |
| 4,817,558 A | * | 4/1989 | Itoh | 118/725 |
| 5,374,564 A | | 12/1994 | Bruel | |
| 5,882,987 A | * | 3/1999 | Srikrishnan | 438/458 |
| 5,892,235 A | | 4/1999 | Yamazaki et al. | |
| 6,027,988 A | | 2/2000 | Cheung et al. | |
| 6,127,702 A | | 10/2000 | Yamazaki et al. | |
| 6,245,645 B1 | | 6/2001 | Mitani et al. | |
| 6,271,101 B1 | | 8/2001 | Fukunaga | |
| 6,335,231 B1 | | 1/2002 | Yamazaki et al. | |

(Continued)

FOREIGN PATENT DOCUMENTS

| | | |
|---|---|---|
| JP | 10-162770 | 6/1998 |
| JP | 11-097379 | 4/1999 |

(Continued)

OTHER PUBLICATIONS

Lu et al., *Ion-cut silicon-on-insulator fabrication with plasma immersion ion implantation*, Appl. Phys. Lett. 71 (19), Nov. 10, 1997.

(Continued)

*Primary Examiner* — David S Blum
(74) *Attorney, Agent, or Firm* — Eric J. Robinson; Robinson Intellectual Property Law Office, P.C.

(57) ABSTRACT

A method is demonstrated to manufacture SOI substrates with high throughput while resources can be effectively used. The present invention is characterized by the feature in which the following process A and process B are repeated. The process A includes irradiation of a surface of a semiconductor wafer with cluster ions to form a separation layer in the semiconductor wafer. The semiconductor wafer and a substrate having an insulating surface are then overlapped with each other and bonded, which is followed by thermal treatment to separate the semiconductor wafer at or around the separation layer. A separation wafer and an SOI substrate which has a crystalline semiconductor layer over the substrate having the insulating surface are simultaneously obtained by the process A. The process B includes treatment of the separation wafer for reusing, which allows the separation wafer to be successively subjected to the process A.

16 Claims, 23 Drawing Sheets

U.S. PATENT DOCUMENTS

| | | | |
|---|---|---|---|
| 6,344,404 B1 | 2/2002 | Cheung et al. |
| 6,362,076 B1 | 3/2002 | Inazuki et al. |
| 6,372,609 B1 | 4/2002 | Aga et al. |
| 6,380,046 B1 | 4/2002 | Yamazaki |
| 6,388,652 B1 | 5/2002 | Yamazaki et al. |
| 6,468,923 B1 | 10/2002 | Yonehara et al. |
| 6,534,380 B1 | 3/2003 | Yamauchi et al. |
| 6,548,382 B1 | 4/2003 | Henley et al. |
| 6,596,610 B1 | 7/2003 | Kuwabara et al. |
| 6,602,761 B2 | 8/2003 | Fukunaga |
| 6,686,623 B2 | 2/2004 | Yamazaki |
| 6,778,164 B2 | 8/2004 | Yamazaki et al. |
| 6,803,264 B2 | 10/2004 | Yamazaki et al. |
| 6,875,633 B2 | 4/2005 | Fukunaga |
| 6,927,148 B2 | 8/2005 | Ito |
| 7,064,049 B2 | 6/2006 | Ito et al. |
| 7,119,365 B2 | 10/2006 | Takafuji et al. |
| 7,176,525 B2 | 2/2007 | Fukunaga |
| 7,183,177 B2 | 2/2007 | Al-Bayati et al. |
| 7,256,776 B2 | 8/2007 | Yamazaki et al. |
| 7,315,064 B2 | 1/2008 | Mitani et al. |
| 7,387,944 B2 | 6/2008 | Tong et al. |
| 7,442,623 B2 | 10/2008 | Endo et al. |
| 7,473,971 B2 | 1/2009 | Yamazaki et al. |
| 7,476,576 B2 | 1/2009 | Yamazaki et al. |
| 7,531,428 B2 | 5/2009 | Dupont |
| 7,535,053 B2 | 5/2009 | Yamazaki |
| 7,608,521 B2 | 10/2009 | Cites et al. |
| 7,619,250 B2 | 11/2009 | Takafuji et al. |
| 7,759,233 B2 | 7/2010 | Forbes |
| 7,781,309 B2 | 8/2010 | Morita et al. |
| 7,829,436 B2 | 11/2010 | Morita et al. |
| 7,939,424 B2 | 5/2011 | Erokhin et al. |
| 2001/0046746 A1 | 11/2001 | Yokokawa et al. |
| 2002/0157790 A1 | 10/2002 | Abe et al. |
| 2006/0148208 A1 | 7/2006 | Popov et al. |
| 2007/0108510 A1 | 5/2007 | Fukunaga |
| 2007/0148917 A1 | 6/2007 | Morita et al. |
| 2007/0173000 A1 | 7/2007 | Yamazaki |
| 2007/0291022 A1 | 12/2007 | Yamazaki et al. |
| 2008/0153272 A1 | 6/2008 | Akiyama et al. |

FOREIGN PATENT DOCUMENTS

| | | |
|---|---|---|
| JP | 11-307472 | 11/1999 |
| JP | 2000-012864 | 1/2000 |
| JP | 2000-124092 | 4/2000 |
| JP | 2004-087606 | 3/2004 |
| JP | 2005-252244 | 9/2005 |
| JP | 3943782 | 7/2007 |

OTHER PUBLICATIONS

Kriegler et al., *The Effect of HCl and Cl$_2$ on the Thermal Oxidation of Silicon*, J. Electrochem. Soc., vol. 119, Issue 3, pp. 388-392, Mar. 1972.

Vossen et al., *Thin film process II*, Academic Press, pp. 317-323, 1991.

Vossen et al., *Thin film processes II*, Academic Press, pp. 317-323, 1991.

Lu et al., *Ion-cut silicon-on-insulator fabrication with plasma immersion ion implantation*, Appl. Phys. Lett. 71 (19), pp. 2767-2769, Nov. 10, 1997.

\* cited by examiner

METHOD FOR MANUFACTURING SOI SUBSTRATE

RELATED APPLICATIONS

This application is a divisional of application Ser. No. 12/244,073, now U.S. Pat. No. 7,989,305, filed Oct. 2, 2008.

BACKGROUND OF THE INVENTION

1. Field of the Invention

The present invention relates to an SOI (silicon on insulator) substrate and a manufacturing method thereof. Further, the present invention relates to a semiconductor device manufactured using the SOI substrate.

Note that a semiconductor device in this specification refers to any device which can function by utilizing semiconductor characteristics, and includes electro-optic devices (including EL display devices and liquid-crystal display devices), semiconductor circuits, and electronic devices in its category.

2. Description of the Related Art

With development of VLSI technology, lower power consumption and higher operation speed transcending the scaling law which governs the performance of semiconductor devices using bulk single crystal silicon have been demanded. In order to satisfy these requirements, an SOI structure has received attention in recent years. This technology allows an active region (channel formation region) of a field effect transistor (FET), which has been conventionally formed of bulk single crystal silicon, to be formed of a single crystal silicon thin film. It is considered that a field effect transistor manufactured using an SOI structure has lower parasitic capacitance than a field effect transistor manufactured using a bulk single crystal silicon substrate, which is an advantage in increasing speed and reducing power consumption.

As a method for manufacturing an SOI substrate, a hydrogen ion implantation separation method is known. For example, according to a hydrogen ion implantation separation method disclosed in Japanese Published Patent Application No. 2000-124092, a semiconductor wafer is irradiated with hydrogen ions by an ion implantation method to form a microbubble layer at a given depth, and the microbubble layer is used as a cleavage plane, so that a semiconductor thin film (SOI layer) is bonded to another semiconductor wafer. Furthermore, in addition to thermal treatment for separating the SOI layer, an oxide film is formed over the SOI layer by thermal treatment in an oxidizing atmosphere and then removed, and after that, thermal treatment is performed at 1000 to 1300° C. in a reducing atmosphere to increase bonding strength and reduce surface roughness.

As described above, in the case of manufacturing an SOI substrate by using a hydrogen ion implantation separation method, a semiconductor wafer is cleaved at a microbubble layer and an SOI layer is bonded to another semiconductor wafer. Therefore, in addition to the SOI substrate, a separation wafer is obtained after the SOI layer is separated. A semiconductor wafer, which is a material of an SOI substrate, is expensive; thus, reusing of the separation wafer leads to cost reduction. For example, in Japanese Patent No. 3943782, a technique for reusing a semiconductor wafer, in which an ion implantation layer at a chamfer of a separation wafer is removed and then the separation wafer is polished, has been disclosed.

By manufacturing an SOI substrate using a hydrogen ion implantation separation method, a separation wafer can be reused. However, in an ion implantation method used in a conventional hydrogen ion implantation separation method, hydrogen ions for irradiation of a semiconductor wafer are small in mass, so that hydrogen tends to be implanted at a large depth from the surface of the semiconductor wafer. Accordingly, a separation layer is formed at a large depth from the surface of the semiconductor wafer to function as a cleavage plane, and consequently, the thickness of a separation wafer after separation becomes small and the thickness of a wafer to be reused is also small.

Further, because the hydrogen ions for irradiation of a semiconductor wafer are small in mass, the hydrogen implantation for forming a separation layer is one rate-controlling factor. An attempt to increase the thickness of the separation wafer obtained through separation by implanting hydrogen at a small depth of a semiconductor wafer requires reduction in an accelerating voltage, which leads to deterioration of takt time and degradation of throughput.

Further, when reusing of the separation wafer is repeated, the quality as a semiconductor wafer inevitably deteriorates, which provides a possibility to result in quality deterioration of an SOI substrate manufactured using the semiconductor wafer. In addition, repeated reuse of the separation wafer causes a problem such as generation of a crack in the semiconductor wafer in the process for manufacturing an SOI substrate, decreasing the yield of SOI substrates.

SUMMARY OF THE INVENTION

In view of the foregoing problems, the present invention provides a manufacturing method of an SOI substrate, by which resources can be effectively used. The present invention provides a method for manufacturing SOI substrates with high throughput. The present invention provides a manufacturing method of an SOI substrate, which leads to cost reduction. The present invention provides a method for manufacturing SOI substrates with high yield.

In the present invention, a semiconductor layer is separated from a semiconductor wafer which is a bond substrate and bonded to a base substrate to manufacture an SOI substrate. The semiconductor wafer is irradiated with cluster ions by an ion doping apparatus from one surface side of the semiconductor wafer to form a separation layer at a given depth from the surface of the semiconductor wafer. Then, the semiconductor wafer is separated using the separation layer or a region near the separation layer as a cleavage plane, thereby the semiconductor layer is formed. Further, a separation wafer obtained by the separation of the semiconductor layer from the semiconductor wafer is processed for reusing and then reused as a bond substrate.

The 'cluster ion' in this specification includes, in its category, a cluster ion generated from a source gas including hydrogen or deuterium (also referred to as '$^2$H' or 'D'). As examples thereof, an $H_3^+$ ion, an $H_2^+$ ion, an $H_4^+$ ion, a $^2H_2^+$ ion, a $^2H_3^+$ ion, and the like can be given. Further, the 'cluster ion' can be regarded as a cluster ion including a plurality of atomic nuclei in which the number of protons is one.

It is preferable that $H_3^+$ ions be used as the cluster ions.

Further, the 'cleavage' in this specification means that a semiconductor wafer is separated at a separation layer or a region near the separation layer in which a crystal structure is lost and a microvoid is formed by irradiation with cluster ions. Further, the 'cleavage plane' means a separation plane which is formed when the separation of a semiconductor wafer at a separation layer or at a region near the separation layer is performed.

It is one feature of the present invention to include the following two processes, process A and process B. According to the process A, a semiconductor wafer is irradiated with cluster ions from a surface side by an ion doping apparatus to form a separation layer in the semiconductor wafer. After that, a substrate having an insulating surface and the surface side of the semiconductor wafer are overlapped with each other and boned. Thermal treatment is next performed thereon to separate the semiconductor wafer by using the separation layer or a region near the separation layer as a separation plane, so that an SOI substrate in which a semiconductor layer is bonded to the substrate having the insulating surface and a separation wafer are obtained after the semiconductor layer is separated from the semiconductor wafer. According to the process B, treatment for reusing is performed on the separation wafer obtained through the process A. After the treatment for reusing is performed by the process B, the separation wafer is used as a semiconductor wafer in the process A.

Another feature of the present invention includes process A and process B. According to the process A, a semiconductor wafer and a substrate having an insulating surface are prepared as a bond substrate and a base substrate respectively, and the semiconductor wafer is irradiated with cluster ions from a surface side by an ion doping apparatus to form a separation layer in the semiconductor wafer. After that, the substrate having the insulating surface and the surface side of the semiconductor wafer are overlapped with each other and boned with an insulating layer formed by a CVD method interposed therebetween. Thermal treatment is next performed thereon to separate the semiconductor wafer by using the separation layer or a region near the separation layer as a separation plane, so that an SOI substrate in which a semiconductor layer is bonded to the substrate having the insulting surface with the insulating layer interposed therebetween and a separation wafer are obtained after the semiconductor layer is separated from the semiconductor wafer. According to the process B, treatment for reusing is performed on the separation wafer obtained through the process A. After the treatment for reusing is performed by the process B, a separation wafer is used as a semiconductor wafer in the process A. Note that, in this specification, the CVD (chemical vapor deposition) method includes, in its category, a plasma CVD method, a thermal CVD method, and a photo CVD method. Further, the thermal CVD method includes a low-pressure CVD method and an atmospheric pressure CVD method in its category.

In the above-described structure, it is preferable that the insulating layer interposed between the substrate having the insulating surface and the surface side of the semiconductor wafer be a stacked layer of a nitrogen-containing layer and a layer which functions as a bonding layer. Further, the insulating layer may be provided either over the surface side of the semiconductor wafer or on the substrate having an insulating surface. It is preferable that an aluminosilicate glass substrate, an aluminoborosilicate glass substrate, or a barium borosilicate glass substrate be used as the substrate having the insulating surface.

It is preferable that the semiconductor layer which constitutes the SOI substrate obtained through the process A have a thickness equal to or greater than 10 nm and equal to or less than 200 nm.

Further, it is preferable that the treatment for reusing in the process B be performed by at least one method selected from polishing treatment, etching treatment, thermal treatment, and laser beam irradiation.

Further, in the above-described structure, when a set of the process A and the process B which are performed sequentially is conducted n times (n is an integer number of 2 or more), n pieces of SOI substrates can be manufactured, and a separation wafer yielded in manufacturing the n pieces of SOI substrates can be used (n−1) times as a semiconductor wafer in the process A.

Note that the 'bonding layer' in this specification refers to a layer formed on a plane which forms a bond with the insulating-surface substrate (or with the insulating layer provided on the substrate having the insulating surface).

By irradiating a semiconductor wafer with cluster ions, a separation layer for separating a semiconductor layer can be formed efficiently at a small depth from the surface of the semiconductor wafer. Consequently, the semiconductor layer to be separated can be made thin, so that a larger thickness of a separation wafer which is to be reused is attainable and takt time can be shortened. Accordingly, SOI substrates can be manufactured with effective use of resources and high throughput. Further, cost reduction can be achieved.

By employing the manufacturing method of an SOI substrate, in which repetitive reusing of a separation wafer is presupposed, SOI substrates can be manufactured with high yield even when a separation wafer is repeatedly used.

DETAILED DESCRIPTION OF THE INVENTION

Figure 1:
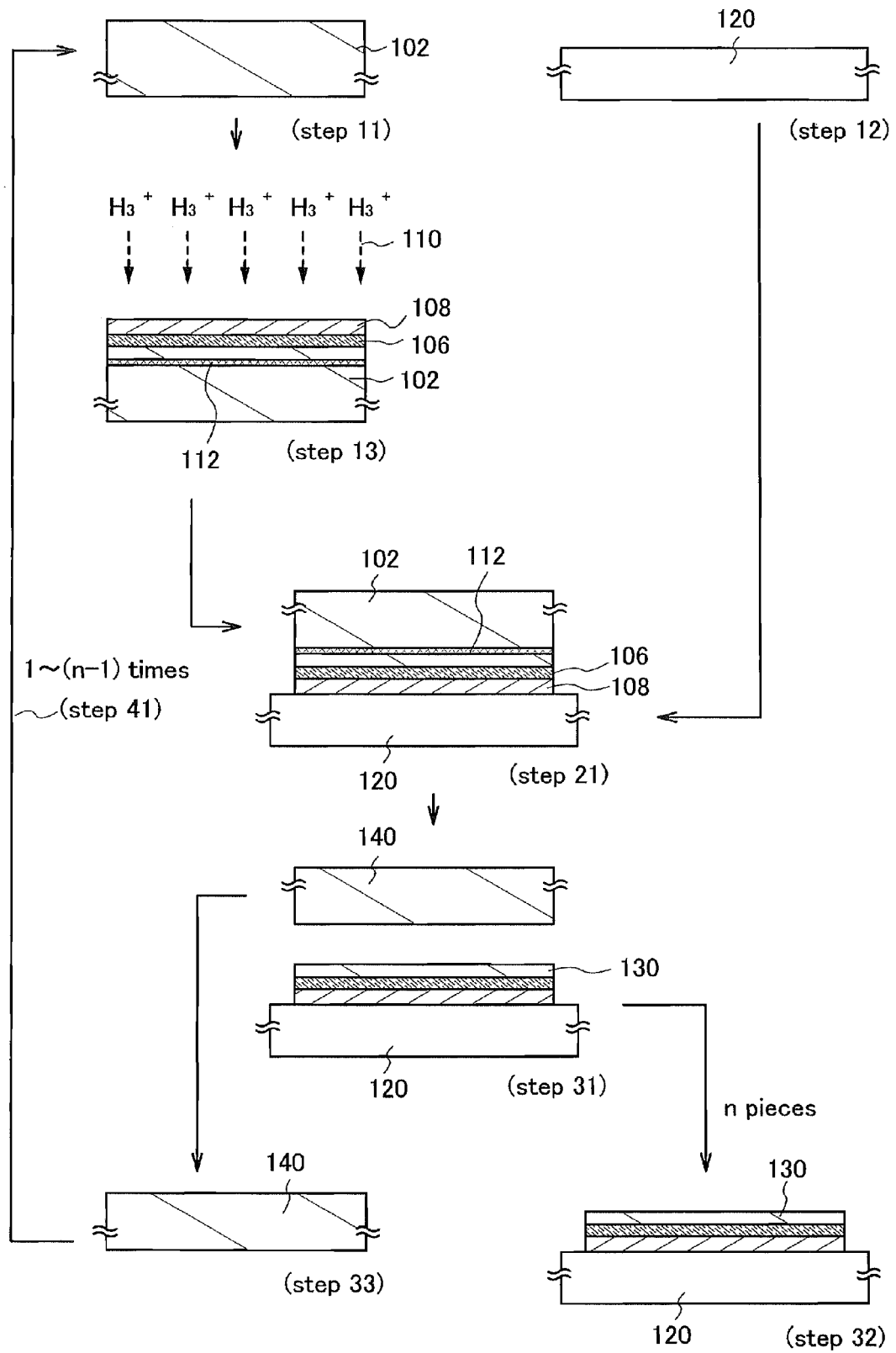
FIG. 1 is a flow diagram showing an example of a manufacturing method of an SOI substrate.

Embodiment modes of the present invention will be described hereinafter, using the drawings. Note that the present invention is not limited to the following description, and it is easily understood by those skilled in the art that the modes and details disclosed herein can be modified in various ways without departing from the spirit and scope of the present invention. Accordingly, the present invention should not be construed as being limited to the description of the embodiment modes below. Note that the same parts are denoted by the same reference numerals in different drawings in the structure of the present invention described hereinafter, in some cases.

Embodiment Mode 1

In a manufacturing method of an SOI substrate of this embodiment mode, a semiconductor layer separated from a semiconductor wafer which is a bond substrate is bonded to a base substrate to manufacture an SOI substrate. After the semiconductor layer is separated, a separation wafer is subjected to treatment for reusing and reused as a bond substrate. An example of an SOI substrate and its manufacturing method of this embodiment mode will be described below with reference to drawings.

A bond substrate and a base substrate are prepared. A semiconductor wafer 102 and a substrate having an insulating surface 120 are prepared as the bond substrate and the base substrate, respectively (see (step 11) and (step 12) in FIGS. 1 and 2).

As the semiconductor wafer 102, a semiconductor wafer of silicon, germanium, or the like, or a compound semiconductor wafer of gallium arsenide, indium phosphide, or the like is used, for example. Preferably, a single crystal semiconductor wafer is used. As for a single crystal silicon wafer which is a typical example of the single crystal semiconductor wafer, circular wafers 5 inches in diameter (125 mm), 6 inches in diameter (150 mm), 8 inches in diameter (200 mm), and 12 inches in diameter (300 mm) are available. Note that the shape of the wafer is not limited to a circular shape; and the wafer may be processed to be a rectangular shape.

Further, although there is no particular limitation on the thickness of the semiconductor wafer which is an initial raw-material wafer, it is preferable, considering reusing of a raw-material wafer, that the semiconductor wafer be thick because more SOI substrates can be manufactured from one raw-material wafer. Silicon wafers which are distributed generally satisfy a SEMI standard in size; for example, the thickness is 625 µm in the case of 6 inches in diameter, 725 µm in the case of 8 inches in diameter, and 775 µm in the case of 12 inches in diameter (each including a thickness tolerance of ±25 µm). The thickness of the semiconductor wafer which is a raw-material wafer is not limited to that regulated by the SEMI standard and can be controlled as appropriate at the time of cutting out from an ingot. Note that, when the thickness of the semiconductor wafer is set to be larger, the number of semiconductor wafers to be cut out from one ingot decreases but a material loss corresponding to a cutting margin can be reduced. Note that the wafer size is selected to satisfy the specifications or the like of apparatus used for manufacturing an SOI substrate.

As the substrate having the insulating surface 120, any glass substrate which is used in the electronics industry such as an aluminosilicate glass substrate, an aluminoborosilicate glass substrate, and a barium borosilicate glass substrate; a quartz substrate; a ceramic substrate; a sapphire substrate; or the like is used. Preferably, a glass substrate is used.

Further, it is preferable that the glass substrate have a polished surface with high planarity. This is because, by bonding the substrate having an insulating surface 120 to the semiconductor wafer 102 with the polished surface of the glass substrate used as a bonding plane, a bonding defect can be reduced. Note that the polishing of the glass substrate can be performed with cerium oxide or the like.

One surface side of the semiconductor wafer 102 is irradiated with cluster ions 110 by an ion doping apparatus. In this manner, a separation layer 112 is formed at a given depth from the surface side of the semiconductor wafer 102. Further, a first insulating layer 106 and a second insulating layer 108 are formed over the surface side of the semiconductor wafer 102 (see (step 13) in FIGS. 1 and 2).

There is no particular limitation on the formation order of the separation layer 112, the first insulating layer 106, and the second insulating layer 108. For example, there can be the following three formation orders: (1) the first insulating layer 106 is formed, the semiconductor wafer 102 is irradiated with the cluster ions 110 from the surface side where the first insulating layer 106 is formed to form the separation layer 112, and then, the second insulating layer 108 is formed over the first insulating layer 106; (2) the first insulating layer 106 is formed, the second insulating layer 108 is formed over the first insulating layer 106, and then, the semiconductor wafer 102 is irradiated with the cluster ions 110 from the surface side where the first insulating layer 106 and the second insulating layer 108 are stacked to form the separation layer 112; and (3) a protective layer is formed over one surface of the semiconductor wafer 102, the protective layer is irradiated with the cluster ions 110 to form the separation layer 112, the protective layer is removed, and then, the first insulating layer 106 and the second insulating layer 108 are stacked on the surface side of the semiconductor wafer 102 where the protective layer is formed and removed. This embodiment mode will be described with the formation order (1), using FIGS. 3A to 3C.

Figure 3A:
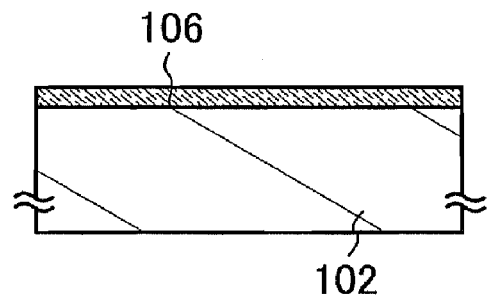
FIGS. 3A to 3C are diagrams showing an example of a manufacturing method of an SOI substrate.

The first insulating layer 106 is formed over the semiconductor wafer 102 (see FIG. 3A). The first insulating layer 106 may be formed by a CVD method, a sputtering method, or an atomic layer epitaxy (ALE) method. The first insulating layer 106 may have either a single layer structure or a stacked-layer structure and includes at least one nitrogen-containing insulating layer. Further, it is preferable that the first insulating layer 106 be formed with a thickness of 50 to 200 nm. As examples of the nitrogen-containing insulating layer, a silicon nitride layer, a silicon nitride oxide layer, a silicon oxynitride layer, and the like can be given. The nitrogen-containing insulating layer has an effect of blocking metal impurities such as an alkali metal or an alkaline earth metal. Therefore, in the case where a substrate containing a small amount of metal impurities, such as a glass substrate, is used as the base substrate, the nitrogen-containing insulating layer can prevent the metal impurities from diffusing into the semiconductor layer. Note that, in the case where a silicon nitride layer or a silicon nitride oxide layer is formed directly in contact with the semiconductor wafer 102, a trap level is formed, causing a problem in interface characteristics; therefore, it is preferable that a silicon oxide layer or a silicon oxynitride layer be interposed therebetween. By employing such a stacked-layer structure, contamination with metal impurities of the semiconductor layer can be prevented and electric characteristics at the interface can be improved. For example, the first insulating layer 106 can have a stacked-layer structure of a silicon oxynitride layer and a silicon nitride oxide layer which are formed in this order from the semiconductor wafer 102 side.

Note that, in this specification, the silicon oxynitride layer means a layer that contains higher composition of oxygen than nitrogen and shows concentration ranges of oxygen, nitrogen, silicon, and hydrogen from 50 to 70 at. %, 0.5 to 15 at. %, 25 to 35 at. %, and 0.1 to 10 at. %, respectively in the measurement using Rutherford backscattering spectrometry (RBS) and hydrogen forward scattering (HFS). Further, the silicon nitride oxide layer means a layer that contains higher composition of nitrogen than oxygen, and the measurement using RBS and HFS shows the concentration ranges of oxygen, nitrogen, silicon, and hydrogen from 5 to 30 at. %, 20 to 55 at. %, 25 to 35 at. %, and 10 to 30 at. %, respectively.

Alternatively, the first insulating layer 106 can be formed by performing thermal treatment on the semiconductor wafer 102 under an oxidizing atmosphere (hereinafter, also referred to as 'thermal oxidation'). However, one object of the present invention is to reuse the semiconductor wafer; therefore, it is also important to maintain the quality of the separation wafer obtained later through separation of a semiconductor layer. As reusing of a wafer is repeated, the probability of occurrence of the mechanical damage, that is, cutting, chipping, or the like is inevitably increased. The portion where mechanical damage occurs in the wafer becomes a center of thermal stress and tends to become an originating point of sliding dislocation (also called slip dislocation). In addition, a thermal oxidation method is a high-temperature process and tends to generate thermal stress; therefore, sliding dislocation readily occurs in the wafer when the thermal oxidation method is employed. If the sliding dislocation occurs in the wafer, crystallinity is decreased and wafer quality deteriorates. Furthermore, there is also a problem that the portion mechanically damaged results in increase in the probability of cracking of the wafer during thermal oxidation. Therefore, it is preferable that the thermal oxidation method be not employed for forming the insulating layer in the present invention. For example, it is preferable that the insulating layer be formed by a CVD method, a sputtering method, an oxidation treatment with ozone water, or the like instead of the thermal oxidation method. By forming the insulating layer with a method other than the thermal oxidation method, quality deterioration of a separation wafer obtained later through separation can be prevented and the separation wafer can be used without problems as a bond substrate for manufacturing an SOI substrate. Note that the thermal stress in this embodiment mode corresponds to thermal stress between a semiconductor wafer and an insulating layer formed in contact with the semiconductor wafer or thermal stress between a semiconductor wafer and a fixing jig (e.g., a susceptor).

Figure 3B:
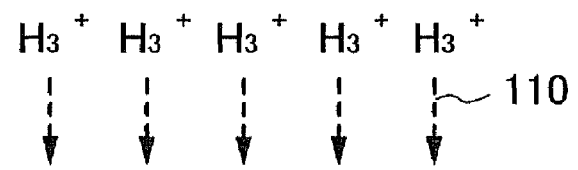

The separation layer 112 is formed at a given depth from one surface of the semiconductor wafer 102 (see FIG. 3B). One surface side of the semiconductor wafer 102 is irradiated with the cluster ions 110 by an ion doping apparatus so that the separation layer 112 is formed. In this embodiment mode, the surface side of the semiconductor wafer 102 where the first insulating layer 106 is formed is irradiated with $H_3^+$ ions generated from a source gas containing hydrogen and hydrogen is implanted into the semiconductor wafer 102 through the first insulating layer 106.

As examples of the cluster ion 110 generated from the source gas containing hydrogen, an $H_3^+$ ion and an $H_2^+$ ion can be given; preferably, an $H_3^+$ ion is used. By irradiating the semiconductor wafer (the first insulating layer 106 in this embodiment mode) with $H_3^+$ ions, implantation efficiency of hydrogen is improved as compared to the case of irradiation with $H^+$ or $H_2^+$ ions so that takt time required to form the separation layer 112 is shortened. Therefore, productivity is improved and throughput can also be improved.

According to a specific doping method using cluster ions of the present invention, hydrogen plasma is generated from a source gas containing hydrogen, cluster ions generated in the hydrogen plasma are accelerated by a voltage, and a semiconductor wafer (or an insulating layer provided for a semiconductor wafer) is irradiated with the cluster ions. Typical cluster ions generated in the hydrogen plasma are $H_2^+$ ions and $H_3^+$ ions. In addition, $H^+$ ions that are hydrogen ions are also generated.

The doping with cluster ions can be performed with an ion doping apparatus. The ion doping apparatus is an apparatus with no mass separation, by which an object to be processed disposed in a chamber is irradiated with all kinds of ions generated by plasma excitation of a source gas.

Main components of the ion doping apparatus are an ion source for generating a desired ion and an accelerating mechanism for irradiating an object to be processed with ions. The ion source includes a gas supply system for supplying a source gas from which a desired kind of ion sources is generated, an electrode for producing plasma, and the like. As the electrode for producing plasma, a filamentary electrode or an electrode for capacitively coupled radio-frequency discharge is used. The accelerating mechanism includes an electric power source, an electrode such as an extraction electrode, an accelerating electrode, a decelerating electrode, or an earth electrode, or the like. The electrode included in the accelerating mechanism is provided with a number of openings or slits, through which ions generated from the ion source pass and are accelerated. Note that the structure of the ion doping apparatus is not limited to the above; a mechanism according to need can be provided.

In this embodiment mode, a gas containing hydrogen is supplied as a source gas because hydrogen is implanted into a semiconductor wafer. For example, an $H_2$ gas is supplied. In the ion doping apparatus in which an $H_2$ gas is supplied as a source gas, hydrogen plasma is generated, and $H^+$ ions that are hydrogen ions and cluster ions such as $H_2^+$ ions and $H_3^+$ ions are generated in the hydrogen plasma. At this time, it is preferable that $H_3^+$ ions be contained at least 50% in the total amount of all kinds of ions generated from the source gas containing hydrogen (e.g., an $H^+$ ion, an $H_2^+$ ion, and an $H_3^+$ ion). It is more preferable that $H_3^+$ ions be contained at least 80% in the total amount of $H^+$, $H_2^+$, and $H_3^+$ ions. For example, hydrogen plasma is generated by thermoelectrons discharged from a filamentary electrode so that the proportion of $H_3^+$ ions can be increased as compared to the other ion species ($H^+$ ions and $H_2^+$ ions). Note that, although $H_3^+$ ions are shown in FIG. 1, the present invention is not limited to this case; $H^+$ or $H_2^+$ ions may be used for the irradiation. That is, in the present invention, hydrogen ions may be used in addition to the cluster ions for the irradiation.

Alternatively, doping with cluster ions can be performed with an ion implantation apparatus. The ion implantation apparatus is an apparatus with mass separation, by which an object to be processed disposed in a chamber is irradiated with certain ions after mass separation is performed on a plural kinds of ion species generated by plasma excitation of a source gas. Therefore, when the ion implantation apparatus is used in the present invention, $H_3^+$ ions can be selected by performing mass separation on $H^+$ ions, $H_2^+$ ions, and $H_3^+$ ions and used for the irradiation.

A large difference between the ion implantation apparatus and the ion doping apparatus lies in that whether or not a mechanism for performing mass separation is provided. The ion implantation apparatus has a mechanism for performing mass separation in addition to an ion source and an accelerating mechanism. Note that the structure of the ion implantation apparatus is not limited to the above structure, and a mechanism according to need can be provided; therefore, a different structure from the ion doping apparatus may be employed in addition to the mechanism for performing mass separation.

It is preferable that the separation layer 112 contain hydrogen at least $5\times10^{20}$ atoms/cm$^3$. Local implantation of hydrogen at a high concentration in a semiconductor wafer results in the formation of the separation layer 112 in which the crystal structure is lost and a microvoid is formed. Hence, the separation layer 112 has a porous structure. Therefore, the microvoid formed in the separation layer 112 is changed in volume by thermal treatment at a relatively low temperature (600° C. or less), so that the semiconductor wafer 102 can be separated along the separation layer 112. Note that the hydrogen concentration in the separation layer 112 is controlled by a dosage of the cluster ions, an accelerating voltage, or the like.

Further, the depth where the separation layer 112 is formed in the semiconductor wafer 102 is controlled by an accelerating voltage of the cluster ions 110 used for the irradiation and an irradiation angle of the cluster ions 110. The depth where the separation layer 112 is formed in the semiconductor wafer 102 determines the thickness of a semiconductor layer which is bonded to a base substrate later. The desired thickness of the semiconductor layer, which depends on the application of an SOI substrate, is preferably 5 to 500 nm, more preferably 10 to 200 nm. Therefore, the accelerating voltage and the introduction angle for the irradiation with the cluster ions 110 are adjusted considering the thickness of the semiconductor layer which is to be bonded.

One feature of the manufacturing method of an SOI substrate of the present invention is to reuse a separation wafer obtained through partial separation of the semiconductor wafer 102. The increase in thickness of the separation wafer increases the number of reusing. That is, the reduction in the thickness of the semiconductor layer obtained through the partial separation of the semiconductor wafer 102 allows the increase in the thickness of the separation wafer that is a semiconductor wafer after the semiconductor layer is separated, which leads to an increase in the number of reusing of the separation wafer. As a result, the number of SOI substrates which can be manufactured from one raw-material wafer can be increased. Therefore, it is preferable that the separation layer 112 be formed at a depth as small as possible from the surface of the semiconductor wafer 102.

Note that hydrogen can be efficiently implanted and throughput can be improved by using cluster ions, typically, $H_{3+}$ ions like the present invention even in an attempt to form the separation layer 112 at a small depth. The $H_3^+$ ions collide with atoms included in the insulating layer (the first insulating layer 106 in this embodiment mode) or the semiconductor wafer 102 in irradiating the semiconductor wafer, so that the $H_3^+$ ions are divided into three species including H atoms and $H^+$ ions, and a kinetic energy of each of three species is about one third of the kinetic energy of the $H_3^+$ ion obtained by acceleration by a voltage. That is, it can be considered that irradiation with $H_3^+$ ions allows the application of the accelerating voltage approximately three times larger than the case of irradiation with $H^+$ ions. Increase in the accelerating voltage enables the reduction of takt time taken to form the separation layer, which might be a rate-controlling factor, and improvement of productivity or throughput. Note that, the mode in which the $H_3^+$ ion is divided into three species is exemplified by, the separation into three 'H atoms', three '$H^+$ ions', two 'H atoms' and one '$H^+$ ion', or one 'H atom' and two '$H^+$ ions'.

Figure 23:
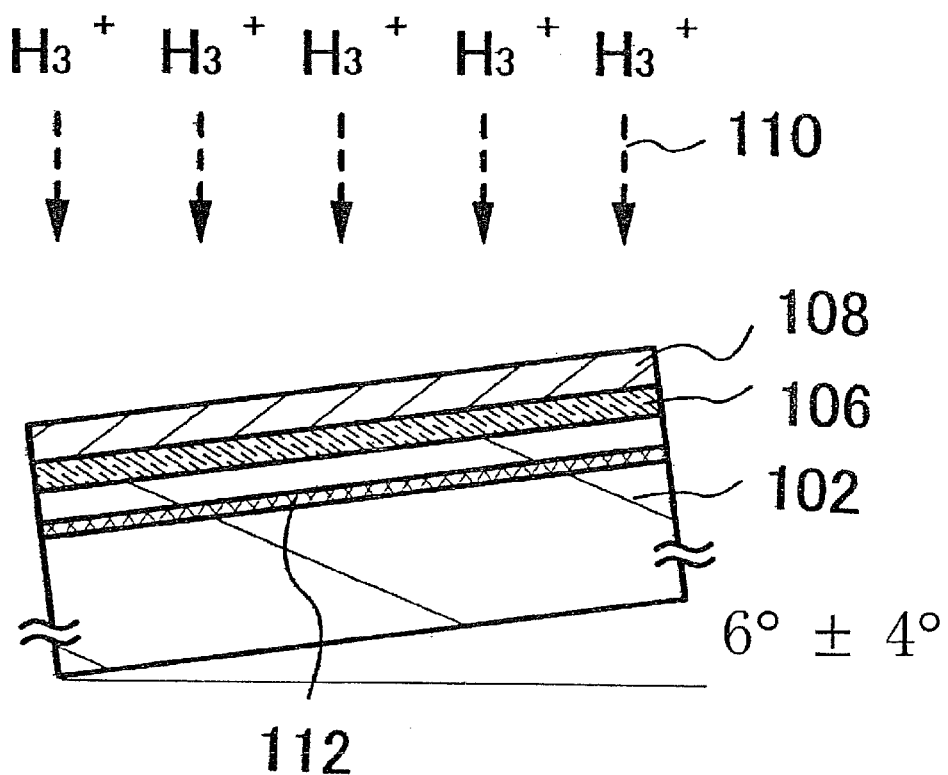
FIG. 23 is a diagram showing an example of an inclined semiconductor wafer.

Further, when the semiconductor wafer 102 is irradiated with the cluster ions 110, it is preferable that the semiconductor wafer 102 be inclined at about 6°±4° with respect to the vertical direction (see FIG. 23). By irradiating the semiconductor wafer 102 which is inclined with respect to the vertical direction, with the cluster ions 110, increase in concentration distribution of hydrogen included in the separation layer 112 can be suppressed. In addition, the separation layer 112 can be formed easily even at a small depth from the surface of the semiconductor wafer 102.

In this embodiment mode, the example in which hydrogen is implanted into the semiconductor wafer 102 through the first insulating layer 106 is described. By employing the structure in which hydrogen passes through the insulating layer at the time of implantation of hydrogen into the semiconductor wafer, increase in surface roughness of the semiconductor wafer can be prevented.

Figure 3C:
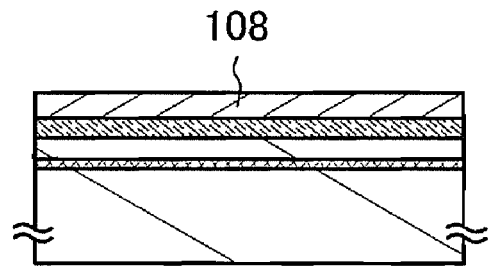

Next, the second insulating layer 108 is formed over the first insulating layer 106 (see FIG. 3C). In this embodiment mode, the second insulating layer 108 also functions as a layer which forms a bond with the substrate having the insulating surface 120 and is provided for the surface where the semiconductor wafer 102 forms a bond with the substrate 120 having the insulating surface. The second insulating layer 108 may have either a single layer structure or a stacked-layer structure, and it is preferable that a layer having a smooth and hydrophilic surface be formed as a plane (hereinafter, referred to as an 'bonding plane') which is bonded to the substrate having the insulating surface 120, by a CVD method with a thickness of 5 to 200 nm.

As a material of the insulating layer which has a smooth and hydrophilic surface, silicon oxide, silicon nitride, silicon oxynitride, silicon nitride oxide, or the like can be used.

For example, it is preferable that silicon oxide formed by a CVD method using organosilane as a source gas be used for the insulating layer having a smooth and hydrophilic surface. This is because, by using the second insulating layer 108 formed by a CVD method using organosilane as a source gas, such as a silicon oxide layer, the bonding strength between the substrate 120 having the insulating surface and the semiconductor layer can be increased. As organosilane, the following silicon-containing compound can be used: tetraethoxysilane (TEOS) (chemical formula: $Si(OC_2H_5)_4$); tetramethylsilane (TMS) (chemical formula: $Si(CH_3)_4$); trimethylsilane (chemical formula: $(CH_3)_3SiH$); tetramethylcyclotetrasiloxane (TMCTS); octamethylcyclotetrasiloxane (OMCTS); hexamethyldisilazane (HMDS); triethoxysilane (chemical formula: $SiH(OC_2H_5)_3$); trisdimethylaminosilane (chemical formula: $SiH(N(CH_3)_2)_3$); or the like.

Alternatively, a silicon oxide layer formed by a CVD method using inorganic silane such as monosilane, disilane, or trisilane as a source gas can be used as the insulating layer. Note that, in the case where a silicon oxide layer is formed by a CVD method using organosilane or inorganic silane as a source gas, a gas which is able to provide oxygen is mixed. Further, in the case where a silicon nitride layer is formed by a CVD method using organosilane or inorganic silane as a source gas, a gas which is able to provide nitrogen is mixed. As the gas which can provide oxygen, oxygen, nitrous oxide, nitrogen dioxide, or the like can be used. Further, the gas which can provide nitrogen, nitrous oxide, ammonia, or the like can be used. In addition, an inert gas such as argon, helium, or nitrogen or a hydrogen gas may be mixed.

Alternatively, a silicon oxide layer which grows by reaction of oxygen radicals, a chemically oxidized layer which is formed with an oxidizing chemical agent, or an insulating layer having a siloxane (Si—O—Si) bond can be used. Note that the insulating layer having a siloxane bond in this specification refers to a layer in which a bond of silicon (Si) and oxygen (O) is included in a skeleton structure. Siloxane has a substituent. An organic group containing at least hydrogen (e.g., an alkyl group or an aromatic hydrocarbon) can be given as the substituent. Alternatively, a fluoro group may be included in the organic group. Note that the insulating layer having a siloxane bond can be formed by an application method such as a spin coating method.

In the case where the second insulating layer 108 is formed after the separation layer 112 is formed, the second insulating layer 108 is formed at a deposition temperature at which degassing does not occur from the separation layer 112. For example, the deposition temperature is preferably less than or equal to 350° C. Further, like the first insulating layer 106, it is preferable that the second insulating layer 108 be formed without using a thermal oxidation method.

Figure 2:
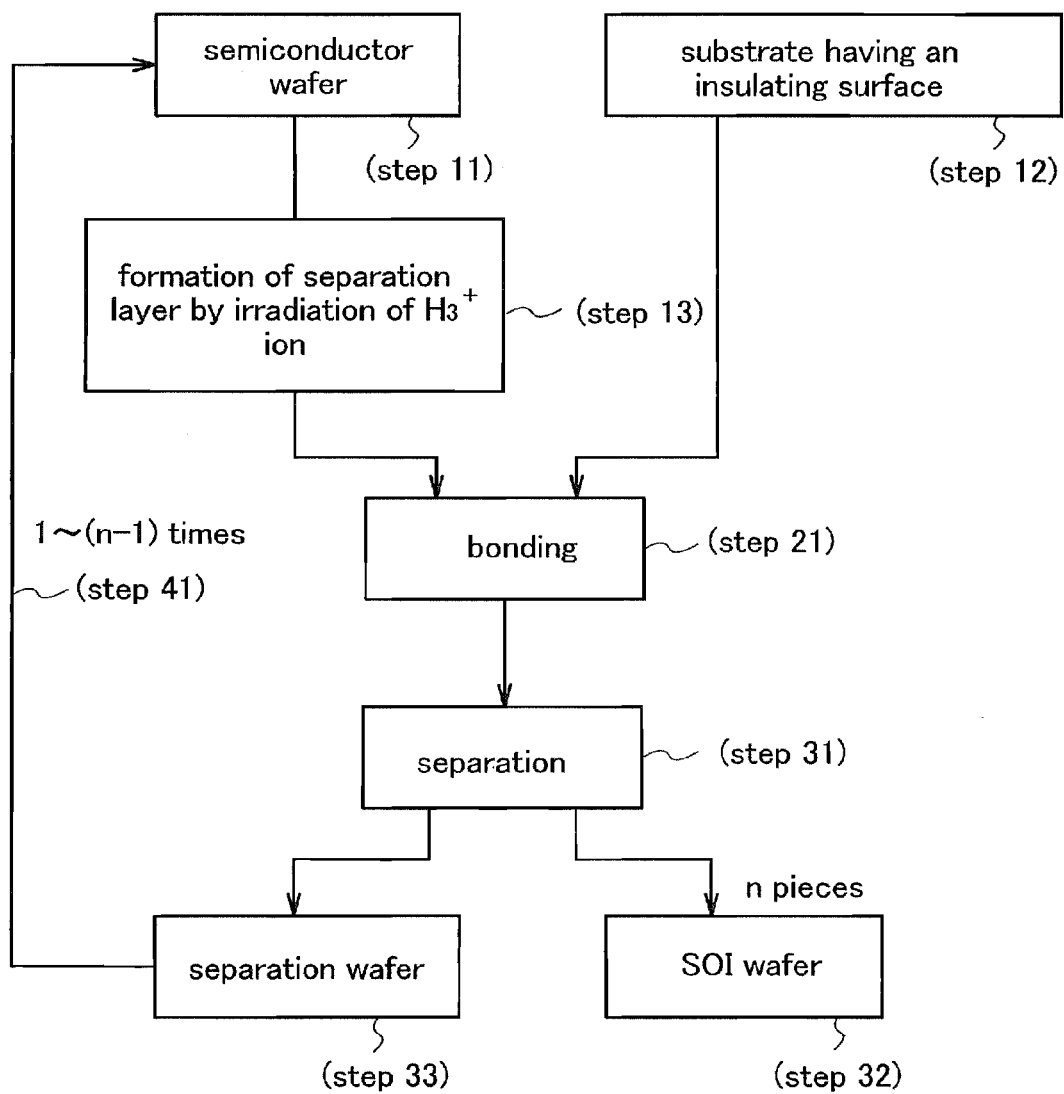
FIG. 2 is a flow diagram showing an example of a manufacturing method of an SOI substrate.

One surface side of the semiconductor wafer 102 and one surface side of the substrate having the insulating surface 120 are overlapped and attached to each other (see (step 21) in FIGS. 1 and 2). In this embodiment mode, they are attached to each other with the first insulating layer 106 and the second insulating layer 108 interposed therebetween. Therefore, one surface of the second insulating layer 108 and one surface of the substrate having the insulating surface 120 are bonding planes.

The bonding planes of the semiconductor wafer 102 (the second insulating layer 108 in this embodiment mode) and the substrate 120 having the insulating surface, which form a bond, are cleaned sufficiently in advance. Then, the second insulating layer 108 formed on the one surface side of the semiconductor wafer 102 and the substrate having the insulating surface 120 are brought in close contact with each other to form the bond. It is considered that Van der Waals force acts on the bonding at an early stage and then a strong bonding is formed, which is contributed by a hydrogen-bond formation induced by pressing the semiconductor wafer 102 provided with the second insulating layer 108 on the one surface side and the substrate having the insulating surface 120 to each other.

In order to efficiently perform the bonding of the second insulating layer 108 formed on the one surface side of the semiconductor wafer 102 and the substrate having the insulating surface 120, the bonding planes may be activated in advance. For example, one or both of the bonding planes are irradiated with an atom beam or an ion beam. In the case of utilizing an atom beam or an ion beam, a neutral atom beam or an ion beam of an inert gas such as argon can be used. Alternatively, the bonding planes can be activated by performing plasma irradiation or radical treatment. Such surface treatment facilitates formation of a bond between different materials even at a temperature of 400° C. or less. Further, one or both of the bonding planes may be cleaned with ozone-containing water, oxygen-containing water, hydrogen-containing water, pure water, or the like. Such cleaning treatment can make the one or both of the bonding planes hydrophilic so that the number of the OH groups on the one or both of the bonding planes can be increased. As a result, the bonding strength contributed by a hydrogen bond can be further increased.

Note that it is preferable that thermal treatment or pressure treatment be performed after the semiconductor wafer 102 and the substrate having the insulating surface 120 are attached to each other. Thermal treatment or pressure treatment can increase the bonding strength. In the case where the thermal treatment is performed, the temperature of the thermal treatment is set at a temperature that is less than or equal to the upper temperature limit of the substrate having the insulating surface 120 and is a temperature which does not cause change in volume of the separation layer 112 formed in the semiconductor wafer 102. The temperature of the thermal treatment is preferably set at a temperature more than or equal to room temperature and less than 400° C. The pressure treatment is performed so that pressure is applied in a direction perpendicular to the bonding planes, considering the pressure resistance of the substrate having the insulating surface 120 and the semiconductor wafer 102.

Next, thermal treatment is performed so that the semiconductor wafer 102 is partially separated from the substrate having the insulating surface 120, by using the separation layer 112 or a region near the separation layer 112 as a separation plane (see (step 31) in FIGS. 1 and 2). A semiconductor layer 130 separated from the semiconductor wafer 102 remains over the substrate having the insulating surface 120, thereby forming an SOI substrate (see (step 32) in FIGS. 1 and 2). In addition, a separation wafer 140 can be obtained after the semiconductor layer 130 is separated (see (step 33) in FIGS. 1 and 2).

The thermal treatment for partial separation of the semiconductor wafer 102 is preferably performed at a temperature which is equal to or more than the deposition temperature of the second insulating layer 108 and equal to or less than the upper temperature limit of the substrate having the insulating surface 120. For example, by performing the thermal treatment at 400 to 600° C., the volume of the microvoid formed in the separation layer 112 is changed; thus, the semiconductor wafer 102 is separated along the separation layer 112. Since the second insulating layer 108 is bonded to the substrate having the insulating surface 120, the semiconductor layer 130 having the same crystallinity as the semiconductor wafer 102 remains over the substrate having the insulating surface 120. In addition, the separation wafer 140 is obtained after the semiconductor layer 130 is separated from the semiconductor wafer 102.

Through the above-described process, an SOI substrate in which the semiconductor layer 130 is bonded to the substrate having the insulating surface 120 with the insulating layer (the first insulating layer 106 and the second insulating layer 108) interposed therebetween is manufactured. Further, the separation wafer 140 can be obtained with the manufacturing of the SOI substrate.

Then, treatment for reusing is performed, and the separation wafer 140 is reused as a semiconductor wafer which is a bond substrate (see (step 41) in FIGS. 1 and 2).

The separation wafer 140 has a problem in surface planarity when it is reused as a bond substrate as it is because the plane obtained after the separation of the semiconductor layer 130 is a separation plane at the separation layer 112. Further, crystal defects are formed in some cases by the separation at the separation layer 112 and the ion irradiation for forming the separation layer 112. Therefore, it is necessary to perform planarization treatment or the like as the treatment for reusing in order to reuse the separation wafer 140 as a bond substrate.

As the planarization treatment for reusing the separation wafer 140, polishing treatment, etching treatment, thermal treatment, laser beam irradiation, or the like can be used. It is preferable to use polishing treatment capable of mirror-like finishing in consideration of reusing as a bond substrate. By performing the polishing treatment, removal of the region where the crystal defects are formed can be performed in addition to the planarization. As the polishing treatment, a chemical mechanical polishing (CMP) method or a polishing method utilizing a liquid jet can be used.

The separation wafer 140 after being subjected to the treatment for reusing is reused as the semiconductor wafer 102 which is a bond substrate (see (step 11) in FIGS. 1 and 2). Then, the semiconductor wafer 102 is used again as the bond substrate and the process from (step 11) to (step 31) shown in FIGS. 1 and 2 is performed, so that an SOI substrate is manufactured (step 32) and a separation wafer can be obtained (step 33).

Further, the semiconductor layer 130 of the SOI substrate also has problems of planarity of the separation plane, crystal defects by the formation of the separation layer 112, and the like. For example, in the case where the SOI substrate is used for manufacturing an LSI, the semiconductor layer 130 is used as an active layer including a channel formation region, a source region, and a drain region of a transistor. If the surface of the semiconductor layer 130 is rough, it is difficult to form a thin gate insulating layer with high withstand voltage thereover. Further, if crystal defects are formed in the semiconductor layer 130, variations of characteristics or the like occur to generate a problem in quality or reliability. Therefore, it is preferable that planarization or reduction of crystal defects is performed on the surface of the semiconductor layer 130 to recover the characteristics of the semiconductor layer For example, by laser beam irradiation, planarization or reduction of crystal defects can be performed.

Figure 4A:
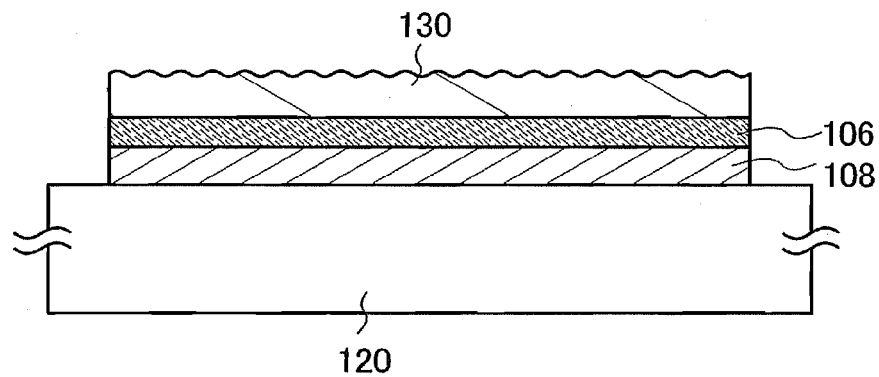
FIGS. 4A to 4C are diagrams showing an example of a manufacturing method of an SOI substrate.
Figure 4B:
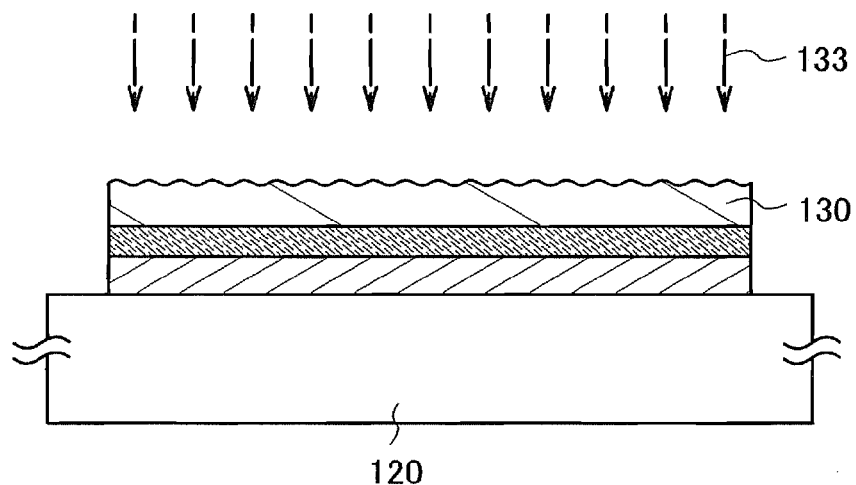
Figure 4C:
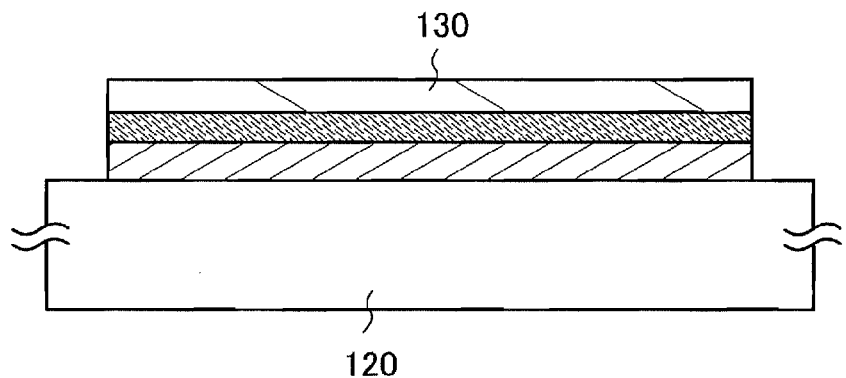

FIGS. 4A to 4C show an example of a treatment of planarization and recovery of crystal defects of the semiconductor layer included in the SOI substrate. FIG. 4A shows an SOI substrate obtained through partial separation of the semiconductor wafer 102, that is, corresponds to the SOI substrate obtained through (step 31) in FIGS. 1 and 2. The surface of the semiconductor layer 130 on the side of the separation plane has large roughness. Further, crystal defects are formed in the semiconductor layer 130 in this embodiment mode, although not shown in FIG. 4A.

The semiconductor layer 130 is irradiated with laser beams 133 (see FIG. 4B). By the irradiation with the laser beams 133, the semiconductor layer 130 can be planarized and the crystal defects, damage, and the like of the semiconductor layer 130 can be reduced. Note that it is preferable that the irradiation with the laser beams 133 be performed from the semiconductor layer 130 side. Further, it is preferable that the irradiation with the laser beams 133 be performed under a nitrogen atmosphere with an oxygen concentration of 10 ppm or less. This is because the surface of the semiconductor layer might become rough when the laser beam irradiation is performed under an oxygen atmosphere.

By the laser beam 133 irradiation, an SOI substrate including the semiconductor layer 130 where the top-surface planarity is improved can be obtained (see FIG. 4C). In the SOI substrate obtained through the above process, crystal defects of the semiconductor layer are recovered and the surface of the semiconductor layer is planarized. As a result, the SOI substrate can be provided or used as a high-quality SOI substrate.

Note that the treatment for recovery of the characteristics of the semiconductor layer is not limited to laser beam irradiation. Thermal treatment with an electric furnace, a lamp annealing furnace, a rapid thermal annealing (RTA) apparatus, or the like; etching; CMP; or the like may be used, and some of them may be combined.

For example, after the SOI substrate is obtained by partial separation of the semiconductor wafer 102 (see FIG. 4A), etching treatment may be performed to remove a damage layer or the separation layer which remains on the surface of the semiconductor layer, and then, laser beam irradiation may be performed (see FIG. 4B). Furthermore, in the case where the semiconductor layer is thinned, etching treatment may be performed again after the laser beam irradiation. The etching treatment may be performed by one or both of dry etching and wet etching. CMP treatment can be alternatively used instead of the etching treatment so that the semiconductor layer is thinned.

In this embodiment mode, a process from the step of preparing the bond substrate (step 11) and the base substrate (step 12) to the step of separating the bond substrate to obtain the SOI substrate (step 32) and the separation wafer (step 33) is referred to as process A. A process from the step of performing the treatment for reusing on the separation wafer obtained by the process A to the step of reusing as a bond substrate (step 41) is referred to as process B. According to the manufacturing method of an SOI substrate of the present invention, a plurality of SOI substrates and a plurality of separation wafers can be obtained by repeating the process A. In specific, by performing the process A n times (n is an integer number of 2 or more), n pieces of SOI substrates and n pieces of separation wafers can be obtained. In this case, by performing the process B in addition to process A, the separation wafer can be used effectively. In specific, when the n pieces of SOI substrates are manufactured, each of the n pieces of separation wafers can be reused once to (n−1) times. As described above, by reusing the separation wafer, it is not necessary to prepare a new raw-material wafer for each time so that cost can be reduced and resource consumption can be reduced. Preferably, a set of the process A and the process B is performed n times, thereby n pieces of SOI substrates can be obtained using one raw-material wafer. In this case, the separation wafer generated from the one raw-material wafer is reused (n−1) times as a bond substrate. In other words, when the n pieces of SOI substrates are manufactured, the separation wafer can be used as bond substrates for manufacturing (n−1) pieces of SOI substrates. Accordingly, the number of raw-material wafers can be reduced to one so that a semiconductor wafer which is a raw material can be effectively used and cost reduction can be achieved.

Further, cluster ions, specifically, $H_3^+$ ions are used for the formation of the separation layer, which might be a rate-controlling factor, so that implantation efficiency of hydrogen can be improved. As a result, takt time can be shortened and productivity or throughput can be improved.

Furthermore, in the case where a thermal oxidation method is not applied for forming any insulating layer, as described in this embodiment mode, the quality of the separation wafer can be maintained and semiconductor wafers can be provided with a specific level of quality. Thus, the production of the SOI substrates using the separation wafer as the bond substrate can be performed with high yield.

Note that the separation wafer is not necessarily reused as a bond substrate but can be used for other applications, for example, for manufacturing of a solar cell. The separation wafer can also be used as a monitor substrate or a dummy substrate. Further, respective manufacturing methods of the SOI substrates are not necessarily the same as each other.

Further, a plurality of the semiconductor wafers 102 can be disposed over the substrate having the insulating surface 120 so that a plurality of the semiconductor layers 130 can be provided over the substrate having the insulating surface 120. In this case, a mother glass with a large area referred to as 6th-generation (1500 mm×1850 mm), 7th-generation (1870 mm×2200 mm), or 8th-generation (2200 mm×2400 mm) is preferably used as the substrate having the insulating surface 120. In this manner, regardless of the size of the semiconductor wafer 102, the area of an SOI substrate can be increased or the number of SOI substrates which can be manufactured using one base substrate can be increased so that productivity can be improved.

Note that this embodiment mode can be combined with another embodiment mode as appropriate.

Embodiment Mode 2

The example of (1) in which the first insulating layer 106 is formed, the semiconductor wafer 102 is irradiated with the cluster ions 110 from the surface side where the first insulating layer 106 is formed to form the separation layer 112, and then, the second insulating layer 108 is formed over the first insulating layer 106 in (step 13) is described in Embodiment Mode 1. In Embodiment Mode 2, the following examples will be described: the example of (2) in which the first insulating layer 106 is formed, the second insulating layer 108 is formed over the first insulating layer 106, and then, the semiconductor wafer 102 is irradiated with the cluster ions 110 from the surface side where the first insulating layer 106 and the second insulating layer 108 are stacked so that the separation layer 112 is formed; and the example of (3) in which a protective layer 103 is formed over one surface of the semiconductor wafer 102, the protective layer 103 is irradiated with the cluster ions 110 so that the separation layer 112 is formed, the protective layer 103 is removed, and then, the first insulating layer 106 and the second insulating layer 108 are stacked on the surface side of the semiconductor wafer 102 where the protective layer 103 is formed and removed. Note that the materials, manufacturing method, and the like of this embodiment mode except the formation order of the separation layer 112, the first insulating layer 106, and the second insulating layer 108 conform to Embodiment Mode 1, and thus, description thereof is omitted.

Figure 5A:
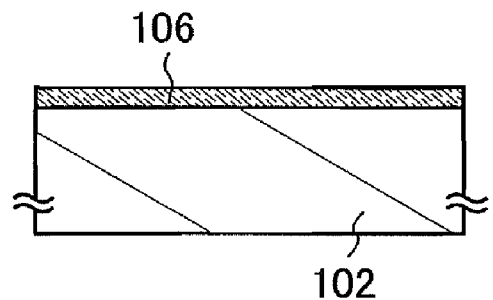
FIGS. 5A to 5C are diagrams showing an example of a manufacturing method of an SOI substrate.
Figure 5B:
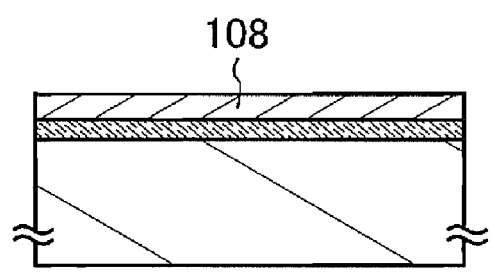

First, the above-described example of (2) will be described using FIGS. 5A to 5C. The first insulating layer 106 is formed over the semiconductor wafer 102 (see FIG. 5A). Next, the second insulating layer 108 is formed over the first insulating layer 106 (see FIG. 5B). Note that each material, formation method, and the like of the first insulating layer 106 and the second insulating layer 108 confirm to those in Embodiment Mode 1.

Figure 5C:
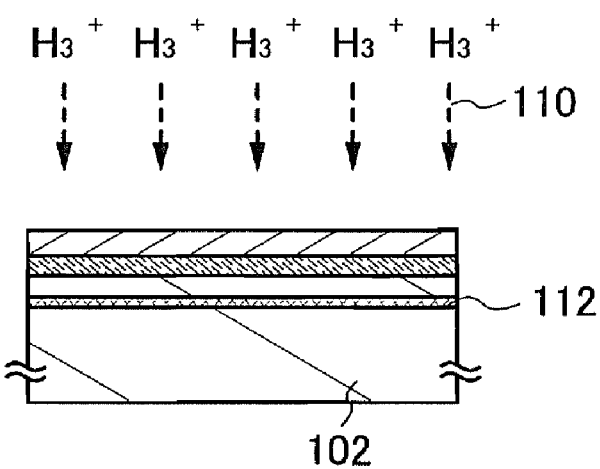

The semiconductor wafer 102 is irradiated with the cluster ions 110 from the surface side where the first insulating layer 106 and the second insulating layer 108 are fowled so that the separation layer 112 is formed in the semiconductor wafer 102 (see FIG. 5C).

The formation method of the separation layer 112 also conforms to that in Embodiment Mode 1. Note that, in FIGS. 5A to 5C, the second insulating layer 108 is irradiated with the cluster ions 110 so that hydrogen is implanted into the semiconductor wafer 102 through the second insulating layer 108 and the first insulating layer 106. Therefore, when the irradiation with the cluster ions 110 is performed, it is necessary that the accelerating voltage, dosage, or irradiation angle of the cluster ions 110 be set considering that the cluster ions 110 pass through the second insulating layer 108, unlike the formation method shown in FIGS. 3A to 3C described in Embodiment Mode 1.

After the formation of the separation layer 112, an SOI substrate is manufactured through the procedure after (step 21) in FIGS. 1 and 2 and a separation wafer obtained with the manufacturing of the SOI substrate can be reused. The treatment for reusing of the separation wafer, the treatment for recovery of a semiconductor layer of the SOI substrate, and the like may also be performed conforming to those in Embodiment Mode 1.

Figure 6A:
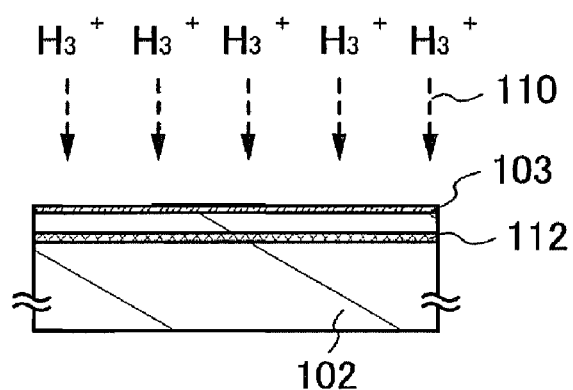
FIGS. 6A to 6C are diagrams showing an example of a manufacturing method of an SOI substrate.

Next, the above-described example of (3) will be described using FIGS. 6A to 6C. The protective layer 103 is formed on one surface side of the semiconductor wafer 102, and the protective layer 103 is irradiated with the cluster ions 110 so that the separation layer 112 is formed in the semiconductor wafer 102.

As the protective layer 103, a thin film is formed by performing oxidation treatment on the semiconductor wafer. In specific, a chemical oxide film which is formed with an oxidizing chemical agent or an oxide film which is formed by oxygen radical treatment is formed as the protective layer 103.

The formation method of the separation layer 112 confirms to that in Embodiment Mode 1, like the case of (2). Note that, in FIGS. 6A to 6C, the protective layer 103 is irradiated with the cluster ions 110 so that hydrogen is implanted into the semiconductor wafer 102 through the protective layer 103. Note that the protective layer 103 is a very thin film compared to the first insulating layer 106. Therefore, when the irradiation with the cluster ions 110 is performed, it is necessary that the accelerating voltage, dosage, or irradiation angle of the cluster ions 110 be set considering that the protective layer through which hydrogen passes is thin, unlike the formation method shown in FIGS. 3A to 3C described in Embodiment Mode 1.

Figure 6B:
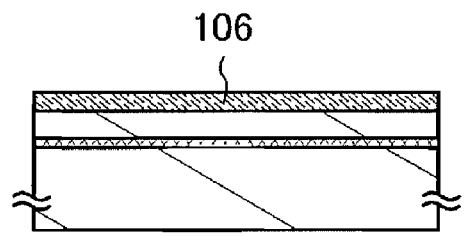
Figure 6C:
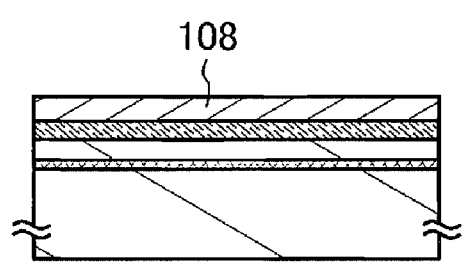

Next, the protective layer 103 is removed, and the first insulating layer 106 is formed on the side of the semiconductor wafer 102 where the irradiation with the cluster ions 110 is performed (see FIG. 6B). Then, the second insulating layer 108 is formed over the first insulating layer 106 (see FIG. 6C).

Although the first insulating layer 106 and the second insulating layer 108 may be formed by materials and formation methods confirming to those in Embodiment Mode 1, they are formed at a deposition temperature at which degassing and separation do not occur in the separation layer 112 because the separation layer 112 is already formed in the semiconductor wafer 102. Therefore, it is not preferable to use a thermal oxidation method that is a high-temperature process, and a CVD method, a sputtering method, or the like is preferably used.

After the formation of the second insulating layer 108, an SOI substrate is manufactured through the procedure after (step 21) in FIGS. 1 and 2 and a separation wafer obtained with the manufacturing of the SOI substrate can be reused. The treatment for reusing of the separation wafer, the treatment for recovery of a semiconductor layer of the SOI substrate, and the like may also be performed conforming to those in Embodiment Mode 1.

Note that this embodiment mode can be combined with another embodiment mode as appropriate.

Embodiment Mode 3

In this embodiment mode, the hydrogen concentration distribution when hydrogen is implanted into the semiconductor wafer in Embodiment Mode 1 or 2 will be described.

With the ion doping apparatus, irradiation of a semiconductor wafer (a silicon wafer with a crystal orientation of a (100) plane) with $H_3^+$ or $H^+$ ions was performed. Then, based on the resulting data on secondary ion mass spectrometry (SIMS) analysis, a model of hydrogen implantation was established and the concentration of hydrogen in a depth direction was calculated. The calculation was performed in the following condition: the size of the model is (x-axis, y-axis, z-axis)=(800 nm, 800 nm, 1200 nm). Note that the x-axis and y-axis corresponds to a plane surface of the semiconductor wafer and the z-axis corresponds to a depth direction. Further, in the ion doping apparatus used in the experiment, the wafer was rotated in order to uniform the hydrogen implantation distribution.

The number of hydrogen atoms in the depth direction in the case where a semiconductor wafer 12 is irradiated with $H_3^+$ or $H^+$ ions from the surface side where a 100-nm-thick insulating layer 14 is provided was calculated by a Monte Carlo method. In this embodiment mode, the calculation was performed in the following conditions: the accelerating voltage of $H_3^+$ ions is 50 keV, the accelerating voltage of $H^+$ ions is 16.7 keV, and the insulating layer 14 is an amorphous silicon oxide layer.

Figure 17A:
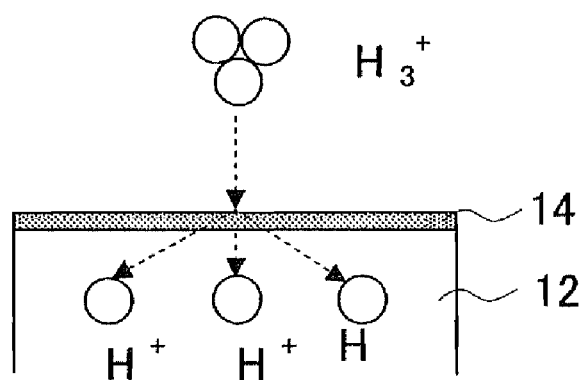
FIGS. 17A and 17B are respective model diagrams describing irradiation of a semiconductor wafer with $H_3^+$ ion and an $H^+$ ion.
Figure 17B:
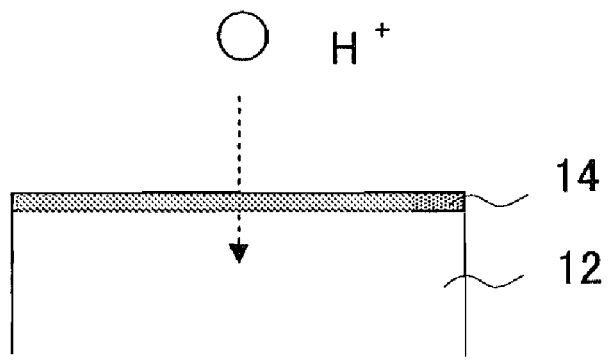
Figure 18:
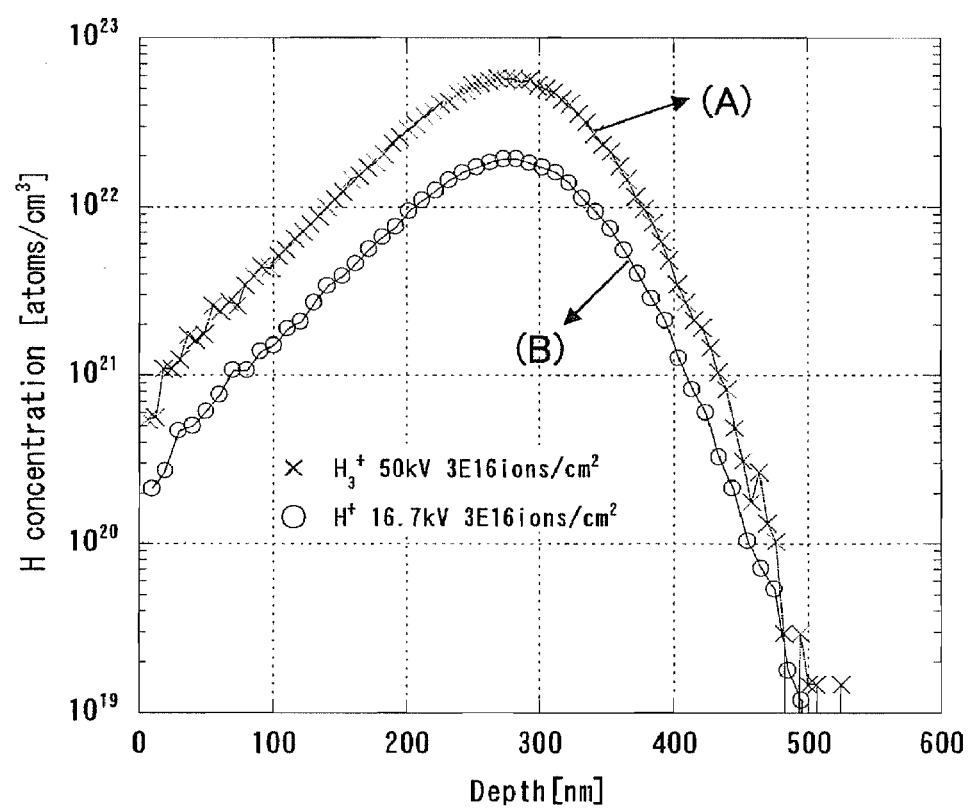
FIG. 18 is a graph showing concentrations of hydrogen implanted into a semiconductor wafer, calculated based on the model diagrams.

FIGS. 17A and 17B are model diagrams of hydrogen implantation, and FIG. 18 is a graph showing the hydrogen concentration distribution in the depth direction, which was calculated based on the model diagrams. Note that, in the graph shown in FIG. 18, the horizontal axis indicates the depth (nm) from the surface of the semiconductor wafer including the 100-nm-thick insulating layer 14 (the silicon oxide layer) and the vertical axis indicates the hydrogen concentration (atoms/cm$^3$).

FIG. 17A is a first model diagram in which an $H_3^+$ ion accelerated at the accelerating voltage of 50 keV is separated to result in three $H^+$ ions on the surface of the semiconductor wafer 12, the surface of the insulating layer 14 in this embodiment mode.

It is thought that the $H_3^+$ ion collides with an atom near the surface (a silicon atom or an oxygen atom included in the insulating layer 14 or the semiconductor wafer 12) at the time of irradiating the semiconductor wafer. The bond energy of hydrogen atoms of an $H_3^+$ ion is infinitely smaller than the kinetic energy of an ion accelerated at an accelerating voltage of 50 keV. Therefore, it can be thought that most of the $H_3^+$ ions are separated to form three species including the H atom and the $H^+$ ions at the stage of colliding with the semiconductor wafer or the surface of the insulating layer formed over the semiconductor wafer. Further, by the separation of the $H_3+$ ion into three species, the kinetic energy of the H atom or $H^+$ ion is reduced and estimated to be about one third of the kinetic energy of the $H_3^+$ ion accelerated at the accelerating voltage of 50 keV in the first model diagram. That is, it is supposed that the same effect as the case where irradiation is performed with an $H_3^+$ ion at an accelerating voltage of X keV can be obtained by irradiation with three $H^+$ ions with an accelerating voltage of X/3 keV.

FIG. 17B is a second model diagram in which an $H^+$ ion itself is implanted into the semiconductor wafer 102.

Curve (A) in the graph of FIG. 18 denotes the hydrogen concentration distribution in the depth direction, which was calculated when the accelerating voltage was 50 keV and the dosage was $3 \times 10^{16}$ ions/cm$^2$ based on the first model diagram. It can be seen that the hydrogen concentration peaked at about 300 nm and was about $6 \times 10^{22}$ ions/cm$^2$.

Further, curve (B) in the graph of FIG. 18 denotes the hydrogen concentration distribution in the depth direction, which was calculated when the accelerating voltage was 16.7 keV and the dosage was $3 \times 10^{16}$ ions/cm$^2$ based on the second model diagram. It can be seen from the curve (B) that the hydrogen concentration peaked at about 300 nm and was about $2 \times 10^{22}$ ions/cm$^2$.

From FIG. 18, it is found that, the accelerating voltage for implanting hydrogen at a given depth can be further increased by using $H_3^+$ ions as compared to the case of using $H^+$ ions. The decrease in accelerating voltage results in the decrease in the dose rate, leading to the deterioration of takt time. Therefore, the use of $H_3^+$ ions allows the application of high accelerating voltage, which enables the reduction of the takt time to form a separation layer.

Although the calculation result at the accelerating voltage of 50 keV is shown in FIG. 18, the peak of the hydrogen concentration can be controlled by controlling the accelerating voltage. In addition, although the calculation result when the insulating layer 14 is a silicon oxide layer with a thickness of 100 nm is shown in FIG. 18, the position of the separation layer in the semiconductor wafer can be controlled by controlling the thickness of the insulating layer 14.

Embodiment Mode 4

A different example of the manufacturing method of an SOI substrate from the above-described embodiment modes will be described using FIG. 7 in this embodiment mode.

Figure 7:
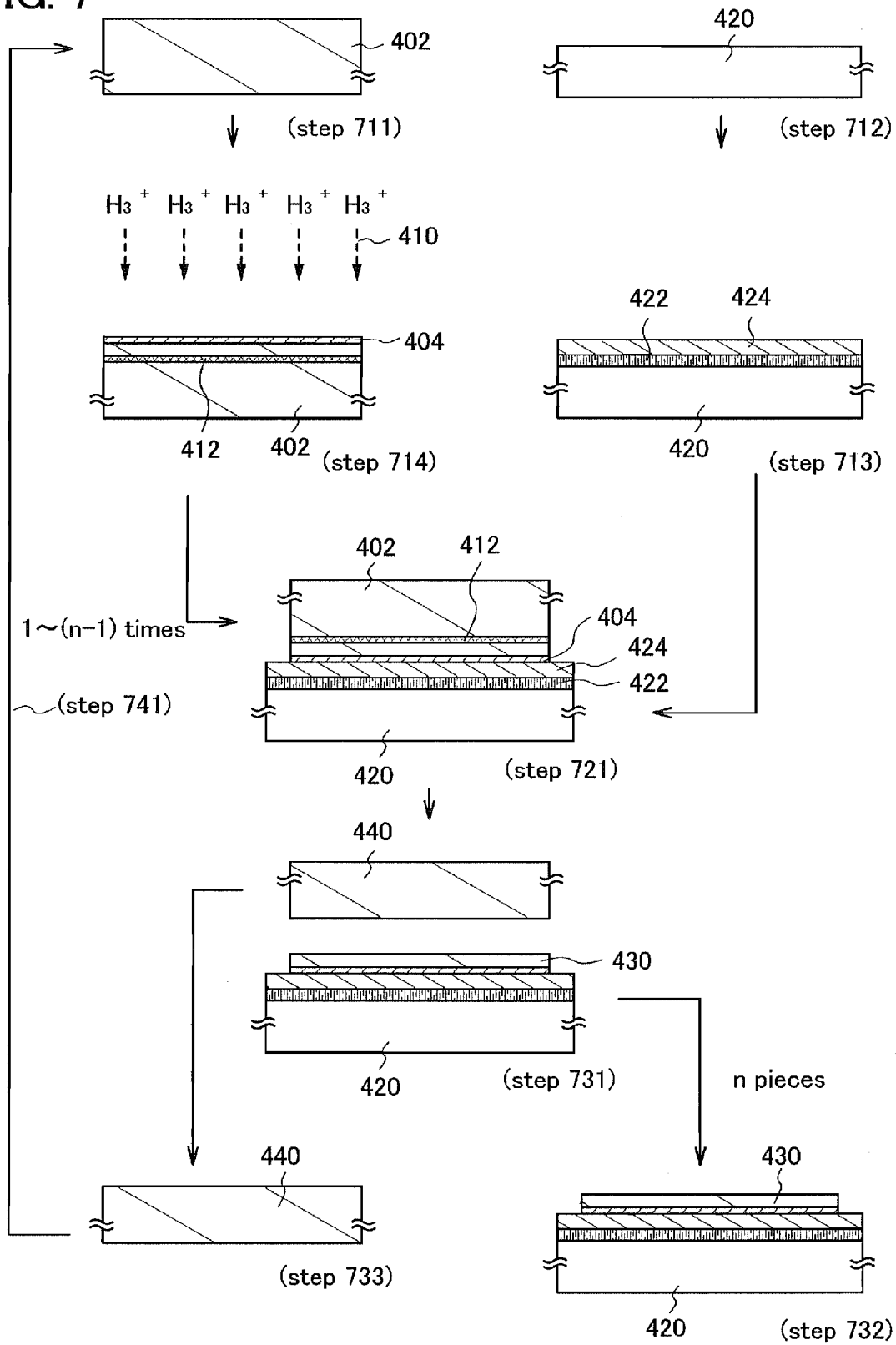
FIG. 7 is a flow diagram showing an example of a manufacturing method of an SOI substrate.

A semiconductor wafer 402 and a substrate having an insulating surface 420 are prepared as a bond substrate and a base substrate, respectively (see (step 711) and (step 712) in FIG. 7).

The semiconductor wafer 402 conforms to the semiconductor wafer 102 described in Embodiment Mode 1. In a similar manner, the substrate having the insulating surface 420 conforms to the substrate having the insulating surface 120. In this embodiment mode, a silicon wafer is used as the semiconductor wafer 402 and a glass substrate is used as the substrate having the insulating surface 420.

In this embodiment mode, a first insulating layer 422 and a second insulating layer 424 are formed over the substrate having the insulating surface 420 which is a base substrate (see (step 713) in FIG. 7).

The first insulating layer 422 is formed by a CVD method, a sputtering method, or an ALE method. The first insulating layer 422 may have either a single layer structure or a stacked-layer structure and includes at least one nitrogen-containing insulating layer. As the nitrogen-containing insulating layer, a silicon nitride layer, a silicon nitride oxide layer, a silicon oxynitride layer, or the like is formed, and it is preferable that the nitrogen-containing insulating layer function as a blocking layer of blocking metal impurities in the substrate having the insulating surface 420. For example, the first insulating layer 422 can have a stacked-layer structure of a silicon oxynitride layer and a silicon nitride oxide layer which are formed in this order from the semiconductor wafer 402 side.

The second insulating layer 424 may have either a single layer structure or a stacked-layer structure as long as a layer which has a smooth and hydrophilic surface be formed as a plane which is subjected to the bonding to the semiconductor wafer 402. In specific, a silicon oxide layer formed by a CVD method using organosilane as a source gas; a silicon oxide layer or silicon oxynitride layer formed by a CVD method using inorganic silane as a source gas; or the like can be employed.

A separation layer 412 is formed at a given depth from one surface of the semiconductor wafer 402 which is a bond substrate (see (step 714) in FIG. 7). In this embodiment mode, after a third insulating layer 404 which functions as a protective layer is formed over one surface of the semiconductor wafer 402, the semiconductor wafer 402 is irradiated with cluster ions 410 from the surface where the third insulating layer 404 is formed. That is, hydrogen is implanted into the semiconductor wafer 402 through the third insulating layer 404.

The third insulating layer 404 is formed of one material or a plurality of materials selected from silicon oxide, silicon nitride, silicon nitride oxide, silicon oxynitride, and the like. The third insulating layer 404 may have either a single layer structure or a stacked-layer structure. It is preferable that the third insulating layer 404 be formed by a method other than a thermal oxidation method (e.g., a CVD method, a sputtering method, an ALE method, or oxidation treatment by ozone treatment or plasma treatment). The thickness of the third insulating layer 404 is preferably about 10 to 200 nm. By the third insulating layer 404, increase in the roughness of the surface of the semiconductor wafer 402 (the surface of a semiconductor layer obtained later), which is caused by the irradiation with the cluster ions 410, can be prevented.

One surface side of the semiconductor wafer 402 is irradiated with the cluster ions 110, specifically $H_3^+$ ions, by an ion doping apparatus so that the separation layer 112 is formed. By using $H_3^+$ ions for the irradiation of the semiconductor wafer, implantation efficiency of hydrogen is improved as compared to the case of irradiation with $H^+$ ions. Accordingly, takt time to form the separation layer 412 is shortened and throughput can be improved. Specific description on the formation of the separation layer 412 conforms to the description on the formation of the separation layer 112 described in Embodiment Mode 1, and thus is omitted in this embodiment mode. After the formation of the separation layer 412, the third insulating layer 404 which functions as a protective layer may be removed or not.

One surface side of the semiconductor wafer 402 and one surface side of the substrate having the insulating surface 420 are overlapped and attached to each other (see (step 721) in FIG. 7). In this embodiment mode, they are attached to each other by using the third insulating layer 404 formed over the semiconductor wafer 402 and the second insulating layer 424 formed over the substrate having the insulating surface 420 as bonding planes. The bonding planes are cleaned sufficiently before the bonding is performed. Then, the third insulating layer 404 formed over the one surface of the semiconductor wafer 402 and the second insulating layer 424 formed over the substrate having the insulating surface 420 are brought in close contact with each other to form a bond. It is thought that, like in Embodiment Mode 1, Van der Waals force acts on the bonding at an early stage, and then a strong bonding is formed, which is contributed by a hydrogen-bond formation induced by pressing the semiconductor wafer 402 provided with the third insulating layer 404 and the substrate having the insulating surface 420 provided with the second insulating layer 424 to each other.

Note that, one or both of the third insulating layer 404 and the second insulating layer 424 which are the bonding planes may be activated by irradiation with an atom beam or an ion beam or performing plasma irradiation or radical treatment. Such surface treatment facilitates formation of a bond between different materials even at a temperature of 400° C. or less. Further, one or both of the bonding planes may be cleaned with ozone-containing water, oxygen-containing water, hydrogen-containing water, pure water, or the like. Such cleaning treatment can make the one or both of the bonding planes hydrophilic so that the number of OH groups on the one or both of the bonding planes can be increased. As a result, the bonding strength contributed by a hydrogen bond can be further increased.

Further, it is preferable that thermal treatment or pressure treatment be performed after the semiconductor wafer 402 and the substrate having the insulating surface 420 are attached to each other in order to increase the bonding strength. In the case where the thermal treatment is performed, the temperature of the thermal treatment is set considering the upper temperature limit of the substrate having the insulating surface 420 and set at a temperature which does not cause change in volume of the separation layer 412.

Next, thermal treatment is performed so that the semiconductor wafer 402 is partially separated from the substrate having the insulating surface 420, by using the separation layer 412 as a separation plane (see (step 731) in FIG. 7). A semiconductor layer 430 separated from the semiconductor wafer 402 remains over the substrate having the insulating surface 420, thereby forming an SOI substrate (see (step 732) in FIG. 7). In addition, a separation wafer 440 can be obtained after the semiconductor layer 430 is separated (see (step 733) in FIG. 7).

Specific description on the partial separation of the semiconductor wafer 402 conforms to the description on the separation of the semiconductor wafer 102 by using the separation layer 112 as a separation plane described in Embodiment Mode 1, and thus, it is omitted in this embodiment mode. Note that, it is preferable that the thermal treatment be performed at a temperature which is equal to or more than the deposition temperature of the second insulating layer 424 formed over the substrate having the insulating surface 420 and equal to or less than the upper temperature limit of the substrate having the insulating surface 420. For example, by performing the thermal treatment at 400 to 600° C., the volume of the microvoid formed in the separation layer 412 is changed; thus, the semiconductor wafer 402 is separated along the separation layer 412. Since the semiconductor wafer 402 is attached to the substrate having the insulating surface 20 with the first insulating layer 422, the second insulating layer 424, and the third insulating layer 404 interposed therebetween, the semiconductor layer 430 having the same crystallinity as the semiconductor wafer 402 remains over the insulating-surface substrate 420. Through the above-described process, an SOI substrate in which the semiconductor layer 430 is bonded to the substrate having the insulating surface 420 with the insulating layers interposed therebetween is manufactured. Note that, it is preferable that a treatment of recovery of crystal defects or planarization be performed on the SOI substrate. Specific treatment of recovery conforms to that shown in FIGS. 4A to 4C described in Embodiment Mode 1.

The semiconductor layer 430 is separated from the semiconductor wafer 402, and a separation wafer 440 which is the semiconductor wafer 402 is obtained. Then, treatment for reusing is performed on the separation wafer 440, and the separation wafer 440 is reused as a semiconductor wafer which is a bond substrate (see (step 741) in FIG. 7). As the treatment for reusing of the separation wafer 440, a polishing method such as a CMP method or a polishing method utilizing a liquid jet is preferably performed.

Then, the separation wafer 440 after being subjected to the treatment for reusing is reused as the semiconductor wafer 402 which is a bond substrate, and the process from (step 711) to (step 731) shown in FIG. 7 is performed again, so that an SOI substrate is manufactured (step 732) and a separation wafer can be obtained with the manufacturing of the SOI substrate (step 733).

Through the above processes, n pieces of SOI substrates and n pieces of separation wafers can be obtained at the most using one raw-material wafer which is a semiconductor wafer. In this case, (n−1) pieces out of the n pieces of separation wafers can be reused at the most. Accordingly, a semiconductor wafer which is a raw material can be effectively used and cost reduction in manufacturing an SOI substrate can be achieved. Further, by using cluster ions, specifically, $H_3^+$ ions for the formation of the separation layer, which might be a rate-controlling factor, implantation efficiency of hydrogen can be improved so that takt time can be shortened. As a result, productivity or throughput can be improved.

The case where a thermal oxidation method is not applied for forming any insulating layer, as described in this embodiment mode, can maintain the quality of the separation wafer and provide semiconductor wafers with a specific level of quality. Thus, SOI substrates can be manufactured with high yield even when the separation wafer is reused.

Note that the separation wafer is not necessarily reused as a bond substrate but can be used for other applications. Further, respective manufacturing methods of the SOI substrates are not necessarily the same as each other.

This embodiment mode can be combined with another embodiment mode as appropriate.

Embodiment Mode 5

A different example of the manufacturing method of an SOI substrate from the above-described embodiment modes will be described using FIG. 19 in this embodiment mode.

Figure 19:
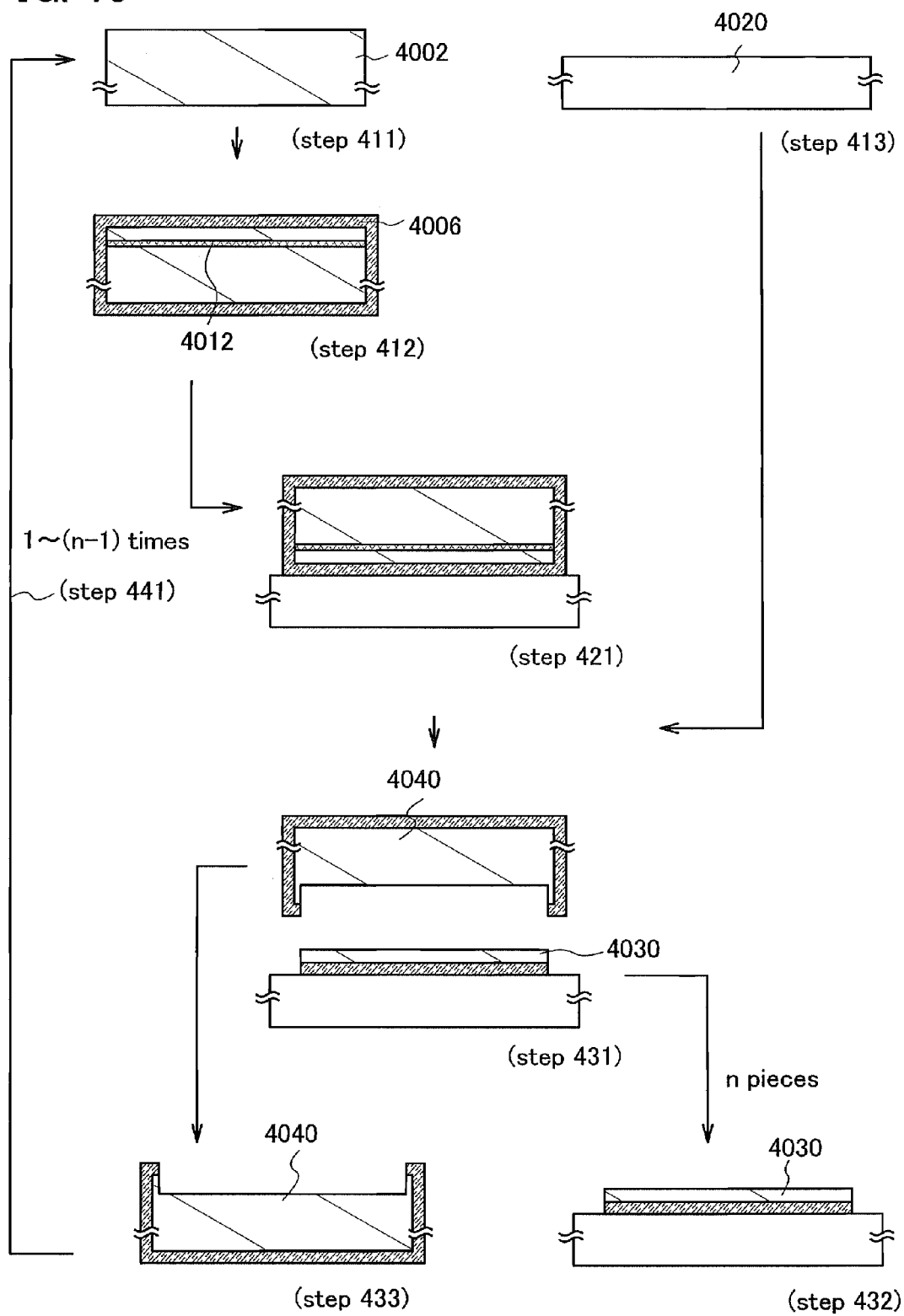
FIG. 19 is a flow diagram showing an example of a manufacturing method of an SOI substrate.

A semiconductor wafer 4002 and a substrate having an insulating surface 4020 are prepared as a bond substrate and a base substrate, respectively (see (step 411) and (step 412) in FIG. 19).

The semiconductor wafer 4002 conforms to the semiconductor wafer 102 described in Embodiment Mode 1, and a silicon wafer is used as the semiconductor wafer 4002 in this embodiment mode. The substrate having the insulating surface 4020 conforms to the substrate having the insulating surface 120 described in Embodiment Mode 1, and a glass substrate is used as the substrate having the insulating surface 4020 in this embodiment mode.

An oxide layer 4006 is formed by a thermal oxidation method on the surface of the semiconductor wafer 4002. A separation layer 4012 is formed at a given depth from one surface of the semiconductor wafer 4002 (see (step 412) in FIG. 19).

Thermal oxidation method used in this embodiment mode is performed on the semiconductor wafer 4002 in an oxidizing atmosphere in which halogen typified by chlorine (Cl) is added, so that the oxide layer 4006 is formed. A thin film containing a halogen atom is formed as the oxide layer 4006. Preferably, thermal oxidation treatment is performed on the semiconductor wafer 4002 in an oxidative atmosphere containing hydrogen chlorine so that the oxide layer 4006 containing a chlorine atom is formed.

For example, thermal oxidation treatment is performed on the semiconductor wafer 4002 in an oxidizing atmosphere in which chlorine is added so that the oxide layer 4006 is formed through chlorine oxidation. The oxide layer 4006 contains chlorine. A chlorine atom contained in the oxide layer 4006 forms a distortion in the oxide layer 4006. As a result of the formation of the distortion, moisture on the surface of the oxide layer 4006 can be rapidly absorbed and diffused into the oxide layer 4006.

As described above, the thermal oxidation treatment of the semiconductor wafer under the oxidizing atmosphere is high-temperature process and might cause sliding dislocation. However, even in the case where thermal oxidation treatment is employed, by performing the thermal oxidation treatment on the semiconductor wafer 4002 in an oxidizing atmosphere in which halogen (typically, chlorine) is added, the process temperature can be decreased and generation of sliding dislocation can be suppressed. This is because, in contrast to the general thermal oxidation treatment in which decrease in process temperature to suppress the generation of sliding dislocation results in impracticable takt time due to the considerable decrease in the rate of oxidative growth and increase in the oxidation time, the presence of halogen in the oxidizing atmosphere during the thermal oxidation treatment allows the rate of oxidative growth to be kept even if the process temperature is decreased to a low temperature. That is, by the thermal oxidation treatment in the oxidizing atmosphere in which halogen is added, the quality of a wafer which is repeatedly reused can be maintained without decreasing productivity.

As an example of the above-described thermal oxidation treatment, oxidation treatment may be performed in the oxidizing atmosphere in which trans-1,2-dichloroethylene (DCE) is contained at 0.25 to 5 vol. % (preferably 3 vol. %) with respect to oxygen at 700 to 500° C., preferably, 800 to 1050° C. Treatment time may be 0.1 to 6 hours, preferably, 0.5 to 3 hours. The thickness of the oxide layer 4006 to be formed is 10 to 1000 nm (preferably, 50 nm to 300 nm), and for example, the thickness is 100 nm. Since the decomposition temperature of trans-1,2-dichloroethylene is low, the thermal oxidation treatment can be performed at a low temperature. Therefore, the temperature of the thermal oxidation treatment can be decreased so that generation of sliding dislocation can be suppressed; therefore, when a separation wafer separated from a semiconductor wafer is repeatedly reused, the quality of a semiconductor wafer obtained through the treatment for reusing of the separation wafer can be maintained. Note that, as well as trans-1,2-dichloroethylene, cis-1,2-dichloroethylene, 1,1-dichloroethylene, or a mixed gas of at least two kinds of the gases may be added into the oxidizing atmosphere for the thermal oxidation treatment.

As another example of the above-described thermal oxidation treatment, HCl oxidation (hydrochloric-acid oxidation) performed in an oxidizing atmosphere in which hydrogen chlorine (HCl) is contained at 0.5 to 10 vol. % (preferably 2 vol. %) with respect to oxygen at 700 to 1150° C., preferably, 800 to 1050° C. can be given. Treatment time may be 0.1 to 6 hours, preferably, 0.5 to 3 hours. The thickness of the oxide layer 4006 to be formed is 10 nm to 1000 nm (preferably, 50 nm to 300 nm), and for example, the thickness is 100 nm.

In this embodiment mode, the atmosphere is controlled such that the chlorine atom concentration included in the oxide layer 4006 is $1 \times 10^{17}$ to $1 \times 10^{21}$ atoms/cm$^3$, thereby the thermal oxidation treatment is performed.

Further, by allowing a halogen atom to be contained, (typically, chlorine atom) in the oxide layer 4006 like this embodiment mode, heavy metals that are exogenous impurities (e.g., iron, chromium, nickel, or molybdenum) are trapped to prevent contamination of the semiconductor wafer 4002.

The formation of the oxide layer 4006 containing halogen atoms such as chlorine atoms by the thermal oxidation treatment in the oxidizing atmosphere in the presence of halogen such as HCl oxidation enables gettering of impurities which adversely affect the semiconductor wafer 4002 (e.g., metal impurities with high mobility such as sodium). This is because, by thermal treatment after the formation of the oxide layer 4006, the impurities included in the semiconductor wafer 4002 are separated out in the oxide layer 4006 and reacted with halogen (e.g., chlorine) to be trapped. By trapping the impurities in the oxide layer 4006 in this manner, contamination of the semiconductor wafer 4002 can be suppressed. Further, the oxide layer 4006 can also function as a film for neutralizing impurities such as Na contained in a glass substrate when the glass substrate is attached as the substrate having the insulating surface 4020.

The formation of the oxide layer 4006 containing halogen atoms as described above is effective in removing contamination in the case of reusing a semiconductor wafer which is not cleaned sufficiently or a separation wafer as a semiconductor wafer.

Note that, inclusion of hydrogen in the gas for the thermal oxidation treatment has an effect of compensating a defect at the interface between the semiconductor wafer 4002 and the oxide layer 4006 to decrease the localized state density of the interface. Therefore, it is preferable that the oxide layer 4006 contain hydrogen atoms at least $1\times10^{18}$ atoms/cm$^3$.

Note that the halogen atoms contained in the oxide layer 4006 are not limited to the chlorine atoms. Alternatively, the oxide layer 4006 containing fluorine atoms as halogen may be formed. For example, in order to perform fluorine oxidation on the surface of the semiconductor wafer 4002, the following may be performed: the semiconductor wafer 4002 is immersed in an HF solution and after that, thermal oxidation treatment is performed in an oxidizing atmosphere; or thermal oxidation treatment is performed in an oxidizing atmosphere in which NF$_3$ is added.

The separation layer 4012 is formed in the semiconductor wafer 4002. The formation method of the separation layer 4012 conforms to the description on the separation layer 112 described in Embodiment Mode 1. Note that, by using H$_3^+$ ions as cluster ions, implantation efficiency of elements (typically, hydrogen) included in the cluster ions can be improved and takt time to form the separation layer 4012 can be shortened. In this embodiment, because the oxide layer 4006 is formed by the thermal oxidation method, the separation layer 4012 is formed after the formation of the oxide layer 4006. Therefore, the elements included in the cluster ions are implanted into the semiconductor wafer 4002 through the oxide layer 4006.

One surface side of the semiconductor wafer 4002 and one surface side of the substrate having the insulating surface 4020 are overlapped and attached to each other (see (step 421) in FIG. 19). In this embodiment mode, they are attached to each other by using the oxide layer 4006 provided for the semiconductor wafer 4002 and the substrate having the insulating surface 4020 as bonding planes. The specific bonding method conforms to that in Embodiment Mode 1.

Next, thermal treatment is performed so that the semiconductor wafer 4002 is partially separated from the substrate having the insulating surface 4020, by using the separation layer 4012 as a separation plane (see (step 431) in FIG. 19). A semiconductor layer 4030 separated from the semiconductor wafer 4002 remains over the insulating-surface substrate 4020, thereby forming an SOI substrate (see (step 432) in FIG. 19). In addition, a separation wafer 4040 can be obtained after the semiconductor layer 4030 is separated (see (step 433) in FIG. 19).

Specific description on the partial separation of the semiconductor wafer 4002 conforms to the description on the separation of the semiconductor wafer 102 by using the separation layer 112 as a separation plane described in Embodiment Mode 1. A treatment of recovery of crystal defects or planarization of the semiconductor layer 4030, as described in the above-described embodiment mode, can be performed on the SOI substrate.

Then, treatment for reusing is performed on the separation wafer 4040 obtained through the separation of the semiconductor layer 4030 from the semiconductor wafer 4002, and the separation wafer 4040 can be reused as a semiconductor wafer which is a bond substrate (see (step 441) in FIG. 19).

In the case where the oxide layer 4006 is formed on the surface of the semiconductor wafer 4002 by a thermal oxidation method, like this embodiment mode, the oxide layer 4006 or the like tends to remain at an end portion of the separation wafer 4040 and the end portion of the separation wafer 4040 tends to be convex. Therefore, in the treatment for reusing the separation wafer 4040, etching treatment capable of removing the oxide layer 4006 or the like is preferably combined.

Then, the separation wafer 4040 after being subjected to the treatment for reusing is reused as the semiconductor wafer 4002 which is a bond substrate, and the process from (step 411) to (step 431) shown in FIG. 19 is performed again, so that an SOI substrate is manufactured (step 432) and a separation wafer can be obtained with the manufacturing of the SOI substrate (step 433).

Through the above process, n pieces of SOI substrates and n pieces of separation wafers can be obtained at the most using one raw-material wafer which is a semiconductor wafer. In this case, (n−1) pieces out of the n pieces of separation wafers can be reused at the most each as a bond substrate. Accordingly, a semiconductor wafer which is a raw material can be effectively used.

Further, by performing the thermal oxidation treatment in the oxidizing atmosphere in which halogen is added, the process temperature can be decreased, generation of sliding dislocation in the reusing of a wafer is suppressed, and contamination of a semiconductor wafer can be suppressed. In addition, by the thermal oxidation treatment, a dense bonding layer with high film quality can be formed and characteristics at the interface can be improved.

Note that the separation wafer is not necessarily reused as a bond substrate but can be used for other applications. Further, respective manufacturing methods of the SOI substrates are not necessarily the same as each other.

Although the example in which the oxide layer 4006 which is formed on the surface of the semiconductor wafer 4002 by the thermal oxidation treatment in the oxidizing atmosphere in which halogen is added is attached to the substrate having the insulating surface 4020 is described in this embodiment mode, the present invention is not particularly limited thereto.

For example, an insulating layer may be formed over the substrate having the insulating surface 4020, and the insulating layer formed over the substrate having the insulating surface 4020 and the oxide layer 4006 provided for the semiconductor wafer 4002 may be attached to each other by using them as bonding layers.

This embodiment mode can be combined with another embodiment mode as appropriate.

Embodiment Mode 6

A different example of the manufacturing method of an SOI substrate from the above-described embodiment modes will be described using FIG. 20 in this embodiment mode.

Figure 20:
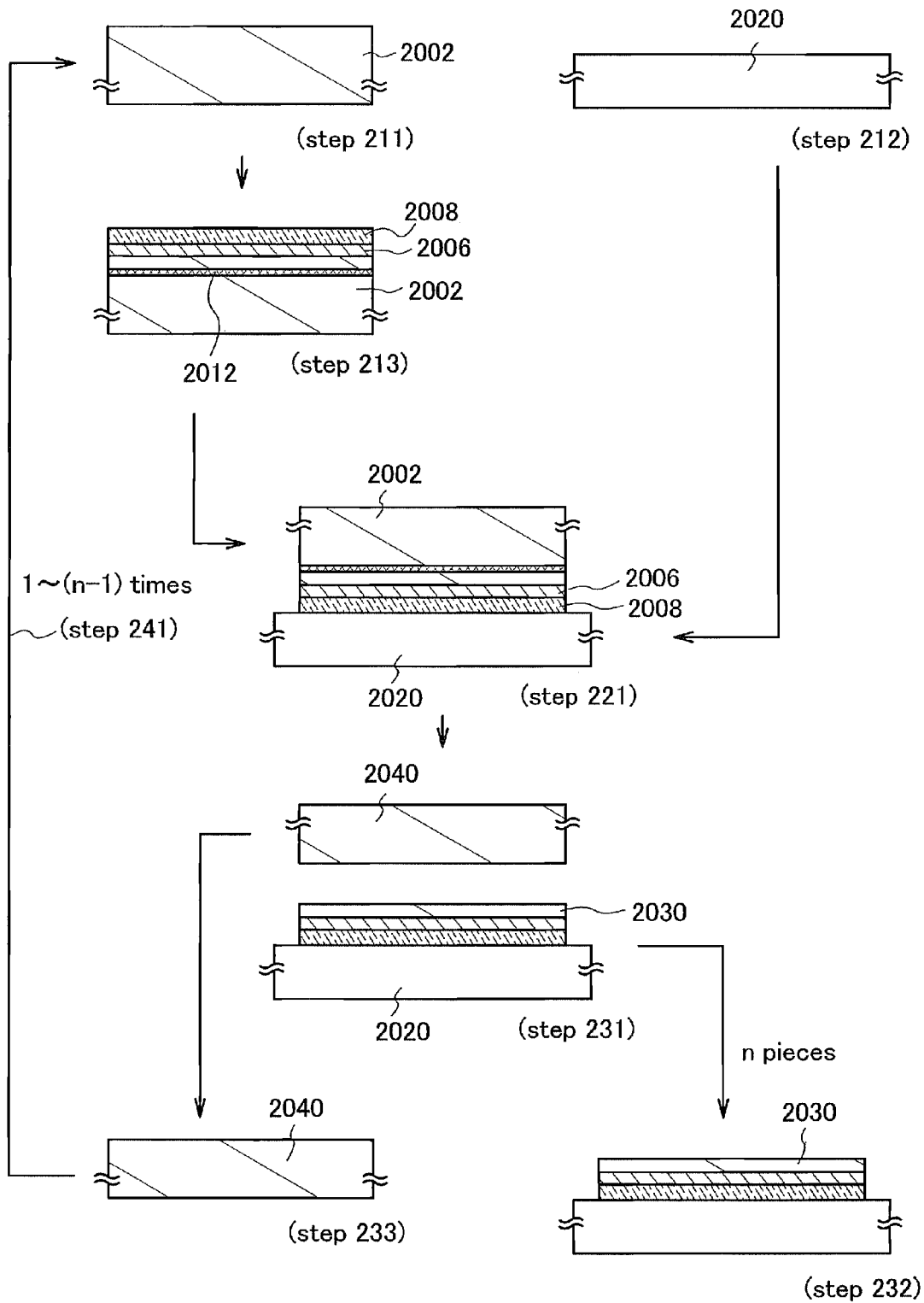
FIG. 20 is a flow diagram showing an example of a manufacturing method of an SOI substrate.

A semiconductor wafer 2002 and a substrate having an insulating surface 2020 are prepared as a bond substrate and a base substrate, respectively (see (step 211) and (step 212) in FIG. 20).

The semiconductor wafer 2002 conforms to the semiconductor wafer 102 described in Embodiment Mode 1. Similarly, the substrate having the insulating surface 2020 conforms to the substrate having the insulating surface 120. In this embodiment mode, a silicon wafer is used as the semiconductor wafer 2002, and a glass substrate is used as the substrate having the insulating surface 2020.

A first insulating layer 2006 and a second insulating layer 2008 containing nitrogen are stacked over the semiconductor wafer 2002. In addition, a separation layer 2012 is formed at a given depth from one surface of the semiconductor wafer 2002 (see (step 213) in FIG. 20).

As the first insulating layer 2006, a silicon oxide layer or a silicon oxynitride layer is formed by a CVD method, a sputtering method, or an ALE method. Alternatively, as described in Embodiment Mode 5, the first insulating layer 2006 may be formed by performing thermal oxidation treatment in an oxidizing atmosphere in which halogen is added.

As the second insulating layer 2008 containing nitrogen, a silicon nitride layer or a silicon nitride oxide layer is formed. In this embodiment mode, the second insulating layer 2008 containing nitrogen corresponds to a bonding plane and a bonding surface at the time of attaching to the substrate having the insulating surface 2020. Further, the second insulating layer 2008 containing nitrogen can also have an effect of blocking diffusion of metal impurities with high mobility, such as sodium, into a semiconductor layer when a glass substrate is attached as the substrate having the insulating surface 2020 thereto.

Note that, because the second insulating layer 2008 containing nitrogen is formed as a bonding layer, an insulating layer having high surface planarity is formed as the second insulating layer 2008 containing nitrogen. In addition, because hydrogen bonding significantly contributes to the bonding to the substrate having the insulating surface 2020, it is preferable that the second insulating layer 2008 containing nitrogen be formed to contain hydrogen.

For example, as the second insulating layer 2008 containing nitrogen, a silicon nitride layer or a silicon nitride oxide layer formed by a plasma CVD method can be employed. At this time, it is preferable that deposition be performed using silane gas, ammonia gas, or hydrogen gas as a source gas. By using ammonia gas or hydrogen gas, the second insulating layer 2008 containing nitrogen in which hydrogen is contained can be formed. By allowing hydrogen to be contained in the layer, the bonding can be formed more strongly at the time of attaching to the substrate having the insulating surface 2020.

The separation layer 2012 is formed in the semiconductor wafer 2002. The formation method of the separation layer 2012 conforms to the description on the separation layer 112 described in Embodiment Mode 1. Note that, by using $H_3^+$ ions as cluster ions, implantation efficiency of elements (typically, hydrogen) included in the cluster ions can be improved and takt time to form the separation layer 2012 can be shortened. There are no particular limitations on the formation order of the separation layer 2012, and the following orders can be given as examples: the order in which the first insulating layer 2006 is formed, the separation layer 2012 is formed in the semiconductor wafer 2002, and then, the second insulating layer 2008 containing nitrogen is formed; the order in which the first insulating layer 2006 is formed, the second insulating layer 2008 containing nitrogen is formed, and then, the separation layer 2012 is formed in the semiconductor wafer 2002; and the order in which the separation layer 2012 is formed in the semiconductor wafer 2002, and then, the first insulating layer 2006 and the second insulating layer 2008 containing nitrogen are stacked.

One surface side of the semiconductor wafer 2002 and one surface side of the substrate having the insulating surface 2020 are overlapped and attached to each other (see (step 221) in FIG. 20). In this embodiment mode, they are attached to each other by using the second insulating layer 2008 containing nitrogen provided for the semiconductor wafer 2002 and the substrate having the insulating surface 2020 as bonding planes. The specific bonding method conforms to that in Embodiment Mode 1.

Next, thermal treatment is performed so that the semiconductor wafer 2002 is separated from the substrate having the insulating surface 2020, by using the separation layer 2012 as a separation plane (see (step 231) in FIG. 20). A semiconductor layer 2030 separated from the semiconductor wafer 2002 remains over the substrate having the insulating surface 2020, thereby forming an SOI substrate (see (step 232) in FIG. 20). In addition, a separation wafer 2040 can be obtained after the semiconductor layer 2030 is separated (see (step 233) in FIG. 20).

Specific description on the partial separation of the semiconductor wafer 2002 conforms to the description on the separation of the semiconductor wafer 102 by using the separation layer 112 as a separation plane described in Embodiment Mode 1. A treatment of recovery of crystal defects or planarization of the semiconductor layer 2030, as described in the above-described embodiment mode, can be performed on the SOI substrate.

Then, treatment for reusing is performed on the separation wafer 2040 obtained through the separation of the semiconductor layer 2030 from the semiconductor wafer 2002, and the separation wafer 2040 can be reused as a semiconductor wafer which is a bond substrate (see (step 241) in FIG. 20). Then, the separation wafer 2040 after being subjected to the treatment for reusing is reused as the semiconductor wafer 2002 which is a bond substrate, and the process from (step 211) to (step 231) shown in FIG. 20 is performed again, so that an SOI substrate is manufactured (step 232) and a separation wafer can be obtained with the manufacturing of the SOI substrate (step 233).

Through the above, n pieces of SOI substrates and n pieces of separation wafers can be obtained at the most using one raw-material wafer which is a semiconductor wafer. In this case, (n−1) pieces out of the n pieces of separation wafers can be reused at the most each as a bond substrate. Accordingly, a semiconductor wafer which is a raw material can be effectively used.

By forming the insulating layer containing nitrogen as a bonding layer, metal impurities contained in the substrate having the insulating surface can be prevented from being diffused into the semiconductor layer. Further, as compared to the case where a silicon oxide layer or a silicon nitride layer is formed as a bonding layer and an insulating layer containing nitrogen is further formed, the number of layers stacked can be reduced and the process can be simplified.

Note that the separation wafer is not necessarily reused as a bond substrate but can be used for other applications. Further, respective manufacturing methods of the SOI substrates are not necessarily the same as each other.

Although the example in which the insulating layer containing nitrogen provided for the semiconductor wafer 2002 is attached to the substrate having the insulating surface by using them as bonding planes is described in this embodiment mode, the present invention is not particularly limited thereto.

For example, an insulating layer may be formed over the substrate having the insulating surface 2020, and the insulating layer formed over the substrate having the insulating surface 2020 and the second insulating layer 2008 containing nitrogen provided for the semiconductor wafer 2002 may be attached to each other by using them as bonding layers.

Alternatively, only the separation layer 2012 may be formed on the semiconductor wafer 2002 side and an insulating layer having the same quality as the first insulating layer 2006 and an insulating layer containing nitrogen, having the same quality as the second insulating layer 2008 containing nitrogen, may be formed on the substrate having the insulating surface 2020 side, and the semiconductor wafer 2002 may be attached to the insulating layer containing nitrogen formed on the substrate having the insulating surface 2020 side.

Further alternatively, the first insulating layer 2006 and the separation layer 2012 may be formed on the semiconductor wafer 2002 side and an insulating layer containing nitrogen, having the same quality as the second insulating layer 2008 containing nitrogen, may be formed on the substrate having the insulating surface 2020 side, and the first insulating layer 2006 formed on the semiconductor wafer 2002 side may be attached to the insulating layer containing nitrogen formed on the substrate having the insulating surface 2020 side.

Also in the case of the above-described manufacturing method, the insulating layer containing nitrogen which is formed as a bonding layer can have an effect of blocking metal impurities and simplify the process.

This embodiment mode can be combined with another embodiment mode as appropriate.

Embodiment Mode 7

A different example of the manufacturing method of an SOI substrate from the above-described embodiment modes will be described using FIG. 21 in this embodiment mode.

Figure 21:
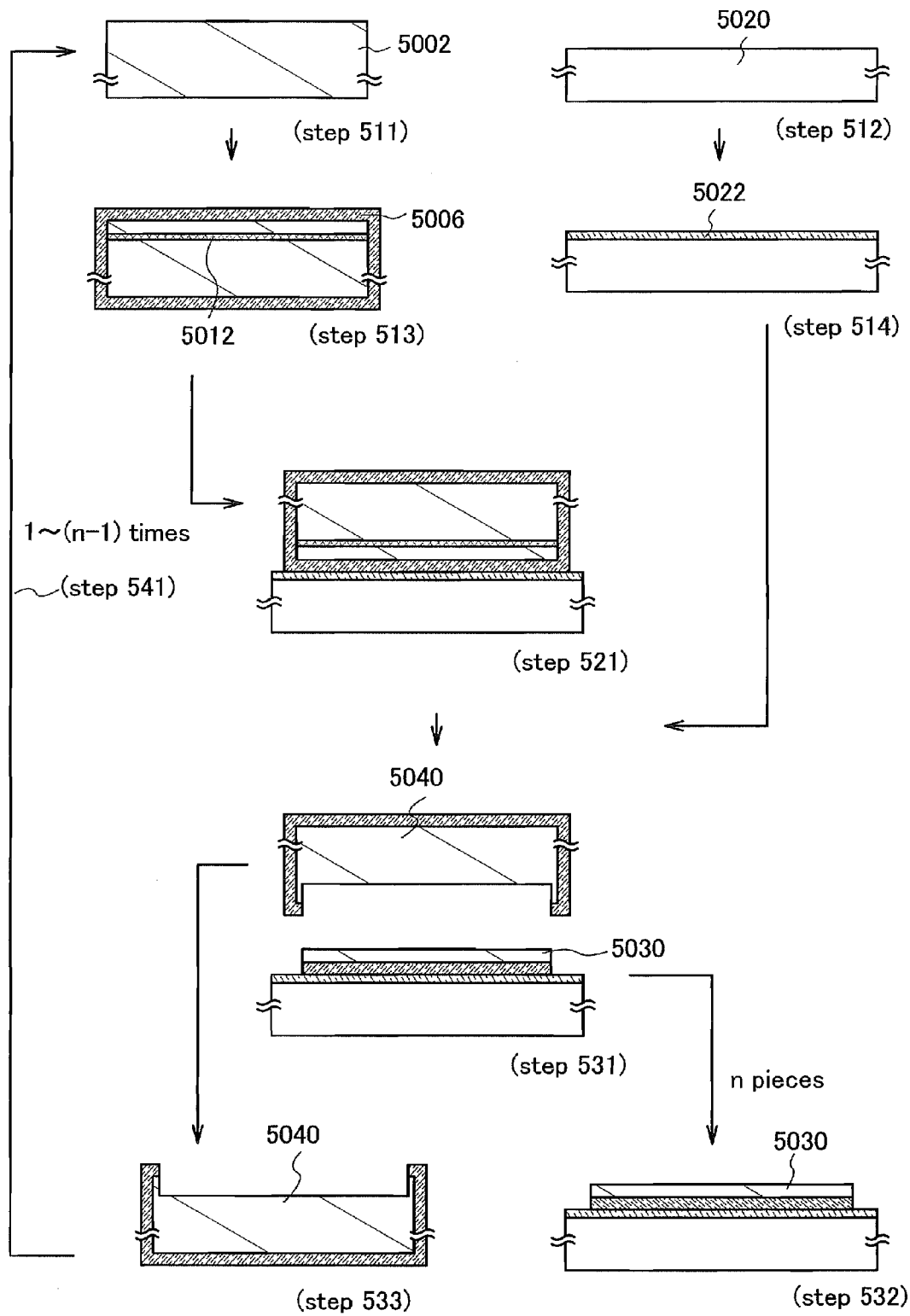
FIG. 21 is a flow diagram showing an example of a manufacturing method of an SOI substrate.

A semiconductor wafer 5002 and a substrate having an insulating surface 5020 are prepared as a bond substrate and a base substrate, respectively (see (step 511) and (step 512) in FIG. 21).

An oxide layer 5006 is formed on the surface of the semiconductor wafer 5002 by a thermal oxidation method. In addition, a separation layer 5012 is formed at a given depth from one surface of the semiconductor wafer 5002 (see (step 513) in FIG. 21).

The specific structure and manufacturing method of (step 511) to (step 513) in FIG. 21 conform to those of (step 411) to (step 413) in FIG. 19 described in Embodiment Mode 5.

An insulating layer 5022 containing nitrogen is formed over the substrate having the insulating surface 5020 (see (step 514) in FIG. 21).

The insulating layer 5022 containing nitrogen conforms to the second insulating layer 2008 containing nitrogen described in Embodiment Mode 6; preferably, a silicon nitride layer or a silicon nitride oxide layer is formed by a plasma CVD method.

One surface side of the semiconductor wafer 5002 and one surface side of the substrate having the insulating surface 5020 are overlapped and attached to each other (see (step 521) in FIG. 21). In this embodiment mode, they are attached to each other by using the oxide layer 5006 formed on the surface of the semiconductor wafer 5002 and the insulating layer 5022 containing nitrogen formed over the substrate having the insulating surface 5020 as bonding layers. The specific bonding method conforms to that in Embodiment Mode 1.

Next, thermal treatment is performed so that the semiconductor wafer 5002 is separated from the substrate having the insulating surface 5020, by using the separation layer 5012 as a separation plane (see (step 531) in FIG. 21). A semiconductor layer 5030 separated from the semiconductor wafer 5002 remains over the substrate having the insulating surface 5020, thereby forming an SOI substrate (see (step 532) in FIG. 21). In addition, a separation wafer 5040 can be obtained after the semiconductor layer 5030 is separated (see (step 533) in FIG. 21).

Specific description on the partial separation of the semiconductor wafer 5002 conforms to the description on the separation of the semiconductor wafer 102 by using the separation layer 112 as a separation plane described in Embodiment Mode 1. A treatment of recovery of crystal defects or planarization of the semiconductor layer 5030, as described in the above-described embodiment mode, can be performed on the SOI substrate.

Then, treatment for reusing is performed on the separation wafer 5040 obtained through the separation of the semiconductor layer 5030 from the semiconductor wafer 5002, and the separation wafer 5040 can be reused as a semiconductor wafer which is a bond substrate (see (step 541) in FIG. 21). Then, the separation wafer 5040 after being subjected to the treatment for reusing is reused as the semiconductor wafer 5002 which is a bond substrate, and the process from (step 511) to (step 531) shown in FIG. 21 is performed again, so that an SOI substrate is manufactured (step 532) and a separation wafer can be obtained with the manufacturing of the SOI substrate (step 533).

Through the above, n pieces of SOI substrates and n pieces of separation wafers can be obtained at the most using one raw-material wafer which is a semiconductor wafer. In this case, (n−1) pieces out of the n pieces of separation wafers can be reused at the most each as a bond substrate. Accordingly, a semiconductor wafer which is a raw material can be effectively used.

Further, by performing the thermal oxidation treatment in an oxidizing atmosphere in which halogen is added, the process temperature can be decreased, generation of sliding dislocation in reusing of a wafer can be suppressed, and contamination of a semiconductor wafer can be suppressed. By forming the insulating layer containing nitrogen as a bonding layer, metal impurities contained in the substrate having the insulating surface can be prevented from being diffused into a semiconductor layer.

Note that the separation wafer is not necessarily reused as a bond substrate but can be used for other applications. Further, respective manufacturing methods of the SOI substrates are not necessarily the same as each other.

This embodiment mode can be combined with another embodiment mode as appropriate.

Embodiment Mode 8

A different example of the manufacturing method of an SOI substrate from the above-described embodiment modes will be described using FIG. 22 in this embodiment mode.

Figure 22:
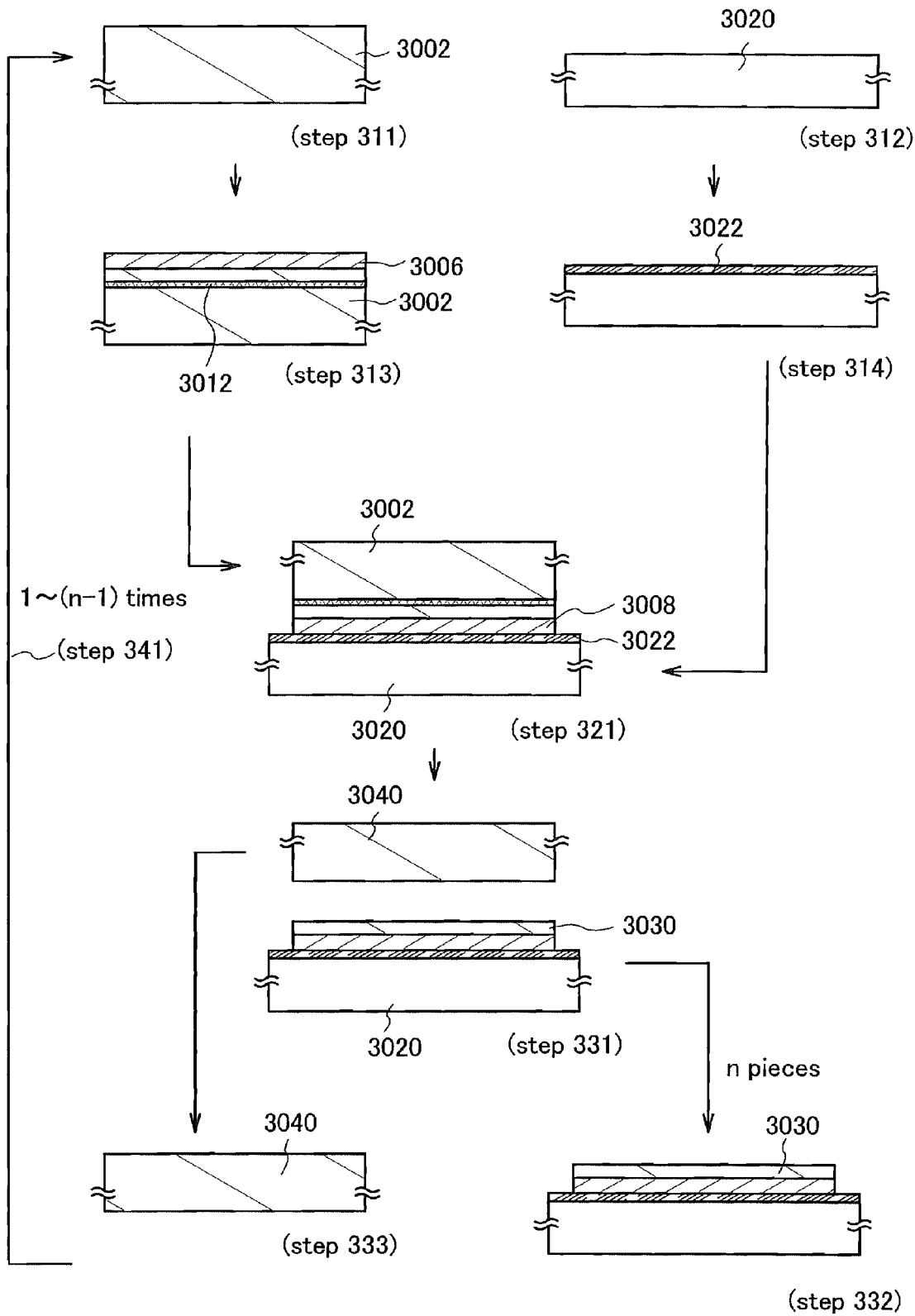
FIG. 22 is a flow diagram showing an example of a manufacturing method of an SOI substrate.

A semiconductor wafer 3002 and a substrate having an insulating surface 3020 are prepared as a bond substrate and a base substrate, respectively (see (step 311) and (step 312) in FIG. 22).

The semiconductor wafer 3002 conforms to the semiconductor wafer 102 described in Embodiment Mode 1, and a silicon wafer is used as the semiconductor wafer 3002 in this embodiment mode.

A first insulating layer 3006 is formed over the semiconductor wafer 3002. A separation layer 3012 is formed at a given depth from one surface of the semiconductor wafer 3002 (see (step 313) in FIG. 22).

As the first insulating layer 3006, a single layer structure or a stacked-layer structure of a silicon oxide layer, a silicon oxynitride layer, a silicon nitride layer, and/or a silicon nitride oxide layer is formed by a CVD method, a sputtering method, or an ALE method. Alternatively, as described in Embodiment Mode 5, the first insulating layer 3006 may be formed by performing thermal oxidation treatment in an oxidizing atmosphere in which halogen is added.

The separation layer 3012 is formed in the semiconductor wafer 3002. The formation method of the separation layer 3012 conforms to the description on the separation layer 112 described in Embodiment Mode 1. Note that, by using $H_3^+$ ions as cluster ions, implantation efficiency of elements (typically, hydrogen) included in the cluster ions can be improved and takt time to form the separation layer 3012 can be shortened. There are no particular limitations on the formation order of the separation layer 3012, and the following orders can be given as examples: the order in which the first insulating layer 3006 is formed, and then, the separation layer 3012 is formed; and the order in which the separation layer 3012 is formed, and then, the first insulating layer 3006 is formed.

Planarization treatment by plasma treatment is performed on the surface of the substrate having the insulating surface 3020, and then, a second insulating layer 3022 other than a silicon-system insulating layer is formed over the substrate having the insulating surface 3020 (see (step 314) in FIG. 22).

As an example of the plasma treatment, plasma treatment in which an inactive gas (e.g., Ar gas) and/or a reactive gas (e.g., $O_2$ gas or $N_2$ gas) are/is introduced into a chamber in a vacuum and plasma is formed by applying bias voltage to the plane to be processed (the substrate having the insulating surface 3020 in this embodiment mode). Electrons and positive ions of Ar exist in the plasma, and the positive ions of Ar are accelerated toward a cathode direction (the substrate having the insulating surface 3020 side). The accelerated positive ions of Ar collide with the surface of the substrate having the insulating surface 3020 so that sputter etching is performed on the surface of the substrate having the insulating surface 3020. At this time, the sputter etching is performed preferentially on a convex portion on the surface of the substrate having the insulating surface 3020 so that the surface planarity of the substrate having the insulating surface 3020 can be improved. In the case where a reactive gas is introduced, a defect generated due to the sputter etching performed on the surface of the substrate having the insulating surface 3020 can be repaired.

By performing the planarization treatment by the plasma treatment, the average roughness (difference in height) in the surface of the substrate having the insulating surface 3020 can be decreased. By such planarization treatment, planarization treatment can be performed on the substrate having the insulating surface 3020, so that adhesion with the semiconductor wafer 3002 can be improved.

As the second insulating layer 3022, an oxide layer or a nitride layer containing at least one element of aluminum, magnesium, strontium, titanium, tantalum, zirconium, and yttrium can be used. For example, an oxide layer containing aluminum oxide as a main component is formed as the second insulating layer 3022 over the substrate having the insulating surface 3020. The oxide layer containing aluminum oxide as a main component refers to an oxide layer in which aluminum oxide is contained at least 10 wt. % where the total amount of all the components in the oxide layer is 100 wt. %. Alternatively, as the second insulating layer 3022, a film in which aluminum oxide is contained as a main component and at least one of magnesium oxide and strontium oxide is contained can be used. Further alternatively, aluminum oxide containing nitrogen may be used for the second insulating layer 3022.

The second insulating layer 3022 can be formed by a sputtering method. As a material of a target used in the sputtering method, for example, metal including aluminum or metal oxide such as aluminum oxide can be used. Alternatively, as the material of the target, as well as aluminum, the following can be used: magnesium; alloy containing aluminum and magnesium; alloy containing aluminum and strontium; or alloy containing aluminum, magnesium, and strontium. In the case where the metal oxide is used for the target, as well as aluminum oxide, the following can be used: magnesium oxide; strontium oxide; oxide containing aluminum and magnesium; oxide containing aluminum and strontium; or oxide containing aluminum, magnesium, and strontium. Note that the material of the target may be selected as appropriate in accordance with the second insulating layer 3022 to be formed.

It is preferable that the above-described planarization treatment and formation of the second insulating layer 3022 be performed consecutively without exposure to the air. By performing the process consecutively, throughput can be improved. Since the surface of the substrate having the insulating surface 3020 is activated after the planarization thereof by the plasma treatment, impurities such as organic materials are readily attached to the surface of the substrate having the insulating surface 3020. However, the attachment of impurities to the substrate having the insulating surface 3020 can be suppressed by the consecutive formation of the second insulating layer 3022.

The provision of the oxide layer containing aluminum oxide as a main component over the substrate having the insulating surface 3020 can prevent impurities such as mobile ions or moisture included in the substrate having the insulating surface 3020 from diffusing into a semiconductor layer provided later over the substrate having the insulating surface 3020.

One surface side of the semiconductor wafer 3002 and one surface side of the substrate having the insulating surface 3020 are overlapped and attached to each other (see (step 321) in FIG. 22). In this embodiment mode, they are attached to each other with the first insulating layer 3006 provided for the semiconductor wafer 3002 and the second insulating layer 3022 provided for the substrate having the insulating surface 3020 interposed therebetween. Therefore, the first insulating layer 3006 provided for the semiconductor wafer 3002 and the second insulating layer 3022 provided for the substrate having the insulating surface 3020 correspond to bonding layers which form bonding planes.

Next, thermal treatment is performed so that the semiconductor wafer 3002 is partially separated from the substrate having the insulating surface 3020, by using the separation layer 3012 as a separation plane (see (step 331) in FIG. 22). A semiconductor layer 3030 separated from the semiconductor wafer 3002 remains over the substrate having the insulating surface 3020, thereby forming an SOI substrate (see (step 332) in FIG. 22). In addition, a separation wafer 3040 can be obtained after the semiconductor layer 3030 is separated (see (step 333) in FIG. 22).

Specific description on the separation of the semiconductor wafer 3002 conforms to the description on the separation of the semiconductor wafer 102 by using the separation layer 112 as a separation plane described in Embodiment Mode 1.

Then, treatment for reusing is performed on the separation wafer 3040, and the separation wafer 3040 can be reused as the semiconductor wafer 3002 which is a bond substrate (see (step 341) in FIG. 22). Then, the separation wafer 3040 after being subjected to the treatment for reusing is reused as the semiconductor wafer 3002, and the process from (step 311) to (step 331) shown in FIG. 22 is performed again, so that an SOI substrate is manufactured (step 332) and a separation wafer can be obtained with the manufacturing of the SOI substrate (step 333). By repeating the process from (step 311) to (step 341), n pieces of SOI substrates and n pieces of separation wafers can be obtained at the most using one raw-material wafer. In this case, (n−1) pieces out of the n pieces of separation wafers can be reused at the most each as a bond substrate. Accordingly, a semiconductor wafer which is a raw material can be effectively used.

Further, as described above, the formation of the insulating layer other than a silicon-system insulating layer, typically, an aluminum oxide layer or the like, as the bonding layer which forms a bonding plane, after the plasma treatment on the insulating-surface substrate, can improve adhesion with the semiconductor layer. Accordingly, SOI substrates can be manufactured with high yield.

Note that the separation wafer is not necessarily reused as a bond substrate but can be used for other applications. Further, respective manufacturing methods of the SOI substrates are not necessarily the same as each other.

This embodiment mode can be combined with another embodiment mode as appropriate.

Embodiment Mode 9

In this embodiment mode, an example of manufacturing a semiconductor device using the SOI substrate described in any of the above embodiment modes will be described using FIGS. 8A to 8D and FIGS. 9A and 9B.

Figure 8A:
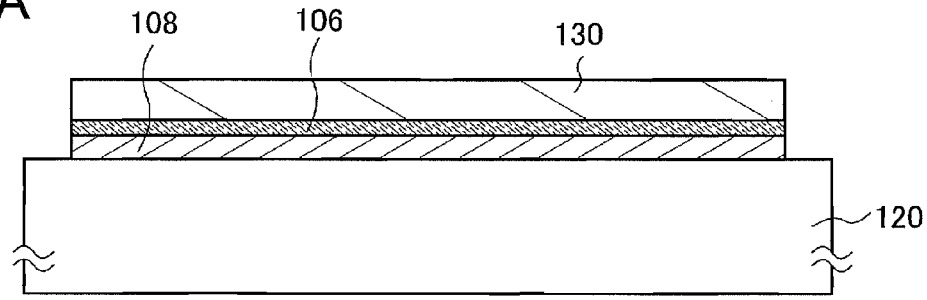
FIGS. 8A to 8D are diagrams showing an example of a manufacturing method of a semiconductor device.

An SOI substrate is prepared (see FIG. 8A). In this embodiment mode, the SOI substrate obtained in (step 32) in FIG. 1 is used for description. That is, the example of using the SOI substrate will be described in which the semiconductor layer 130 is bonded to the substrate having the insulating surface 120 with the second insulating layer 108 and the first insulating layer 106 which are stacked in order interposed therebetween. Note that there are no particular limitations on the structure of the SOI substrate used; the SOI substrate having any another structure described in this specification can be used. Note that the description on the SOI substrate used in FIG. 8A conforms to the above-described embodiment mode, and thus, will be explained roughly.

As the substrate having the insulating surface 120, a glass substrate, a quartz substrate, a crystallized glass substrate, a sapphire substrate, or the like is used.

The second insulating layer 108 may have either a single layer structure or a stacked-layer structure; however, a layer which has a smooth and hydrophilic surface is formed as a plane which is to be in contact with the substrate having the insulating surface 120 side, and for example, a silicon oxide layer or a layer having a siloxane bond is formed. The first insulating layer 106 may also have either a single layer structure or a stacked-layer structure; however, at least one layer of the first insulating layer 106 be formed of a silicon nitride layer or a silicon nitride oxide layer to function as a blocking layer. The thickness of the second insulating layer 108 and the first insulating layer 106 can be determined as appropriate. For example, a silicon oxide layer with a thickness of 50 nm is formed as the second insulating layer 108, and a silicon nitride oxide layer with a thickness of 50 nm and a silicon oxynitride layer with a thickness of 100 nm are formed as the first insulating layer 106. In this case, the silicon oxynitride layer in the first insulating layer 106 is provided on the semiconductor layer 130 side.

The thickness of the semiconductor layer 130 is 5 to 300 nm, preferably 10 to 200 nm, more preferably 10 to 60 nm. The thickness of the semiconductor film 130 can be controlled by the depth where the separation layer 112 is formed as described in any of the above-described embodiment modes. Note that, although the semiconductor layer 130 of the SOI substrate may be thinned by etching treatment, polishing treatment, or the like to a desired thickness, the semiconductor layer may be thinly prepared by forming the separation layer 112 at a small depth in the manufacture process of the SOI substrate. Even in the case where the separation layer is formed at a small depth, hydrogen can be implanted with high efficiency by using cluster ions, typically $H_3^+$ ions, like the present invention. In specific, as for the accelerating voltage for implanting hydrogen in a region at a given depth, an accelerating voltage which is about three times as high as that of the case of irradiating $H^+$ ions can be applied. Accordingly, the dosage can be reduced and takt time can be shortened.

To the semiconductor layer 130, a p-type impurity element such as boron, aluminum, or gallium or an n-type impurity element such as phosphorus or arsenic is preferably added in accordance with a formation region of an n-channel field-effect transistor. Similarly, an n-type impurity element such as phosphorus or arsenic or a p-type impurity element such as boron, aluminum, or gallium is preferably added in accordance with a formation region of a p-channel field-effect transistor. The p-type impurity element is added to the formation region of an n-channel field-effect transistor and the n-type impurity is added to the formation region of a p-channel field-effect transistor, whereby so-called well regions are formed. The dosage of impurity ions may be about greater than or equal to $1 \times 10^{12}$ ions/cm$^2$ and less than or equal to $1 \times 10^{14}$ ions/cm$^2$. Furthermore, in the case of controlling the threshold voltage of the field-effect transistor, a p-type impurity element or an n-type impurity element may be added into the well region.

Figure 8B:
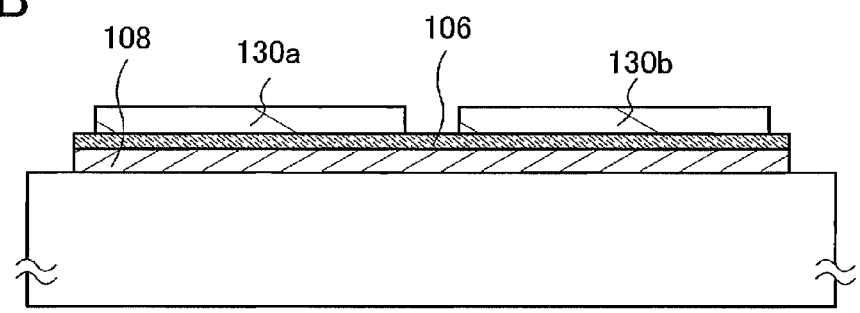
Figure 8C:
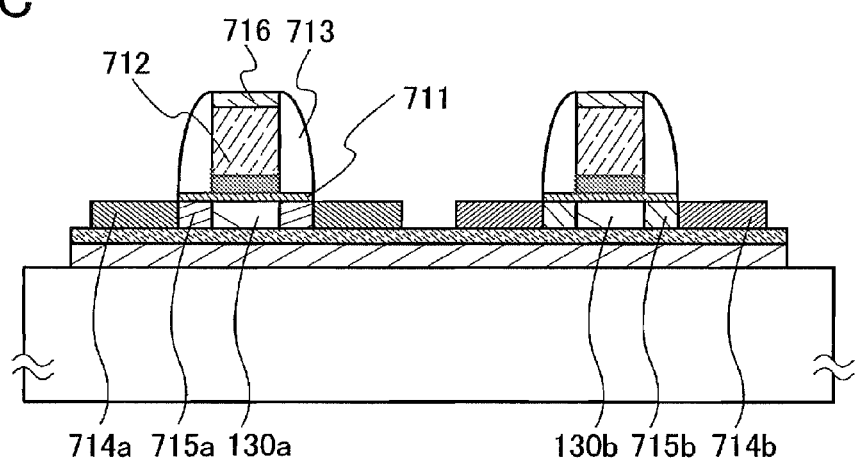

Next, the semiconductor layer 130 is selectively etched to form a semiconductor layer 130a and a semiconductor layer 130b which are separated into island shapes in accordance with arrangement of semiconductor elements (see FIG. 8B).

Note that, although the example in which element isolation is performed by etching of the semiconductor layer 130 into island shapes is described in this embodiment mode, the present invention is not particularly limited thereto. For example, element isolation may be performed by embedding an insulating layer between semiconductor layers in accordance with arrangement of semiconductor elements.

Next, a gate insulating layer 711, a gate electrode 712, and a sidewall insulating layer 713 are formed over each of the semiconductor layers 130a and 130b. The sidewall insulating layer 713 is formed on side surfaces of the gate electrode 712. Then, first impurity regions 714a and second impurity regions 715a are formed in the semiconductor layer 130a, and first impurity regions 714b and second impurity regions 715b are formed in the semiconductor layer 130b. An insulating layer 716 is formed over the gate electrode 712. The insulating layer 716 is formed of a silicon nitride layer, and is used as a hard mask for etching for the formation of the gate electrode 712 (see FIG. 8C).

Figure 8D:
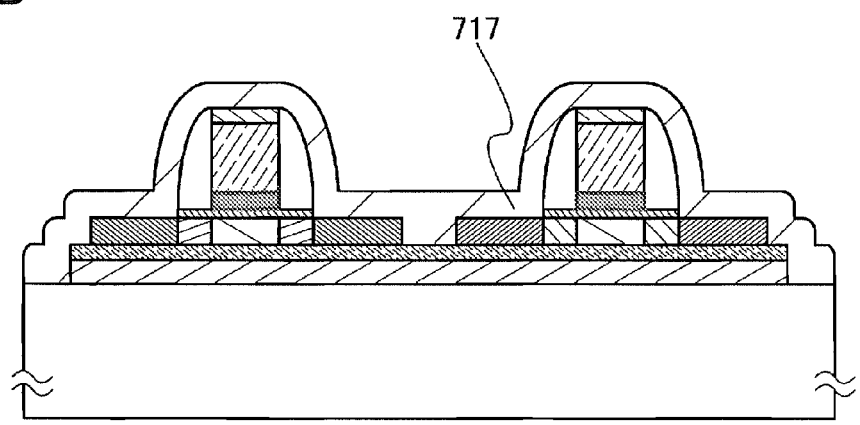
Figure 9A:
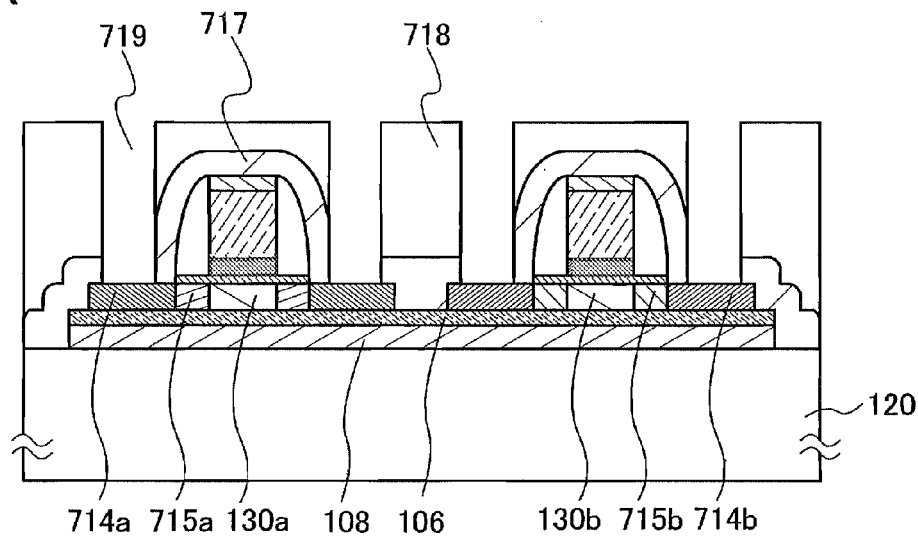
FIGS. 9A and 9B are diagrams showing an example of a manufacturing method of a semiconductor device.
Figure 9B:
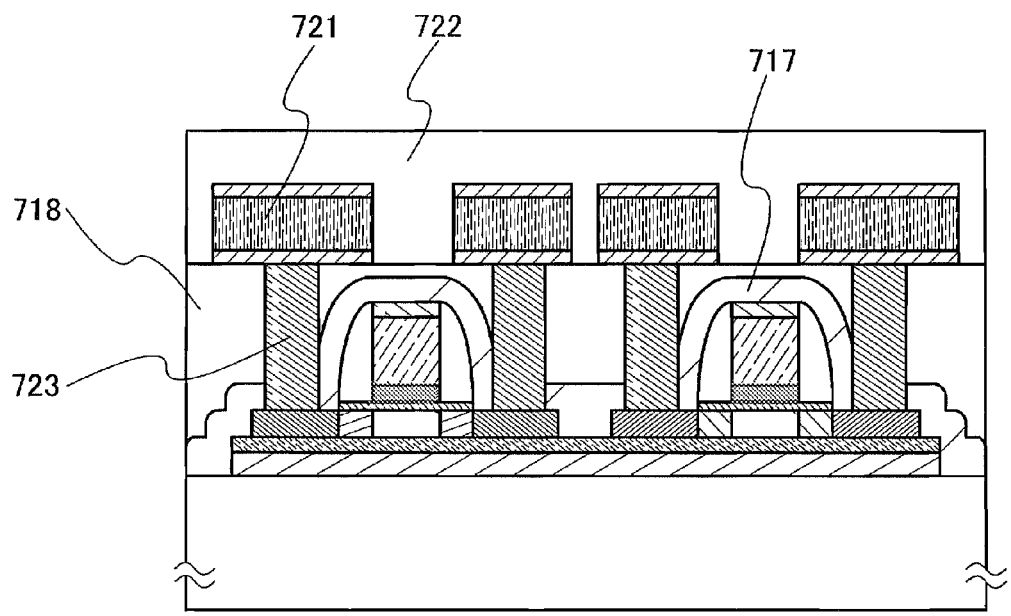

Next, a protective layer 717 is formed so as to cover the gate electrodes 712 and the like provided for the SOI substrate (see FIG. 8D). The first insulating layer 106 has an effect of preventing metal impurities from being diffused from the substrate having the insulating surface 120 side, and the protective layer 717 has an effect of preventing contamination with metal impurities from an upper layer side. In this embodiment mode, the lower layer side and the upper layer side of the semiconductor layer 130 which has excellent crystallinity are coated with insulating layers which have a high blocking effect of metal impurities having high mobility, such as sodium. Thus, electric characteristics of the semiconductor elements manufactured using the semiconductor layer 130 can be improved.

An interlayer insulating layer 718 is formed over the protective layer 717. As the interlayer insulating layer 718, a boron phosphorus silicon glass (BPSG) layer may be formed or an organic resin typified by polyimide may be formed by coating. Then, contact holes 719 are formed in the interlayer insulating layer 718 (see FIG. 9A).

Next, a step of forming a wiring will be described. Contact plugs 723 are formed in the contact holes 719. The contact plugs 723 are formed in such a manner that tungsten silicide is formed by a CVD method with use of a $WF_6$ gas and a $SiH_4$ gas and embedded in the contact holes 719. Alternatively, tungsten may be formed by hydrogen reduction of $WF_6$ to fill the contact holes 719. After that, a wiring 721 is formed in accordance with the contact plugs 723. The wiring 721 is formed of aluminum or an aluminum alloy, and an upper layer and a lower layer thereof are formed of metal films of molybdenum, chromium, titanium, or the like as barrier metal. Furthermore, an interlayer insulating layer 722 is formed thereover (see FIG. 9B). The wiring may be provided as appropriate; a multilayer wiring may be formed by further forming a wiring layer thereover, and in this case, a damascene process may be employed.

Through the above process, a field-effect transistor can be manufactured using the SOI substrate of the present invention. According to the present invention, cost reduction is achieved by reusing a separation wafer at the time of manufacturing of an SOI substrate. In addition, takt time can be shortened by using cluster ions for forming a separation wafer. Therefore, using of the SOI substrate of the present invention can lead to cost reduction of a semiconductor device.

In addition, the SOI substrate is manufactured without using a thermal oxidation method, so that SOI substrates can be manufactured with high yield even if a separation wafer is used repeatedly. Therefore, characteristics variations or the like between substrates can be suppressed even when semiconductor devices are manufactured using n pieces of SOI substrates from one raw material wafer. Further, the semiconductor layer 130 can be formed of a single crystal semiconductor so that higher performance of the semiconductor device can be achieved.

This embodiment mode can be combined with another embodiment mode described in this specification, as appropriate.

Embodiment Mode 10

In this embodiment mode, an example of manufacturing a display device using the SOI substrate of the present invention will be described using FIGS. 10A to 10E, 11A to 11C, 12A and 12B, and FIGS. 13A and 13B. In this embodiment mode, an example of manufacturing an electroluminescence (EL) display device will be described.

Figure 10A:
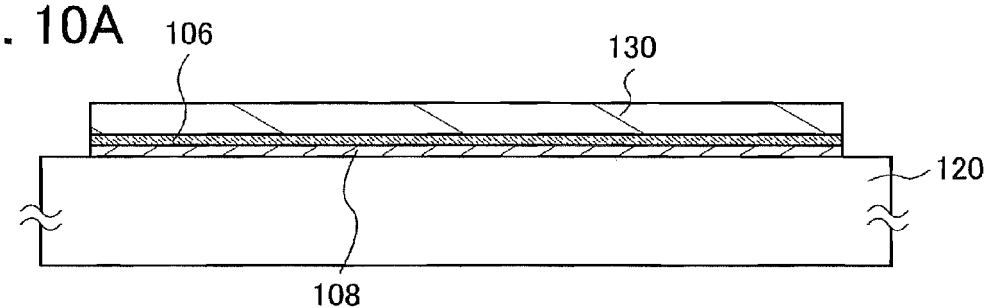
FIGS. 10A to 10E are diagrams showing an example of a manufacturing method of a semiconductor device.

An SOI substrate is prepared (see FIG. 10A). In this embodiment mode, the SOI substrate obtained in (step 32) in FIG. 1 is used for description. That is, the example of using the SOI substrate in which the semiconductor layer 130 is bonded to the substrate having the insulating surface 120 with the second insulating layer 108 and the first insulating layer 106 which are stacked in order interposed therebetween will be described. Note that there are no particular limitations on the structure of the SOI substrate used; the SOI substrate having any another structure described in this specification can be used. Note that the description on the SOI substrate used in FIG. 10A conforms to any of Embodiment Modes 1 to 4 and Embodiment Mode 8, and thus, is omitted in this embodiment mode.

Note that one feature of the SOI substrate of the present invention is to use cluster ions, typically, $H_3^+$ ions at the time of forming a separation layer. By thus using the cluster ions, hydrogen can be implanted with high efficiency and takt time to form the separation layer can be shortened. In addition, a plurality of SOI substrates can be manufactured using one raw material wafer so that cost reduction can be achieved.

To the semiconductor layer 130, a p-type impurity element such as boron, aluminum, or gallium or an n-type impurity element such as phosphorus or arsenic is preferably added in accordance with a formation region of an n-channel field-effect transistor. Similarly, an n-type impurity element such as phosphorus or arsenic or a p-type impurity element such as boron, aluminum, or gallium is preferably added in accordance with a formation region of a p-channel field-effect transistor. The p-type impurity element is added to the formation region of an n-channel field-effect transistor and the n-type impurity is added to the formation region of a p-channel field-effect transistor, whereby so-called well regions are formed. The dosage of impurity ions may be about greater than or equal to $1\times10^{12}$ ions/cm$^2$ and less than or equal to $1\times10^{14}$ ions/cm$^2$. Furthermore, in the case of controlling the threshold voltage of the field-effect transistor, a p-type impurity element or an n-type impurity element may be added into the well region.

Figure 10B:
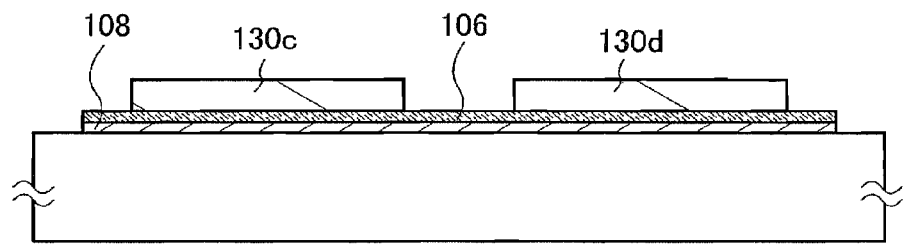

Next, the semiconductor layer 130 is selectively etched to form a semiconductor layer 130c and a semiconductor layer 130d which are separated into island shapes in accordance with arrangement of semiconductor elements (see FIG. 10B).

Figure 10C:
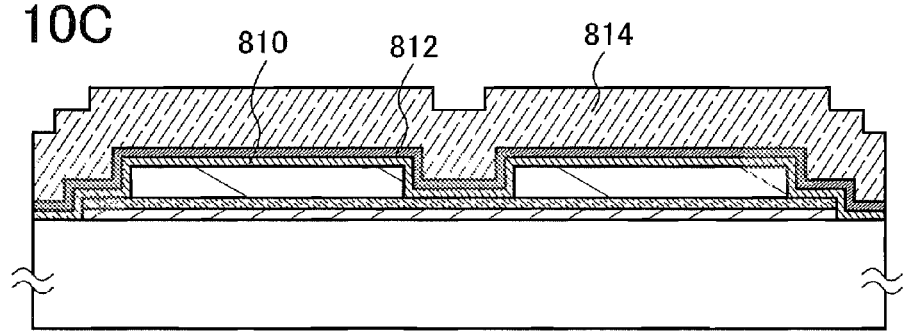

Next, a gate insulating layer 810, and a first conductive layer 812 and a second conductive layer 814 for forming a gate electrode are formed in order over the semiconductor layer 130c and the semiconductor layer 130d (see FIG. 10C).

The gate insulating layer 810 is formed to have a single layer structure or a stacked-layer structure using an insulating layer such as a silicon oxide layer, a silicon oxynitride layer, a silicon nitride layer, or a silicon nitride oxide layer by a CVD method, a sputtering method, an ALE method, or the like.

Alternatively, the gate insulating layer 810 may be formed as follows: plasma treatment is performed on the semiconductor layers 130c and 130d to oxidize or nitride the surfaces thereof. The plasma treatment in this case also includes plasma treatment with plasma excited using microwaves (with a typical frequency of 2.45 GHz). For example, treatment with plasma that is excited by microwaves and has an electron density of $1\times10^{11}$ to $1\times10^{13}$/cm$^3$ inclusive and an electron temperature of 0.5 to 1.5 eV inclusive is also included. Oxidation treatment or nitridation treatment of the surface of the semiconductor layer with such plasma treatment makes it possible to form a thin and dense film. In addition, because the surface of the semiconductor layer is directly oxidized, a film with good interface characteristics can be obtained. Further alternatively, the gate insulating layer 810 may be formed by performing plasma treatment with microwaves on a film formed by a CVD method, a sputtering method, or an ALE method.

The gate insulating layer 810 forms the interface with the semiconductor layers; therefore, it is preferable that the gate insulating layer 810 be formed so as to include a silicon oxide layer or a silicon oxynitride layer at the interface. This is because the formation of a film such as a silicon nitride layer or a silicon nitride oxide layer, in which the amount of nitrogen is higher than that of oxygen, might cause the formation of a trap level which readily deteriorates interface characteristics.

The conductive layer included in the gate electrode is formed of a single-layer film or a stacked-layer film using an element selected from tantalum, tantalum nitride, tungsten, titanium, molybdenum, aluminum, copper, chromium, or niobium, an alloy material or a compound containing the element as its main component, or a semiconductor material typified by polycrystalline silicon doped with an impurity element such as phosphorus, by a CVD method or a sputtering method. When the conductive layer is formed of a stacked-layer film, it can be formed using different conductive materials or can be formed using the same conductive material. In this embodiment mode, an example in which the conductive layer included in the gate electrode is formed of the first conductive layer 812 and the second conductive layer 814 will be described.

If the conductive layer included in the gate electrode has a two-layer structure of the first conductive layer 812 and the second conductive layer 814, a stacked-layer film of a tantalum nitride layer and a tungsten layer, a stacked-layer film of a tungsten nitride layer and a tungsten layer, or a stacked-layer film of a molybdenum nitride layer and a molybdenum layer can be formed, for example. Note that the stacked-layer film of a tantalum nitride layer and a tungsten layer is preferable because large etching selectivity between them can be easily obtained. Note that, in the two-layer-stacked film which is exemplified, it is preferable that the former film be formed over the gate insulating layer 810. In this embodiment mode, the first conductive layer 812 is formed with a thickness of 20 to 100 nm. The second conductive layer 814 is formed with a thickness of 100 to 400 nm. The gate electrode can also have a stacked-layer structure of three or more layers; in this case, it is preferable to employ a stacked-layer structure of a molybdenum layer, an aluminum layer, and a molybdenum layer.

Next, a resist mask 820c and a resist mask 820d are selectively formed over the second conductive layer 814. Then, first etching treatment and second etching treatment are performed using the resist masks 820c and 820d.

Figure 10D:
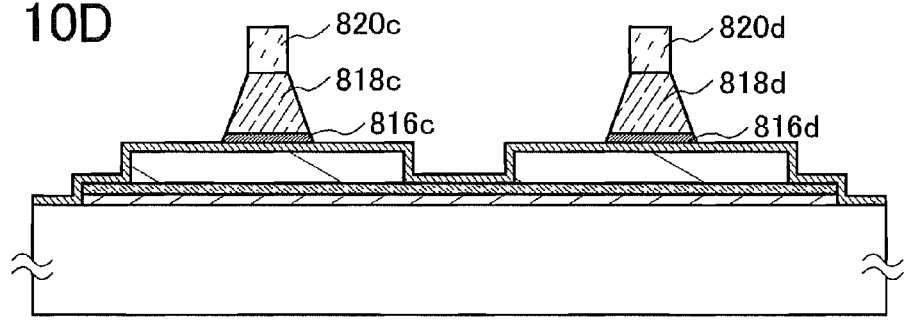

First, the first conductive layer 812 and the second conductive layer 814 are selectively etched by the first etching treatment, so that a first conductive layer 816c and a second conductive layer 818c are formed over the semiconductor layer 130c and a first conductive layer 816d and a second conductive layer 818d are formed over the semiconductor layer 130d (see FIG. 10D).

Figure 10E:
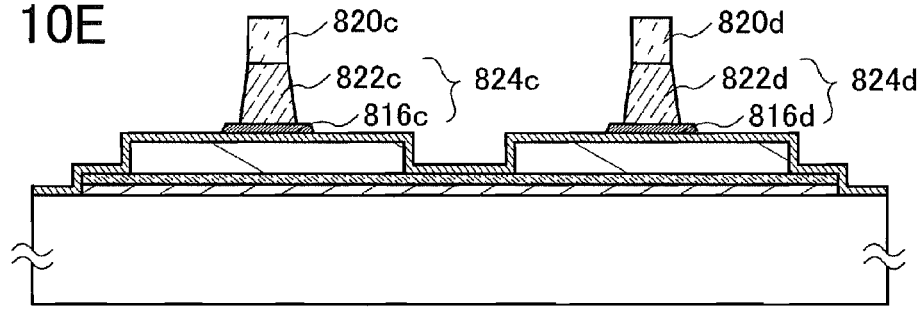
Figure 11A:
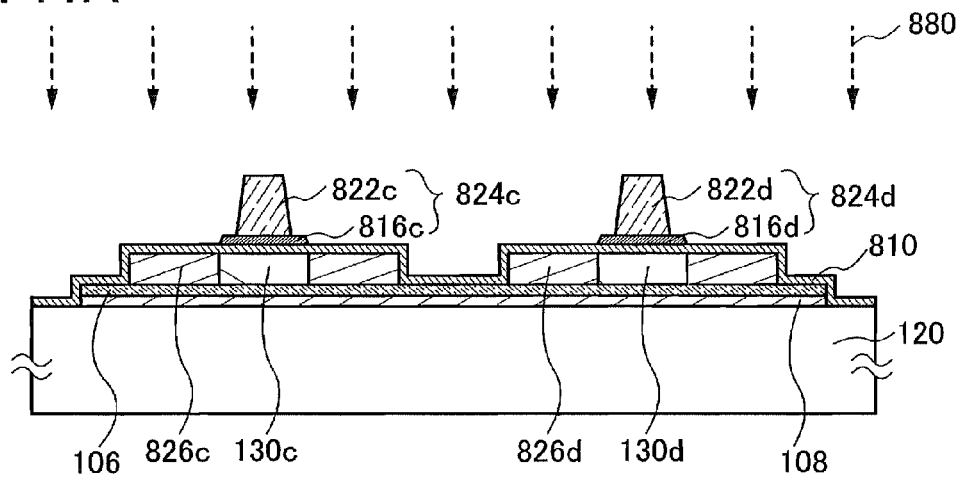
FIGS. 11A to 11C are diagrams showing an example of a manufacturing method of a semiconductor device.
Figure 11B:
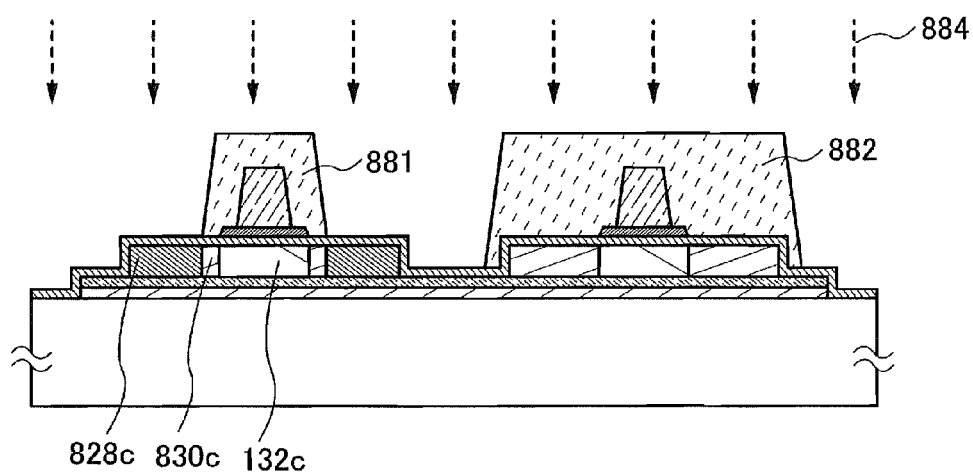
Figure 11C:
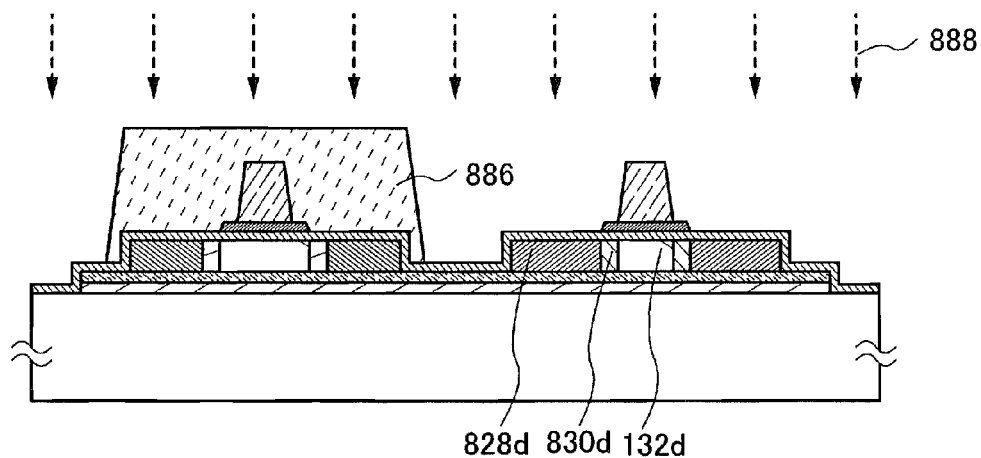

Next, end portions of the second conductive layer 818c and the second conductive layer 818d are selectively etched by the second etching treatment to form a second conductive layer 822c and a second conductive layer 822d (see FIG. 10E). The second conductive layers 822c and 822d are each formed so as to have the width (length parallel to a direction in which carriers flow through a channel formation region (a direction in which a source and drain regions are connected)) which is smaller than that of each of the first conductive layers 816c and 816d. In this manner, a gate electrode 824c formed of the first conductive layer 816c and the second conductive layer 822c, and a gate electrode 824d formed of the first conductive layer 816d and the second conductive layer 822d can be obtained.

The etching method each applied to the first etching treatment and the second etching treatment may be selected as appropriate. In order to improve the etching rate, it is preferable to use a dry etching apparatus using a high-density plasma source by an electron cyclotron resonance (ECR) method, an inductively coupled plasma (ICP) method, or the like. By controlling the etching conditions of the first etching treatment and the second etching treatment as appropriate, side surfaces of the first conductive layers 816c and 816d and the second conductive layers 822c and 822d can each have a desired tapered shape. After forming the gate electrodes 824c and 824d with desired shapes, the resist masks 820c and 820d may be removed.

Next, an impurity element 880 is added into the semiconductor layers 130c and 130d with the gate electrodes 824c and 824d as masks. In the semiconductor layer 130c, a pair of first impurity regions 826c is formed in a self-aligned manner using the first conductive layer 816c and the second conductive layer 822c as masks. In the semiconductor layer 130d, a pair of first impurity regions 826d is formed in a self-aligned manner using the first conductive layer 816d and the second conductive layer 822d as masks (see FIG. 11A).

As the impurity element 880, a p-type impurity element such as boron, aluminum, or gallium, or an n-type impurity element such as phosphorus or arsenic is added. In this embodiment mode, phosphorus, which is an n-type impurity element, is added so as to be contained at a concentration of about $1\times10^{17}$ to $5\times10^{18}$ atoms/cm$^3$.

Next, a resist mask 882 is formed selectively so as to cover the semiconductor layer 130d, and a resist mask 881 is formed so as to partially cover the semiconductor layer 130c. Then, an impurity element 884 is added using the resist mask 882 and the resist mask 881 as masks to form a pair of second impurity regions 828c, a pair of third impurity regions 830c, and a channel formation region 132c in the semiconductor layer 130c (see FIG. 11B).

As the impurity element 884, a p-type impurity element such as boron, aluminum, or gallium, or an n-type impurity element such as phosphorus or arsenic is added. In this embodiment mode, phosphorus, which is an n-type impurity element, is added so as to be contained at a concentration of about $5\times10^{19}$ to $5\times10^{20}$ atoms/cm$^3$.

In the semiconductor layer 130c, the second impurity regions 828c are formed in regions which do not overlap with the first conductive layer 816c. The channel formation region 132c is formed in a region which overlaps with the first conductive layer 816c. The third impurity regions 830c are formed in regions which are located between the channel formation region 132c and the second impurity regions 828c and do not overlap with the first conductive layer 816c. Further, the third impurity regions 830c are formed in regions which do not overlap with the first conductive layer 816c but overlap with the resist mask 881. The second impurity regions 828c function as a source and drain regions. The third impurity regions 830c function as LDD regions. In this embodiment mode, the second impurity regions 828c have higher impurity concentrations than the third impurity regions 830c.

An LDD region means a region to which an impurity element is added at a low concentration and which is formed between a channel formation region and a source or drain region that is formed by adding an impurity element at a high concentration. Provision of an LDD region has an effect of preventing deterioration by hot-carrier implantation by relaxing an electric field near a drain region. Further, in order to prevent deterioration of an on-current value due to hot carriers, a structure in which an LDD region overlaps with a gate electrode with a gate insulating layer interposed therebetween (also called a 'gate-drain overlapped LDD (GOLD) structure') may be employed.

Next, the resist masks 881 and 882 are removed, and then, a resist mask 886 is formed so as to cover the semiconductor layer 130c. Then, an impurity element 888 is added using the resist mask 886, the first conductive layer 816d, and the second conductive layer 822d as masks, so that a pair of second impurity regions 828d, a pair of third impurity regions 830d, and a channel formation region 132d are formed in the semiconductor layer 130d (see FIG. 11C).

As the impurity element 888, a p-type impurity element such as boron, aluminum, or gallium, or an n-type impurity element such as phosphorus or arsenic is added. In this embodiment mode, boron, which is a p-type impurity element, is added so as to be contained at a concentration of about $1\times10^{20}$ to $5\times10^{21}$ atoms/cm$^3$.

In the semiconductor layer 130d, the second impurity regions 828d are formed in regions which do not overlap with the first conductive layer 816d. The third impurity regions 830d are formed in regions which overlap with the first conductive layer 816d and do not overlap with the second conductive layer 822d, by penetrating the impurity element 888 through the first conductive layer 816d. The second impurity regions 828d function as a source and drain regions. In this embodiment mode, the impurity concentration of the second impurity region 828d is higher than that of the third impurity region 830d.

Next, an interlayer insulating layer is formed. The interlayer insulating layer can be formed to have wither a single layer structure or a stacked-layer structure; in this embodiment mode, the interlayer insulating layer has a two-layer structure of an insulating layer 832 and an insulating layer 834 (see FIG. 12A).

As the interlayer insulating layer, a silicon oxide layer, a silicon oxynitride layer, a silicon nitride layer, a silicon nitride oxide layer, or the like can be formed by a CVD method or a sputtering method. Further, the interlayer insulating film can also be formed by an application method such as a spin coating method, using an organic material such as polyimide, polyamide, polyvinylphenol, benzocyclobutene-based polymer, acrylic polymer, or epoxy resin, a siloxane material such as a siloxane resin, an oxazole resin, or the like. A siloxane material is a material including a Si—O—Si bond. Siloxane includes a skeleton structure formed by the bond of silicon (Si) and oxygen (O). As a substituent, an organic group including at least hydrogen (e.g., an alkyl group or aromatic hydrocarbon) is used. A fluoro group may be included in the organic group. Oxazole resin is, for example, photosensitive polybenzoxazole. Photosensitive polybenzoxazole is a material which has a low dielectric constant (a dielectric constant of 2.9 at 1 MHz at room temperature), high heat resistance (according to results of thermogravimetry-differential thermal analysis (TG-DTA), it has a thermal decomposition temperature of 550° C. at a rate of temperature increase of 5° C./min), and a low water absorption coefficient (0.3 wt % at room temperature for 24 hours). Oxazole resin is a material in which the relative permittivity is low (about 2.9) as compared to the relative permittivity of polyimide or the like (about 3.2 to 3.4); therefore, generation of parasitic capacitance can be suppressed and high-speed operation can be performed.

For example, a silicon nitride oxide layer is formed to a thickness of 100 nm as the insulating layer 832, and a silicon oxynitride layer is formed to a thickness of 900 nm as the insulating layer 834. In addition, the insulating layer 832 and the insulating layer 834 are consecutively formed by a plasma CVD method. The interlayer insulating layer may also have a stacked-layer structure of three or more layers. Alternatively, a stacked-layer structure of the following can be employed: a silicon oxide layer, a silicon oxynitride layer, or a silicon nitride layer; and an insulating layer formed of an organic material such as polyimide, polyamide, polyvinylphenol, benzocyclobutene-based polymer, acrylic polymer, or epoxy resin, a siloxane material such as a siloxane resin, or an oxazole resin.

Figure 12A:
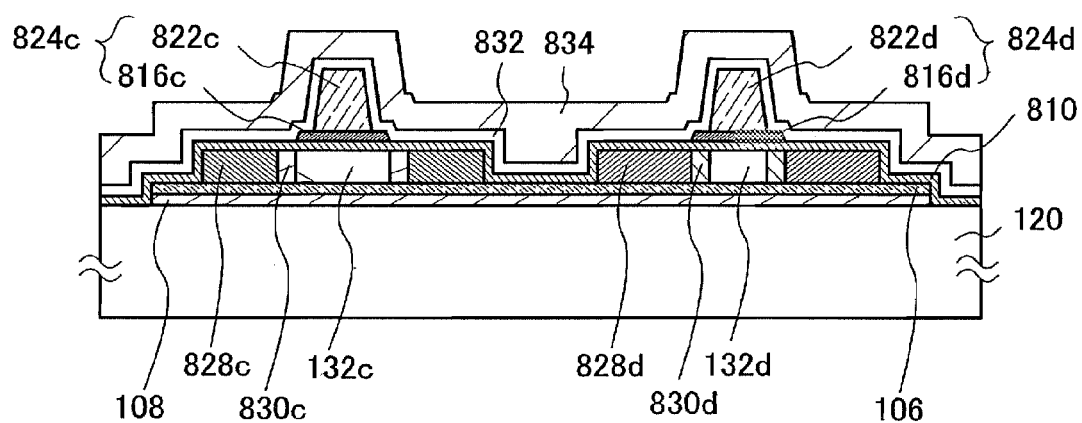
FIGS. 12A and 12B are diagrams showing an example of a manufacturing method of a semiconductor device.
Figure 12B:
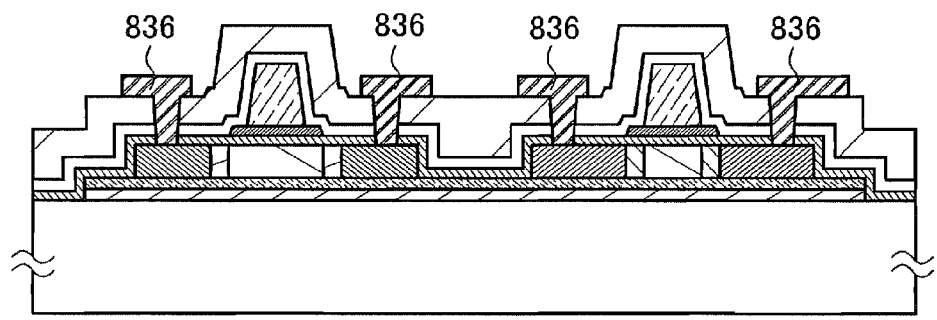

Next, contact holes are formed in the interlayer insulating layer (in this embodiment mode, the insulating layers 832 and 834), and conductive layers 836 that function as source and drain electrodes are formed in the contact holes (see FIG. 12B).

The contact holes are formed selectively in the insulating layers 832 and 834 so as to reach the second impurity regions 828c in the semiconductor layer 130c and the second impurity regions 828d in the semiconductor layer 130d.

As the conductive layer 836, a single layer film or a stacked-layer film formed of one element selected from aluminum, tungsten, titanium, tantalum, molybdenum, nickel, or neodymium, or an alloy containing a plurality of the above-described elements can be used. For example, a conductive layer that is formed of an alloy that contains a plurality of the above-described elements can be formed of an aluminum alloy that contains titanium, an aluminum alloy that contains neodymium, or the like. If the conductive layer 836 is a stacked-layer film, a structure in which an aluminum layer or an aluminum alloy layer as described above is sandwiched between titanium layers can be employed, for example.

Figure 13A:
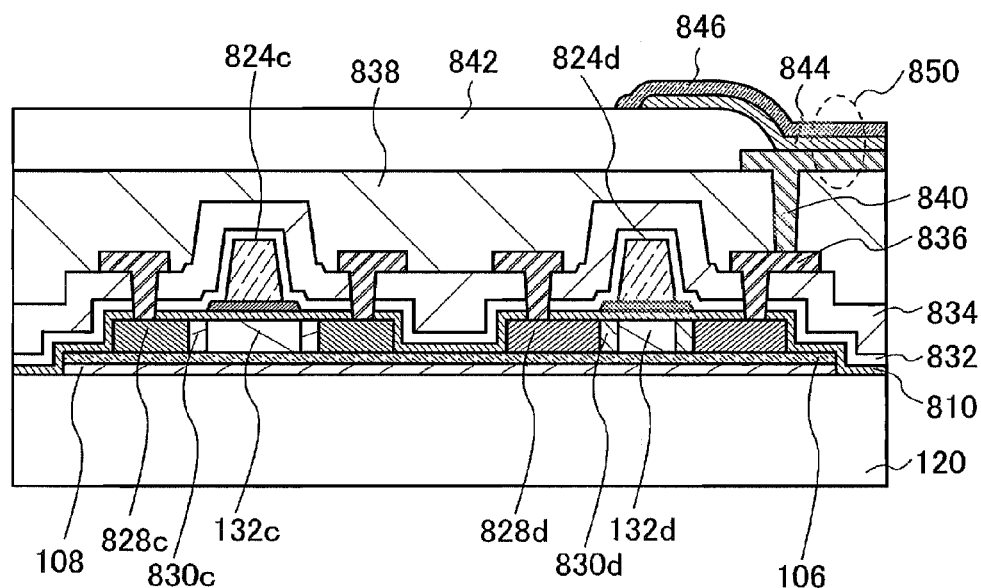
FIGS. 13A and 13B are diagrams showing an example of a manufacturing method of a semiconductor device.

Next, a step of forming a light-emitting element 850 will be described (see FIG. 13A). In this embodiment mode, an example of forming an organic light-emitting element having an organic compound containing layer as a light-emitting layer will be described.

First, a pixel electrode 840 is formed so as to be electrically connected to the conductive layer 836. The pixel electrode 840 is electrically connected to the second impurity region 828d formed in the semiconductor layer 130d with the conductive layer 836 interposed therebetween. A bank layer 842 which covers an end portion of the pixel electrode 840 is formed, and then, an organic compound containing layer 844 and a counter electrode 846 are stacked over the pixel electrode 840.

Note that, although the example in which the pixel electrode 840 is formed over an insulating layer 838 provided over the conductive layers 836 is described in this embodiment mode, the present invention is not particularly limited thereto. For example, a structure in which the pixel electrode 840 is provided over the insulating layer 834 may be employed. In this case, the pixel electrode 840 can also include part of the conductive layer 836 which functions as a source electrode or a drain electrode.

As the insulating layer 838, a silicon oxide layer, a silicon oxynitride layer, a silicon nitride layer, or the like can be formed by a CVD method or a sputtering method. Alternatively, the insulating film 838 can be formed of an organic material such as polyimide, polyamide, polyvinylphenol, benzocyclobutene-based polymer, acrylic resin, or epoxy resin; a siloxane material such as a siloxane resin; an oxazole resin; or the like by an application method such as a spin coating method. Note that the insulating layer 838 can be formed to have a single layer structure or a stacked-layer structure using the above-described material.

One of the pixel electrode 840 and the counter electrode 846 functions as an anode, and the other functions as a cathode. As for light emission of the light-emitting element, there are the case where light is extracted from the substrate having the insulating surface 120 side (also referred to as bottom emission), the case where light is extracted from the side opposite to the substrate having the insulating surface 120 side (also referred to as top emission), and the case where light is extracted from the substrate having the insulating surface 120 side and the side opposite thereto (also referred to as dual emission). In the case of bottom emission, it is preferable that the pixel electrode 840 be formed as a light-transmitting electrode and the counter electrode 846 be formed as a reflective electrode. In the case of top emission, on the other hand, it is preferable that the pixel electrode 840 be formed as a reflective electrode and the counter electrode be formed as a light-transmitting electrode. In the case of dual emission, it is preferable that both the pixel electrode 840 and the counter electrode 846 be formed as light-transmitting electrodes.

When the pixel electrode 840 or the counter electrode 846 is formed as a reflective electrode, it can be formed of a reflective conductive material, for example, a metal element such as tantalum, tungsten, titanium, molybdenum, aluminum, chromium, or silver, or an alloy material or a compound containing the above-described metal element.

When the pixel electrode 840 or the counter electrode 846 is formed as a light-transmitting electrode, it can be formed of a light-transmitting conductive material such as indium tin oxide (ITO), zinc oxide (ZnO), indium zinc oxide (IZO), or zinc oxide in which gallium is added (GZO). An electrode through which visible light is transmitted can be obtained by formation of a film of a reflective conductive material to a thickness of several to several tens of nanometers.

Further, a light-transmitting electrode can be formed of a conductive composition containing a conductive molecule with high molecular weight (also referred to as a conductive polymer). It is preferable that a thin film of an electrode formed of a conductive composition have a sheet resistance of less than or equal to 10000 Ω/square and a light transmittance of greater than or equal to 70% at a wavelength of 550 nm. In addition, it is preferable that the resistance of the conductive polymer which is contained in the conductive composition be less than or equal to 0.1 Ω·cm.

As the conductive polymer, a so-called π electron conjugated conductive polymer can be used. For example, polyaniline or a derivative thereof, polypyrrole or a derivative thereof, polythiophene or a derivative thereof, or a copolymer of two or more kinds of those materials can be given.

As specific examples of a conjugated conductive polymer, the following can be given: polypyrrole; poly(3-methylpyrrole); poly(3-butylpyrrole); poly(3-octylpyrrole); poly(3-decylpyrrole); poly(3-dimethylpyrrole); poly(3,4-dibutylpyrrole); poly(3-hydroxypyrrole); poly(3-methyl-4-hydroxypyrrole); poly(3-methoxypyrrole); poly(3-ethoxypyrrole); poly(3-octoxypyrrole); poly(3-carboxypyrrole); poly(3-methyl-4-carboxypyrrole); poly(N-methylpyrrole); polythiophene; poly(3-methylthiophene); poly(3-butylthiophene); poly(3-octylthiophene); poly(3-decylthiophene); poly(3-dodecylthiophene); poly(3-methoxythiophene); poly(3-ethoxythiophene); poly(3-octoxythiophene); poly(3-carboxythiophene); poly(3-methyl-4-carboxythiophene); poly(3,4-ethylenedioxythiophene); polyaniline; poly(3-methylaniline); poly(3-octylaniline); poly(3-isobutylaniline); poly(3-isobutylaniline); poly(2-aniline sulfonic acid); poly(3-aniline sulfonic acid); and the like.

Any of the above-described conductive polymers may be used alone as a conductive composition to form a light-transmitting electrode. Alternatively, an organic resin can be added to the conductive polymer in order to adjust film characteristics such as film quality or film strength of the light-transmitting electrode formed of a conductive composition.

As the organic resin, a thermosetting resin, a thermoplastic resin, a photocurable resin, or the like which is compatible with, or can be mixed and dispersed into a conductive polymer can be used. As examples of such a resin, the following can be given: a polyester-based resin such as poly(ethylene terephthalate), poly(butylene terephthalate), or poly(ethylene naphthalate); a polyimide-based resin such as polyimide or polyamideimide; a polyamide resin such as polyamide 6, polyamide 66, polyamide 12, or polyamide 11; a fluorine resin such as poly(vinylidene fluoride), poly(vinyl fluoride), polytetrafluoroethylene, ethylene-tetrafluoroethylene copolymer, or polychlorotrifluoroethylene; a vinyl resin such as poly(vinyl alcohol), poly(vinyl ether), poly(vinyl butyral), poly(vinyl acetate), or poly(vinyl chloride); an epoxy resin; a xylene resin; an aramid resin; a polyurethane-based resin; a polyurea-based resin; a melamine resin; a phenol-based resin; polyether; an acrylic-based resin, or a copolymer of any of those resins; and the like.

Further, the conductive composition may be doped with an acceptor dopant or a donor dopant so that oxidation-reduction potential of conductive polymer may be changed in order to control the conductivity of the conductive composition.

As the acceptor dopant, a halogen compound, Lewis acid, proton acid, an organic cyano compound, an organometallic compound, or the like can be used. As examples of the halogen compound, chlorine, bromine, iodine, iodine chloride, iodine bromide, iodine fluoride, and the like can be given. As examples of the Lewis acid, phosphorus pentafluoride, arsenic pentafluoride, antimony pentafluoride, boron trifluoride, boron trichloride, boron tribromide, and the like can be given. As examples of the proton acid, inorganic acid such as hydrochloric acid, sulfuric acid, nitric acid, phosphoric acid, fluoroboric acid, hydrofluoric acid, and perchloric acid, and organic acid such as organic carboxylic acid and organic sulfonic acid can be given. As the organic cyano compound, a compound having a plurality of cyano groups which are conjugated through a conjugated multiple bond can be used; for example, tetracyanoethylene, tetracyanobenzene, tetracyanoquinodimethane, tetracyanoazanaphthalene, and the like are given.

As examples of the donor dopant, an alkali metal, an alkaline earth metal, a tertiary amine compound, and the like can be given.

Alternatively, a conductive composition may be dissolved in water or an organic solvent (e.g., an alcohol-based solvent, a ketone-based solvent, an ester-based solvent, a hydrocarbon-based solvent, or an aromatic-based solvent) so that a thin film which functions as the light-transmitting electrode can be formed by a wet process.

There are no particular limitations on the solvent which dissolves the conductive composition. A solvent which dissolves the above-described conductive high molecule or high molecular resin compound such as an organic resin may be used. For example, the conductive composition may be dissolved in any one or a mixture of water, methanol, ethanol, propylene carbonate, N-methylpyrrolidone, N,N-dimethylformamide, N,N-dimethylacetamide, cyclohexanone, acetone, methyl ethyl ketone, methyl isobutyl ketone, toluene, or the like.

After the conductive composition is dissolved in the solvent as described above, a film thereof is formed over the insulating layer 838 by a wet process such as an application method including a coating method, a droplet discharge method (also referred to as an inkjet method), or a printing method, so that the pixel electrode 840 can be obtained. Evaporating of the solvent may be performed by thermal treatment or by reducing the pressure. In the case where the organic resin is a thermosetting resin, thermal treatment may be performed. In the case where the organic resin is a photocurable resin, light irradiation treatment may be performed.

The bank layer 842 can be formed as follows: an insulating layer is formed over the entire surface of the substrate by a CVD method, a sputtering method, an application method, or the like, and then, the insulating layer is selectively etched. Alternatively, the bank layer 842 can be formed selectively by a droplet discharge method, a printing method, or the like. Further alternatively, an insulating layer is formed using a positive photosensitive resin over the entire surface, and then, the insulating layer is exposed to light and developed, so that the bank layer 842 can be formed in a desired shape.

As the organic compound containing layer 844, at least a light-emitting layer is formed, and a hole injecting layer, a hole transporting layer, an electron transporting layer, and/or an electron injecting layer may be formed as appropriate in addition to the light-emitting layer. The organic compound containing layer 844 can be formed by an application method such as an ink jet method or an evaporation method.

Through the above process, the light-emitting element 850 in which the organic compound containing layer 844 including at least the light-emitting layer is interposed between the pixel electrode 840 and the counter electrode 846 can be formed.

Figure 13B:
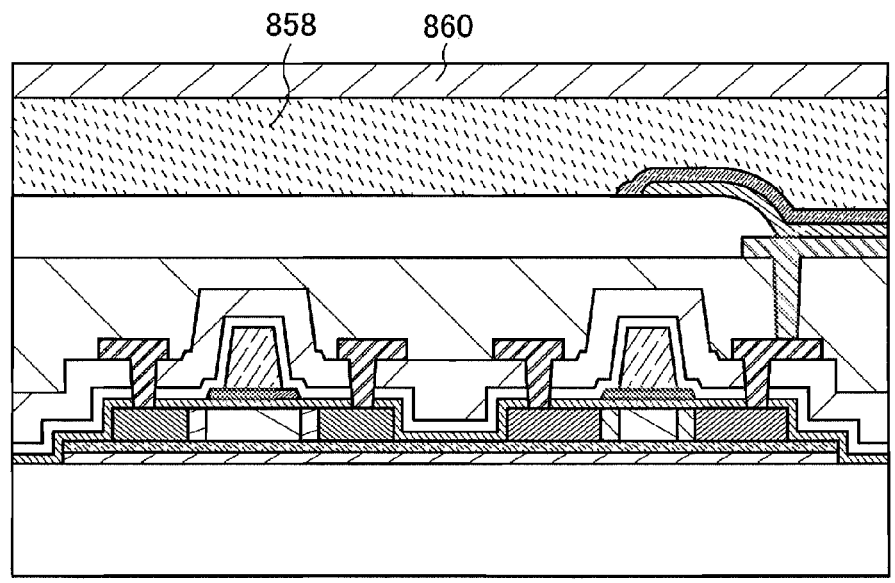

Next, a counter substrate 860 is provided so as to face the substrate having the insulating surface 120 (see FIG. 13B). A filler 858 may be provided between the counter substrate 860 and the counter electrode 846, or a space between the counter substrate 860 and the counter electrode 846 may be filled with an inert gas. A protective layer may be formed so as to cover the counter electrode 846.

Through the above-described process, the EL display device of this embodiment mode is completed.

In manufacturing an SOI substrate, by using a single crystal semiconductor substrate as a semiconductor wafer which is a base of the semiconductor layer 130, the semiconductor layer 130 can be formed of a single crystal semiconductor. As a result, a channel formation region can be formed of the single crystal semiconductor, and thus, variation in transistor characteristics between pixels can be reduced as compared with the case of a display device using a polycrystalline semiconductor as a channel formation region. Thus, display unevenness of a light-emitting device can be suppressed.

According to the present invention, manufacturing time of an SOI substrate can be shortened, and throughput is improved. Therefore, according to the present invention, cost reduction is achieved by reusing a separation wafer at the time of manufacturing of an SOI substrate. In addition, takt time can be shortened by using cluster ions for forming a separation wafer. Therefore, using of the SOI substrate of the present invention can lead to cost reduction of an EL display device.

Note that there are no particular limitations on the structure of the transistor included in the display device of this embodiment mode. For example, an electric-field transistor which has the structure described in above-described embodiment mode can be employed.

This embodiment mode can be combined with another embodiment modes described in this specification, as appropriate.

Embodiment Mode 11

Examples of a semiconductor device manufactured using the SOI substrate of the present invention will be described in this embodiment mode.

Figure 14:
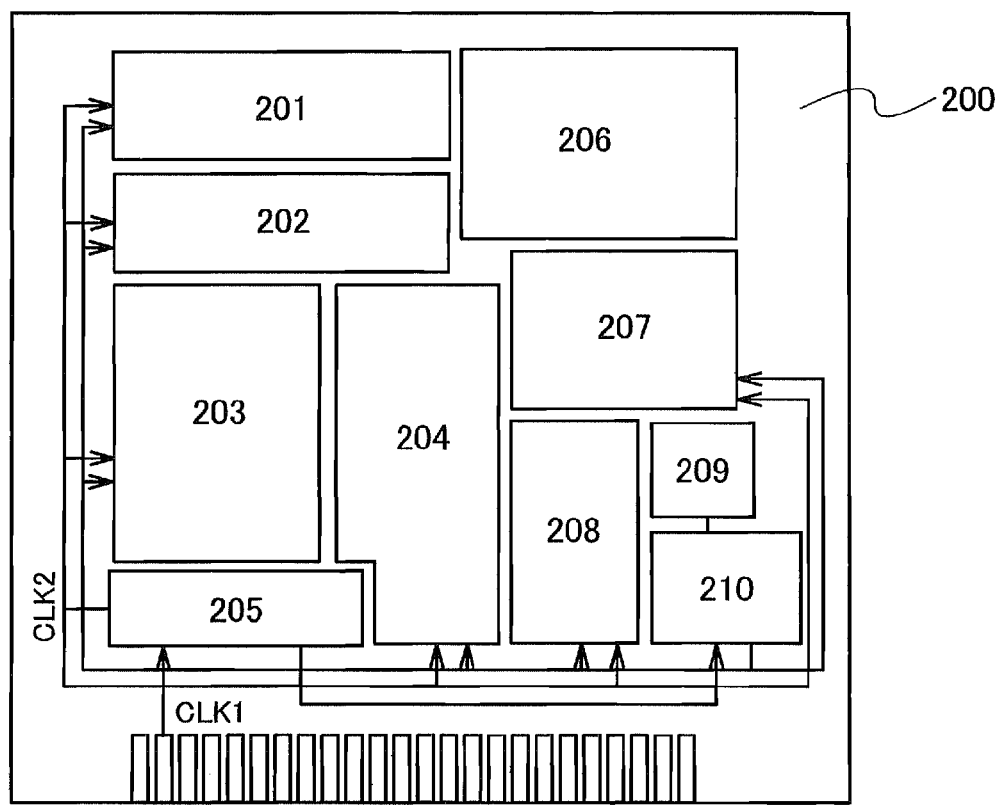
FIG. 14 is a block diagram showing a structure of a microprocessor.

FIG. 14 shows an example of a microprocessor 200 as an example of a semiconductor device. The microprocessor 200 is manufactured using the SOI substrate of any of the above-described embodiment modes. The microprocessor 200 includes an arithmetic logic unit (also referred to as an ALU) 201, an ALU controller 202, an instruction decoder 203, an interrupt controller 204, a timing controller 205, a register 206, a register controller 207, a bus interface (Bus I/F) 208, a read-only memory (ROM) 209, and a memory interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction. In specific, the ALU controller 202 generates signals for controlling operation of the ALU 201. While the microprocessor 200 executes a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1, and supplies the internal clock signal CLK2 to the above-described various circuits. Note that the microprocessor 200 shown in FIG. 14 is only an example in which the structure is simplified, and an actual microprocessor may have various structures depending on the uses.

The microprocessor 200 as described above can be manufactured by applying the SOI substrate of the present invention. In the manufacturing of the SOI substrate of the present invention, throughput is improved and cost reduction is achieved. When the SOI substrate is used, semiconductor devices such as microprocessors can be manufactured at low cost. In addition, by using a single crystal semiconductor substrate in manufacturing an SOI substrate, a single crystal semiconductor layer can be obtained, and an integrated circuit can be formed using the single crystal semiconductor layer. Therefore, high performance, high speed processing, and the like can be realized.

Figure 15:
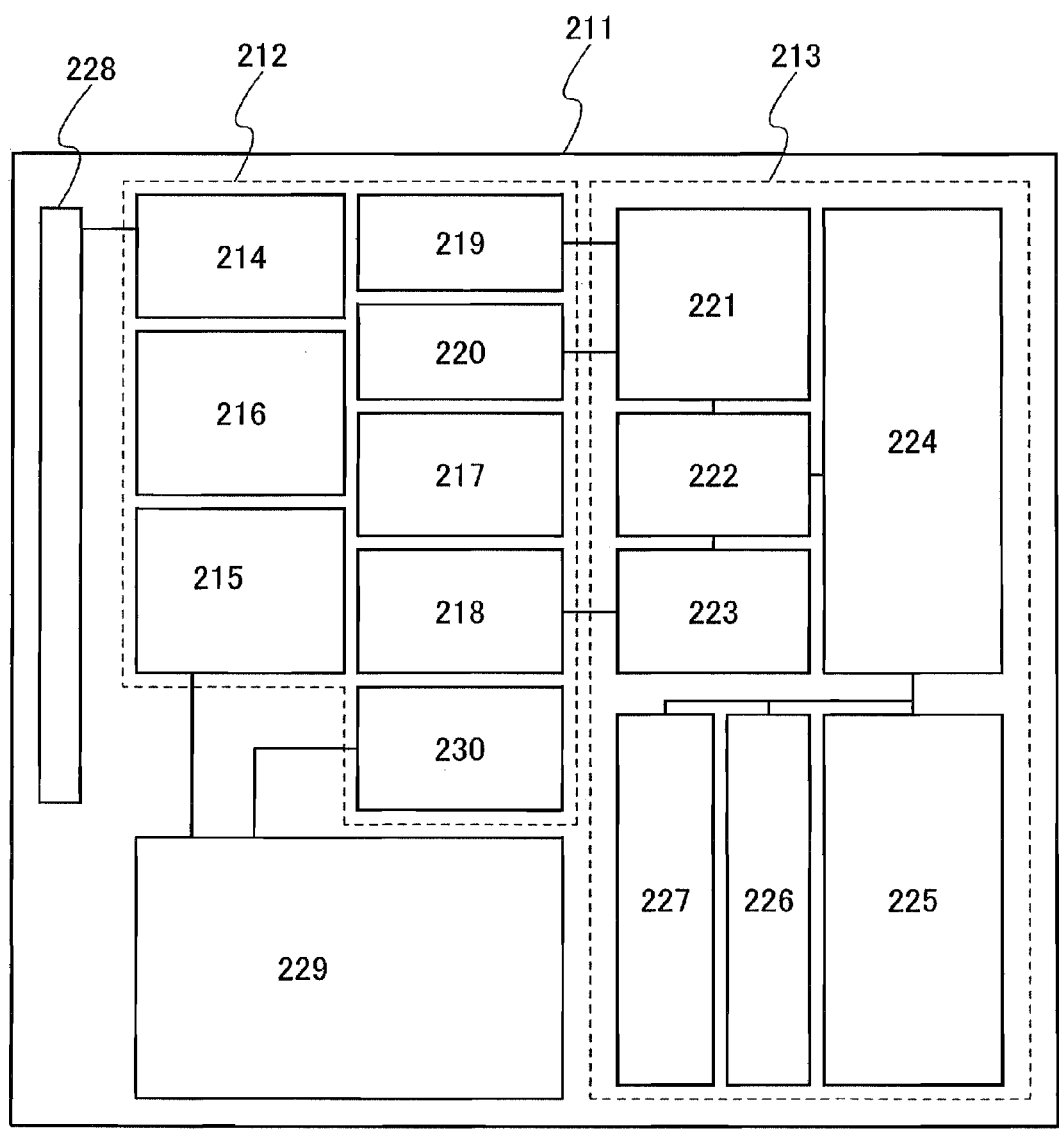
FIG. 15 is a block diagram showing a structure of an RFCPU.

Next, an example of a semiconductor device provided with an arithmetic function by which data can be transmitted and received without contact will be described using FIG. 15. FIG. 15 shows an example of a computer that operates transmitting/receiving signals to/from an external device by wireless communication (such a computer is hereinafter referred to as an 'RFCPU'). An RFCPU 211 includes an analog circuit portion 212 and a digital circuit portion 213. The analog circuit portion 212 has a resonance circuit 214 with a resonance capacitor, a rectifier circuit 215, a constant voltage circuit 216, a reset circuit 217, an oscillator circuit 218, a demodulator circuit 219, a modulator circuit 220, and a power management circuit 230. The digital circuit portion 213 has an RF interface 221, a control register 222, a clock controller 223, a CPU interface 224, a central processing unit (CPU) 225, a random-access memory (RAM) 226, and a read-only memory (ROM) 227.

The operation of the RFCPU 211 having such a structure is roughly as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 is not necessarily formed over the same substrate as the RFCPU 211 as long as the capacitor portion 229 is attached as a component to an insulating-surface substrate which is included in the RFCPU 211.

The reset circuit 217 generates a signal for resetting and initializing the digital circuit portion 213. For example, the reset circuit generates a signal which rises with delay after rise in the power source voltage, as a reset signal. The oscillation circuit 218 changes the frequency and the duty ratio of a clock signal in accordance with a control signal generated by the constant voltage circuit 216. The demodulator circuit 219 including a low-pass filter binarizes the amplitude of, for example, a received amplitude-modulated (ASK) signal. The modulator circuit 220 varies the amplitude of an amplitude-modulated (ASK) transmission signal and transmits the signal. The modulation circuit 220 changes the resonance point of the resonance circuit 214, thereby changing the amplitude of a communication signal. The clock controller 223 generates a control signal for changing the frequency and duty ratio of a clock signal in accordance with the power supply voltage or a consumption current of the central processing unit 225. The power supply voltage is monitored by the power management circuit 230.

A signal input from the antenna 228 to the RFCPU 211 is demodulated by the demodulator circuit 219 and then decomposed into a control command, data, and the like by the RF interface 221. The control command is stored in the control register 222. The control command includes reading of data stored in the read-only memory 227, writing of data to the random-access memory 226, an arithmetic instruction to the central processing unit 225, and the like. The central processing unit 225 accesses the read-only memory 227, the random access memory 226, and the control register 222 via the CPU interface 224. The CPU interface 224 has a function of generating an access signal for any of the read-only memory 227, the random-access memory 226, and the control register 222 based on an address the central processing unit 225 requests.

As an arithmetic method of the central processing unit 225, a method may be employed in which the read-only memory 227 stores an operating system (OS) in advance and a program is read and executed at the time of starting operation. Alternatively, a method may be employed in which a circuit dedicated to arithmetic is formed as an arithmetic circuit and an arithmetic processing is conducted using hardware. As a method in which both hardware and software are used, a method in which part of processing is carried out by a dedicated arithmetic circuit and the other part of the arithmetic processing is executed by the central processing unit 225 using a program can be employed.

The RFCPU 211 described above can be manufactured by applying the SOI substrate of the present invention. In the manufacturing of the SOI substrate of the present invention, throughput is improved and cost reduction is achieved. Therefore, using the SOI substrate can lead to cost reduction of semiconductor devices such as RFCPUs. In addition, by using a single crystal semiconductor substrate in manufacturing an SOI substrate, a single crystal semiconductor layer can be obtained, and an integrated circuit can be formed of the single crystal semiconductor layer. Therefore, high performance, high speed processing, and the like can be realized. Although FIG. 15 shows a mode of an RFCPU, the present invention can also be applied to an IC tag or the like as long as it has a function of communication, arithmetic processing, or memory.

The SOI substrate of the present invention can also be applied to a display device such as a liquid crystal display device or an EL display device. In the manufacturing of the SOI substrate of the present invention, throughput is improved and cost reduction is achieved. Therefore, using the SOI substrate of the present invention can lead to cost reduction of a liquid crystal display device or an EL display device.

In addition, by using a single crystal semiconductor substrate in manufacturing an SOI substrate, a semiconductor layer formed of a single crystal semiconductor can be obtained. Thus, a transistor can be formed of the single crystal semiconductor layer. The transistor formed of a single crystal semiconductor layer is superior to an amorphous silicon transistor in all operation characteristics such as current drive capability; therefore, the transistor size can be decreased. Accordingly, the aperture ratio of a pixel portion in a display panel can be improved. In addition, when an insulating layer which has a high blocking effect is provided between a mother glass and a single crystal semiconductor layer, a highly reliable display device can be provided. Furthermore, because a microprocessor like the one shown in FIG. 14 or FIG. 15 can be formed, the display device can be provided with a function of a computer. Further, a display which is capable of data input and output without contact can be manufactured.

A variety of electric appliances can be formed using the SOI substrate of the present invention. As examples of the electronic appliance, the following can be given: a camera such as a video camera or a digital camera, a navigation system, a sound reproducing device (e.g., a car audio or a car audio component), a computer, a game machine, a portable information terminal (e.g., a laptop computer, a mobile phone, a portable game machine, or an electronic book), an image reproducing device provided with a storage medium (specifically, a device for reproducing the content of a storage medium such as a DVD (Digital Versatile Disc) and having a display for displaying the image), and the like.

Figure 16A:
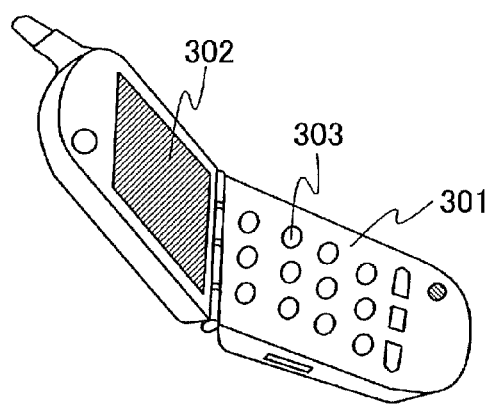
FIGS. 16A to 16C are diagrams each showing an example of an electronic device.

FIG. 16A shows an example of a mobile phone. A mobile phone 301 described in this embodiment mode includes a display portion 302, operation switches 303, and the like. Application of the display device using the SOI substrate of the present invention to the display portion 302 can lead to cost reduction of the mobile phone. Further, a single crystal semiconductor can be used for a transistor included in the display device, and therefore, the display portion with high image, quality can be formed. Further, the semiconductor device of the present invention can be also applied to a microprocessor or a memory included in the mobile phone 301.

Figure 16B:
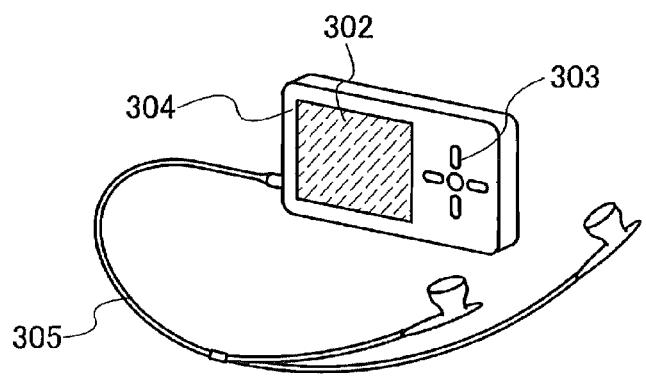

FIG. 16B shows a digital player 304, which is one typical example of an audio device. The digital player 304 shown in FIG. 16B includes a display portion 302, operation switches 303, earphones 305, and the like. Instead of the earphones 305, headphones or wireless earphones can be used. In the digital player 304, the semiconductor device of the present invention can be applied to a memory portion which stores music information or a microprocessor which operates the digital player 304. The display device using the SOI substrate of the present invention can be applied to the display portion 302. Therefore, a single crystal semiconductor can also be used for a transistor included in the display device, and therefore, the display portion with high image quality can be formed so that high-definition images or character information can be displayed even if the screen size is about 0.3 to 2 inches.

Figure 16C:
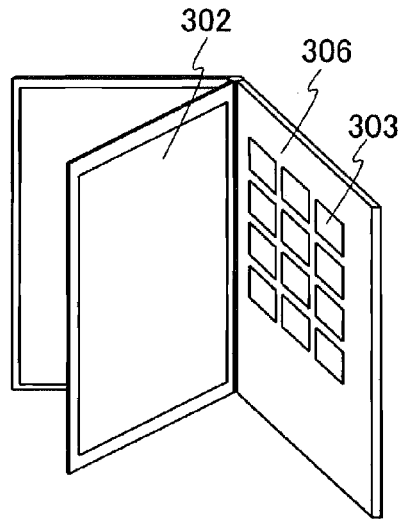

FIG. 16C shows an electronic book 306. This electronic book 306 includes a display portion 302, operation switches 303, and the like. A modem may be built in, or a structure in which data can be transmitted and received wirelessly may be employed. In the electronic book 306, the semiconductor device of the present invention can be applied to a memory portion which stores information or a microprocessor which operates the electronic book 306. In the memory portion, a NOR-type nonvolatile memory with a memory capacity of 20 to 200 gigabytes (GBs) can be used, with which images or sounds (music) can be stored and reproduced. In the display portion 302, by applying a display device using the SOI substrate of the present invention, high-quality display can be performed.

This embodiment mode can be combined with another embodiment mode described in this specification, as appropriate.

This application is based on Japanese Patent Application serial no. 2007-264998 filed with Japan Patent Office on Oct. 10, 2007, the entire contents of which are hereby incorporated by reference.

What is claimed is:

1. A method for manufacturing a semiconductor device comprising:
    a first step of forming a separation layer in a semiconductor wafer by irradiating the semiconductor wafer with a cluster ion from a first surface side of the semiconductor wafer;
    a second step of bonding a first surface of the semiconductor wafer and a substrate to each other with an insulating layer interposed therebetween;
    a third step of separating the semiconductor wafer at the separation layer or at a region near the separation layer to form a separation wafer having a separation plane and a silicon-on-insulator substrate which includes a semiconductor layer formed over the substrate with the insulating layer interposed therebetween;
    a fourth step of treating the separation wafer having the separation plane; and
    a fifth step of performing the first to fourth steps using the separation wafer as the semiconductor wafer of the first to third steps,
    wherein the semiconductor wafer has the first surface side that contains the first surface and a second surface side opposed to the first surface side, and the first to third steps are performed only on the first surface side of the semiconductor wafer,
    wherein the cluster ion comprises $H_3^+$ ions,
    wherein the $H_3^+$ ions are contained at least 80% in a total amount of all kinds of ions generated from a source gas containing hydrogen, and
    wherein the $H_3^+$ ions are generated by thermoelectrons discharged from a filamentary electrode.

2. The method for manufacturing a semiconductor device according to claim 1,
    wherein the insulating layer is formed over the substrate.

3. The method for manufacturing a semiconductor device according to claim 1,
    wherein the fourth step of treating the separation wafer is performed only on the separation plane.

4. The method for manufacturing a semiconductor device according to claim 1,
    wherein the first step is performed using an ion doping apparatus.

5. The method for manufacturing a semiconductor device according to claim 1,
    wherein the cluster ion comprises an ion selected from a $^2H_2^+$ ion and a $^2H_3^+$ ion.

6. The method for manufacturing a semiconductor device according to claim 1,
    wherein the fourth step includes a planarization treatment performed on the separation plane of the separation wafer, and
    wherein the planarization treatment is selected from polishing treatment, etching treatment, thermal treatment, and laser beam irradiation.

7. A method for manufacturing a semiconductor device comprising:
    a first step of forming a separation layer in a semiconductor wafer by irradiating the semiconductor wafer with a cluster ion;
    a second step of forming an insulating layer over the semiconductor wafer by a CVD method using organosilane;
    a third step of bonding the semiconductor wafer and a substrate to each other with the insulating layer interposed therebetween;
    a fourth step of separating the semiconductor wafer at the separation layer or at a region near the separation layer to form a separation wafer having a separation plane and a silicon-on-insulator substrate which includes a semiconductor layer formed over the substrate with the insulating layer interposed therebetween;
    a fifth step of treating the separation wafer having the separation plane; and
    a sixth step of performing the first to fifth steps using the separation wafer as the semiconductor wafer of the first to fourth steps,
    wherein the semiconductor wafer has a first surface side that contains a first surface and a second surface side opposed to the first surface side, and the first to fourth steps are performed only on the first surface side of the semiconductor wafer,
    wherein the cluster ion comprises $H_3^+$ ions,
    wherein the $H_3^+$ ions are contained at least 80% in a total amount of all kinds of ions generated from a source gas containing hydrogen, and
    wherein the $H_3^+$ ions are generated by thermoelectrons discharged from a filamentary electrode.

8. The method for manufacturing a semiconductor device according to claim 7,
    wherein the fifth step of treating the separation wafer is performed only on the separation plane.

9. The method for manufacturing a semiconductor device according to claim 7,
    wherein the first step is performed using an ion doping apparatus.

10. The method for manufacturing a semiconductor device according to claim 7,
    wherein the cluster ion comprises an ion selected from a $^2H_2^+$ ion and a $^2H_3^+$ ion.

11. The method for manufacturing a semiconductor device according to claim 7,
    wherein the fifth step includes a planarization treatment performed on the separation plane of the separation wafer, and
    wherein the planarization treatment is selected from polishing treatment, etching treatment, thermal treatment, and laser beam irradiation.

12. A method for manufacturing a semiconductor device comprising:
    a first step of forming an insulating layer over a semiconductor wafer;
    a second step of forming a separation layer in the semiconductor wafer by irradiating the semiconductor wafer with a cluster ion;
    a third step of activating a surface of the insulating layer by irradiating the surface of the insulating layer with an atom beam or an ion beam;
    a fourth step of bonding the semiconductor wafer and a substrate to each other with the insulating layer interposed therebetween;

a fifth step of separating the semiconductor wafer at the separation layer or at a region near the separation layer to form a separation wafer having a separation plane and a silicon-on-insulator substrate which includes a semiconductor layer formed over the substrate with the insulating layer interposed therebetween;

a sixth step of treating the separation wafer having the separation plane; and a seventh step of performing the first to sixth steps using the separation wafer as the semiconductor wafer of the first to fifth steps, wherein the semiconductor wafer has a first surface side that contains a first surface and a second surface side opposed to the first surface side, and the first to fifth steps are performed only on the first surface side of the semiconductor wafer, wherein the cluster ion comprises $H_3^+$ ions, wherein the $H_3^+$ ions are contained at least 80% in a total amount of all kinds of ions generated from a source gas containing hydrogen, and wherein the $H_3^+$ ions are generated by thermoelectrons discharged from a filamentary electrode.

13. The method for manufacturing a semiconductor device according to claim 12, wherein the sixth step of treating the separation wafer is performed only on the separation plane.

14. The method for manufacturing a semiconductor device according to claim 12, wherein the second step is performed using an ion doping apparatus.

15. The method for manufacturing a semiconductor device according to claim 12, wherein the cluster ion comprises an ion selected from a $^2H_2^+$ ion and a $^2H_3^+$ ion.

16. The method for manufacturing a semiconductor device according to claim 12, wherein the sixth step includes a planarization treatment performed on the separation plane of the separation wafer, and wherein the planarization treatment is selected from polishing treatment, etching treatment, thermal treatment, and laser beam irradiation.

* * * * *